United States Patent [19]
Fujii

[11] Patent Number: 5,828,594
[45] Date of Patent: Oct. 27, 1998

[54] SEMICONDUCTOR MEMORY WITH HIERARCHICAL BIT LINES

[75] Inventor: Yasuhiro Fujii, Kawasaki, Japan

[73] Assignee: Fujitsu Limited, Kawasaki, Japan

[21] Appl. No.: 893,072

[22] Filed: Jul. 15, 1997

Related U.S. Application Data

[60] Division of Ser. No. 668,332, Jun. 25, 1996, Pat. No. 5,701,269, which is a continuation-in-part of Ser. No. 491,762, Jun. 19, 1995, Pat. No. 5,561,626.

[30] Foreign Application Priority Data

Nov. 28, 1994 [JP] Japan .................................. 6-293050
Feb. 15, 1996 [JP] Japan .................................. 8-028030
Mar. 4, 1996 [JP] Japan .................................. 8-045712

[51] Int. Cl.$^6$ .................................................. G11C 5/06
[52] U.S. Cl. .............................................. 365/63; 365/190
[58] Field of Search ........................... 365/63, 149, 190, 365/230.03, 185.13

[56] References Cited

U.S. PATENT DOCUMENTS

| | | | |
|---|---|---|---|
| 4,644,501 | 2/1987 | Nagasawa | 365/203 |
| 4,807,191 | 2/1989 | Flannagan | 365/230.03 |
| 4,947,377 | 8/1990 | Hannai | 365/149 |
| 5,132,931 | 7/1992 | Koker | 365/210 |
| 5,367,488 | 11/1994 | An | 365/203 |
| 5,386,394 | 1/1995 | Kawahara et al. | 365/230.03 |
| 5,424,977 | 6/1995 | Rountree | 365/149 |
| 5,570,319 | 10/1996 | Santoro et al. | 365/190 |
| 5,682,343 | 10/1997 | Tomishima | 365/63 |

*Primary Examiner*—Tan T. Nguyen
*Attorney, Agent, or Firm*—Armstrong, Westerman, Hattori, McLeland, and Naughton

[57] ABSTRACT

A semiconductor memory with hierarchical bit lines has a plurality of local bit lines, a plurality of global bit lines, a plurality of word lines, a plurality of memory cells each arranged at a connection portion between each local bit line and each word line, and a plurality of transfer gates. The local bit lines are connected to the global bit line through the transfer gates, which are arranged around the centers of the local bit lines. Further, the semiconductor memory has a dummy bit line portion having a dummy bit line that is charged up to a precharging reference voltage during a standby period and is set to a floating state during an active period, to provide the sensing reference voltage. In addition, the semiconductor has sense amplifiers each being formed in an area matching with the interval of a given number of the global bit lines and each receiving signals from a pair of the global bit lines arranged on both sides thereof.

18 Claims, 36 Drawing Sheets

Fig.29
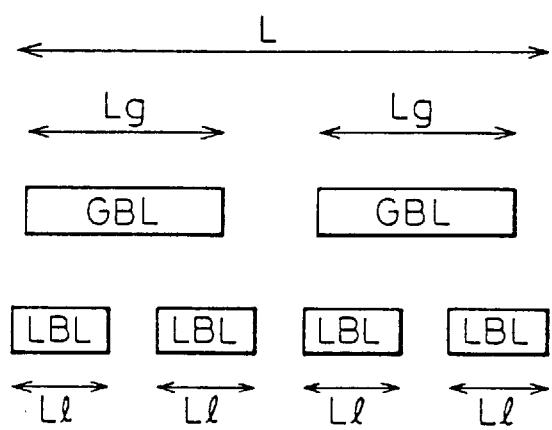
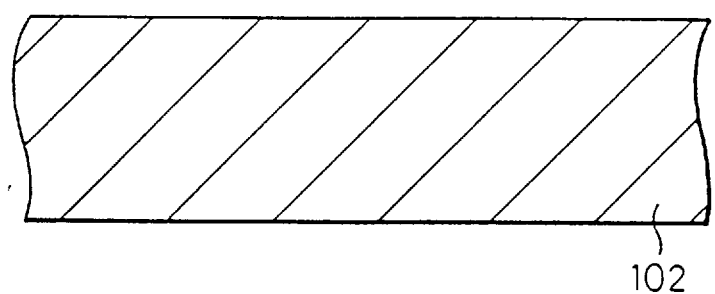

SEMICONDUCTOR MEMORY WITH HIERARCHICAL BIT LINES

CROSS REFERENCE TO RELATED APPLICATION

This is a divisional of application Ser. No. 08/668,332 filed Jun. 25, 1996; now U.S. Pat. No. 5,301,269 which is a continuation-in-part of application Ser. No. 08/491,762 filed Jun. 19, 1995, now U.S. Pat. No. 5,561,626.

BACKGROUND OF THE INVENTION

1. Field of the Invention

The present invention relates to a semiconductor memory, and more particularly, to a semiconductor memory with hierarchical bit lines.

2. Description of the Related Art

Recent semiconductor technology has developed highly-integrated, large-capacity semiconductor memories. These memories must operate at a high speed and with low power consumption.

The capacity of semiconductor memories such as DRAMs is increasing. There are even 64- or 256-megabit DRAMs. To handle such an enormous quantity of data and match with high-speed peripheral devices, these memories must operate at a high speed and with low power consumption. The low power consumption feature is particularly important when the memories are adopted for note-book-type personal computers and for portable equipment driven by batteries.

To satisfy these requirements, semiconductor memories with hierarchical bit lines have been studied and proposed. In the related art, the hierarchical bit lines are built using multilayer metal wiring and include global bit lines and polysilicon or polycide local bit lines. The global bit lines are connected to the local bit lines through transfer gates. Among the transfer gates, only those for a memory cell array involving an accessed word line are turned ON, to reduce the capacitance and time constant of the bit lines.

In the related art, the local bit lines are connected to the global bit lines through the transfer gates which are arranged at one end of each local bit line. Note that the global bit lines are complementary signal lines.

When the level of a row address strobe signal is changed from high to low, a bit line reset signal is changed from a high-potential source voltage to a low-potential source voltage. If the local bit line select signal is set to select the corresponding local bit lines, these local bit lines are connected to the global bit lines. Thereafter, one of the word lines is selected, and the contents of a memory cell connected to the selected word line are transferred to the global bit lines through the local bit lines.

Since the transfer gates are arranged at one end of each the local bit line, the resistance and signal transmission time constant of each of the bit lines are large and lengthen the read time. To shorten the read time in which a sufficient voltage difference is produced in the bit lines, the length of the local bit lines must be shortened and the number of the local bit lines must be increased. In addition, the number of the transfer gates, and of the signal lines for controlling the transfer gates, must be increased.

The semiconductor memory of the related art employs complementary global bit lines made of metal such as aluminum. The interval between the two global bit lines cannot be reduced due to a manufacturing limit, to thereby limit the degree of integration. The problems of the related art will be explained hereinafter, in detail, with reference to the accompanying drawings.

SUMMARY OF THE INVENTION

An object of the present invention is to provide a semiconductor memory capable of operating at a high speed, and with low power consumption, without increasing the number of local bit lines. Another object of the present invention is to halve the number of metal global lines of a semiconductor memory, to improve the degree of integration of the memory.

According to a first aspect of the present invention, there is provided a semiconductor memory having hierarchical bit lines including a plurality of local bit lines and a plurality of global bit lines, comprising a plurality of word lines; a plurality of memory cells each arranged at a connection portion between each of the local bit lines and each of the word lines; and a plurality of transfer gates each arranged around a center of the local bit lines, to connect the local bit lines to the global bit line.

Further, according to a first aspect of the present invention, there is provided a semiconductor memory having hierarchical bit lines including a plurality of local bit lines and a plurality of global bit lines, comprising a plurality of word lines; and a plurality of memory cells each arranged at a connection portion between each of the local bit lines and each of the word lines, wherein a difference between a potential of the global bit line and a reference voltage is amplified.

A plurality of pairs of the local bit lines may be provided for each of the global bit lines. The semiconductor memory may further comprise a plurality of sense amplifier units each amplifying a potential of the global bit line. Each of the sense amplifier unit may comprise a current mirror amplifier for amplifying a difference between a potential of the global bit line and a reference voltage, and an inverter for inverting an output signal from the current mirror amplifier and supplying an inverted signal to the global bit line.

The sense amplifier unit may include a first sense amplifier and a second sense amplifier next to the first sense amplifier, and the semiconductor memory may further comprise a wiring arranged between the global bit line connected to the first sense amplifier and a global bit line connected to the second sense amplifier, the wiring receiving cell counter potential to reduce mutual interference between the adjacent global bit lines. The global bit lines may extend substantially orthogonally to the word lines, the local bit lines may extend in parallel with the global bit lines, and a plurality of the local bit lines may be subordinated to each of the global bit lines.

According to a second aspect of the present invention, there is also provided a semiconductor memory having hierarchical bit lines including a plurality of local bit lines and a plurality of global bit lines, comprising a plurality of word lines; a plurality of memory cells each arranged at a connection portion between each of the local bit lines and each of the word lines; a read amplifier for amplifying the difference between the voltage of a corresponding one of the global bit lines and a sensing reference voltage; and a dummy bit line portion having a dummy bit line that is charged up to a recharging reference voltage during a standby period and is set to a floating state during an active period, to provide the sensing reference voltage.

The semiconductor memory may further comprise a rewrite amplifier for inverting an output signal from the read amplifier and supplying the inverted signal to the global bit line. The read amplifier may be a current mirror amplifier and the rewrite amplifier may be a tristate inverter.

The read amplifier may be a current mirror amplifier, and the rewrite amplifier may have a latch circuit. The output of the latch circuit may be connected to the global bit line through a transfer gate that is controlled according to an activation signal.

The dummy bit line portion may be arranged on each side of each memory block. The dummy bit line portion may be arranged on one side of each subarray of each memory block. The dummy bit line portion may be arranged on each side of each subarray of each memory block. The semiconductor memory may further comprise a sense amplifier for amplifying the voltage of the global bit line. The dummy bit line portion may have no rewrite amplifier. The dummy bit line portion may have no wiring for a rewrite amplifier.

A transfer gate serving as a node between one of the local bit lines and a corresponding one of the global bit lines may be arranged at around the center of the local bit line. One of the local bit lines may be connected to a corresponding one of the global bit lines in a real bit line portion, and the difference between the voltage of the global bit line and the sensing reference voltage supplied through the dummy bit line portion may be amplified. The global bit lines may extend substantially orthogonally to the word lines, the local bit lines may extend in parallel with the global bit lines, and a plurality of the local bit lines may be subordinated to each of the global bit lines.

According to a third aspect of the present invention, there is provided a semiconductor memory having hierarchical bit lines including a plurality of local bit lines and a plurality of global bit lines, comprising a plurality of word lines; a plurality of memory cells each arranged at a connection portion between each of the local bit lines and each of the word lines; and sense amplifiers each being formed in an area matching the interval of a given number of the global bit lines and each receiving signals from a pair of the global bit lines arranged on both sides thereof.

The areas where the sense amplifiers are formed may be overlapped side by side and each of the sense amplifiers may receive signals from a corresponding pair of the global bit lines arranged on both sides thereof. Each of the sense amplifiers may comprise a read amplifier for receiving signals from the global bit lines and amplifying the difference between the signals; and a write amplifier for receiving the output of the read amplifier and providing output signals to drive the global bit lines. Each of the sense amplifiers may comprise a read amplifier for receiving a signal from the global bit line and amplifying the difference between the signals; a write amplifier for receiving the output of the read amplifier and providing output signals to drive the global bit lines; and a transfer gate arranged between the output of the read amplifier and the input of the write amplifier, for isolating the read and write amplifiers from each other, the write amplifier having an input terminal connected to a data bus line through a column gate.

The read amplifier may be first activated when reading data out of one of the memory cells, and then the write amplifier may be activated. The transfer gate may be closed when writing data to one of the memory cells, to isolate the read amplifier from the write amplifier. On a semiconductor substrate, the global bit lines may be formed on a wiring layer that is above a layer where the local bit lines are formed. The global bit lines may extend substantially orthogonally to the word lines, the local bit lines may extend in parallel with the global bit lines, and a plurality of the local bit lines may be subordinated to each of the global bit lines.

Further, according to a third aspect of the present invention, there is provided a semiconductor memory having hierarchical bit lines including a plurality of local bit lines and a plurality of global bit lines, comprising a plurality of word lines; a plurality of memory cells each arranged at a connection portion between each of the local bit lines and each of the word lines; and sense amplifiers each being formed in an area matching with the interval of adjacent two of the global bit lines and each receiving signals from a pair of the global bit lines arranged on both sides thereof, the areas where the sense amplifiers are formed are arranged in two rows, and overlap, side by side.

In addition, according to a third aspect of the present invention, there is provided a semiconductor memory having hierarchical bit lines including a plurality of local bit lines and a plurality of global bit lines, comprising a plurality of word lines; a plurality of memory cells each arranged at a connection portion between each of the local bit lines and each of the word lines; and sense amplifiers each being formed in an area matching with the interval of four of the adjacent global bit lines and each receiving signals from a pair of the global bit lines arranged on both sides thereof, the areas where the sense amplifiers are formed are arranged in four rows, and overlap, side by side.

Further, according to a third aspect of the present invention, there is also provided a semiconductor memory having hierarchical bit lines including a plurality of local bit lines and a plurality of global bit lines, comprising a plurality of word lines; a plurality of memory cells each arranged at a connection portion between each of the local bit lines and each of the word lines; and sense amplifiers each being formed in an area matching with the interval of a given number of the global bit lines and each receiving, through bit line selection gates, signals from a pair of the global bit lines arranged on both sides thereof, the areas where the sense amplifiers are formed are arranged in a plurality of rows, and overlap, side by side, the number of the rows of the sense amplifier areas being smaller than the given number of the global bit lines.

BRIEF DESCRIPTION OF THE DRAWINGS

The present invention will be more clearly understood from the description of the preferred embodiments as set forth below with reference to the accompanying drawings, wherein:

FIG. 29 is a sectional view schematically showing the hierarchical bit lines;

DESCRIPTION OF THE PREFERRED EMBODIMENTS

For a better understanding of the preferred embodiments of the present invention, the problems of the related art will be explained.

Figure 1:
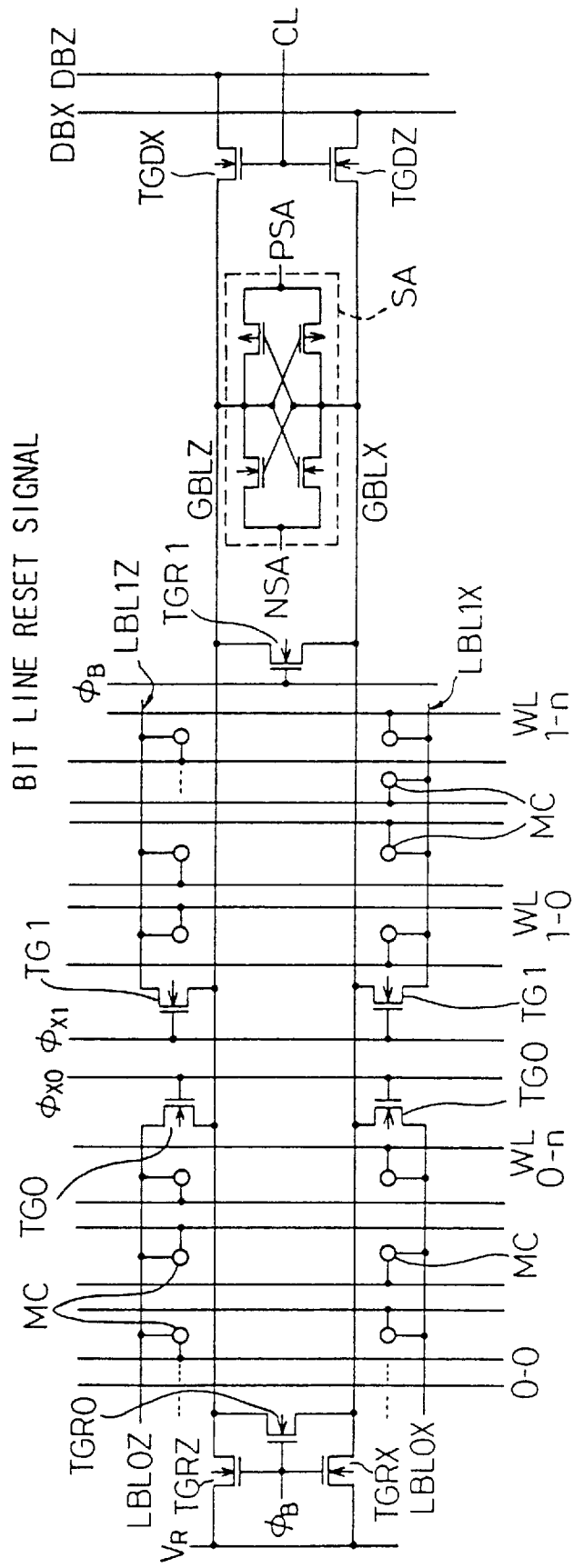
FIG. 1 is a circuit diagram showing a semiconductor memory according to a related art.

FIG. 1 is a circuit diagram showing a semiconductor memory according to the related art. This memory includes global bit lines GBLX and GBLZ, local bit lines LBL0X, LBL0Z, LBL1X, and LBL1Z, word lines WL, data lines DBX and DBZ, transfer gates TG0 and TG1, a sense amplifier SA, memory cells MC, select signals $\phi$X0 and $\phi$X1 for local bit lines, a column select signal CL, reset transfer gates TGRX, TGRZ, TGR0, and TGR1, and a reference voltage VR. The memory cells MC are arranged at the intersections of the word lines WL and local bit lines LBL0X, LBL0Z, LBL1X, and LBL1Z. The local bit lines LBL0X and LBL0Z form a pair and correspond to n+1 word lines WL(0-0) to WL(0-n). The local bit lines LBL1X and LBL1Z form a pair and correspond to n+1 word lines WL(1-0) to WL(1-n).

The local bit lines LBL0X, LBL0Z, LBL1X, and LBL1Z are connected to the global bit lines GBLX and GBLZ through the transfer gates TG0 and TG1, which are arranged at one end of each local bit line. The global bit lines GBLX and GBLZ are complementary signal lines.

Figure 2:
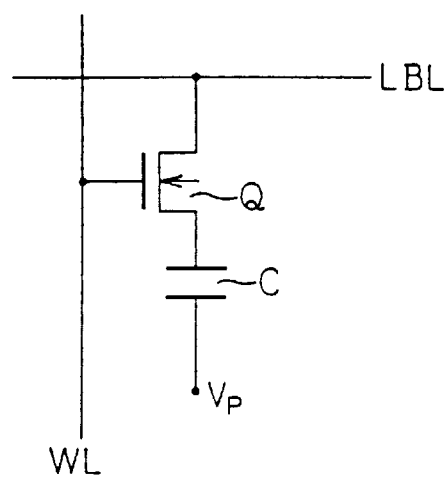
FIG. 2 is a diagram showing a memory cell of a semiconductor memory.

FIG. 2 shows a memory cell MC in a semiconductor memory. The memory cell MC consists of a gate transistor Q and a capacitor C. The drain of the transistor Q is connected to a local bit line LBL, which may be one of the local bit lines LBL0X, LBL0Z, LBL1X, and LBL1Z of FIG. 1. The gate of the transistor Q is connected to a word line WL, and the source thereof is connected to a power source Vp through the capacitor C.

As explained above, the local bit lines LBL0X, LBL0Z, LBL1X, and LBL1Z of FIG. 1 are connected to the global bit lines GBLX and GBLZ through the transfer gates TG0 and TG1, which are arranged at one end of each local bit line. The global bit lines are two complementary signal lines.

Figure 3:
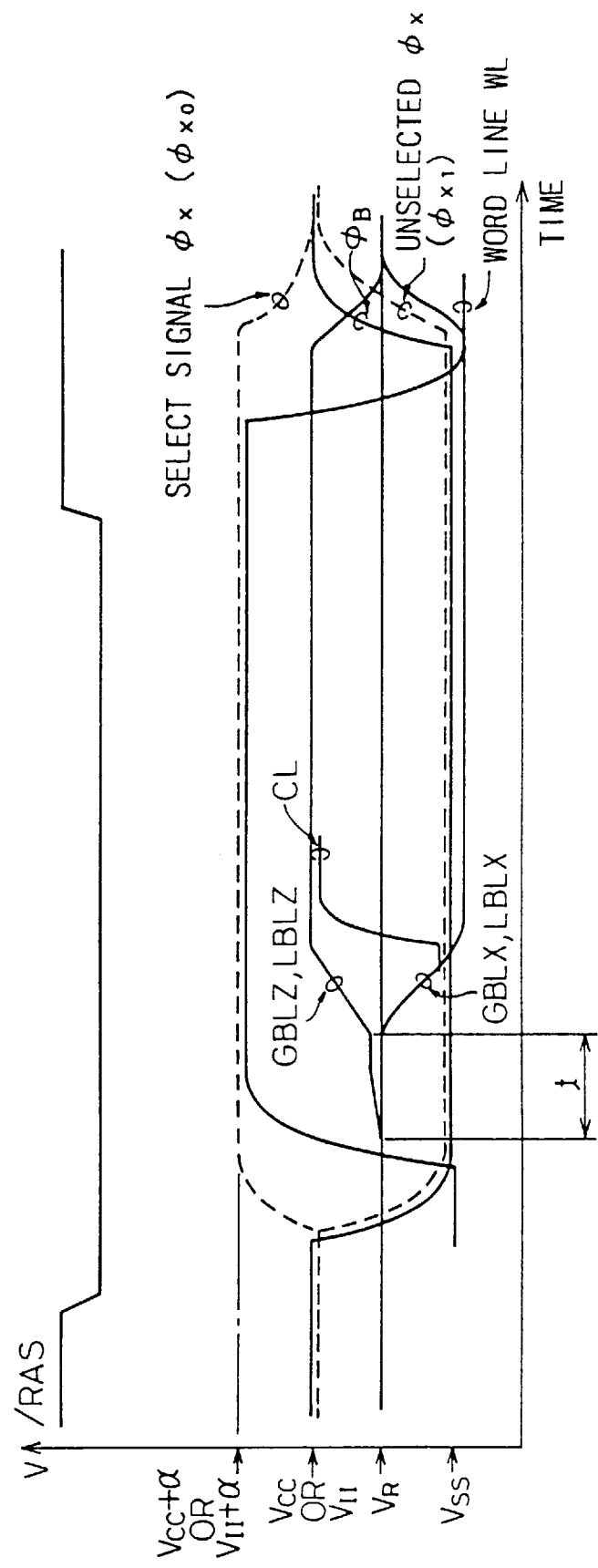
FIG. 3 is a diagram showing signal waveforms explaining the operation of the semiconductor memory of FIG. 1.

FIG. 3 shows signal waveforms explaining the operation of the semiconductor memory of FIG. 1.

When the level of a row address strobe signal /RAS is changed from high to low, a bit line reset signal $\phi$B is changed from a high-potential source voltage Vcc or Vii to a low-potential source voltage Vss. If the local bit line select signal, for example, $\phi$X0 is set to select the corresponding local bit lines LBL0X and LBL0Z, these local bit lines are connected to the global bit lines GBLX and GBLZ. Namely, the select signal $\phi$X0 is set to Vcc+$\alpha$ (or Vii+$\alpha$), to select the local bit lines LBL0X and LBL0Z. At the same time, the select signal $\phi$X1 is set to low level to not select the local bit lines LBL1X and LBL1Z.

Thereafter, one of the word lines WL is selected, and the contents of a memory cell connected to the selected word line are transferred to the global bit lines GBLX and GBLZ through the local bit lines LBL0X and LBL0Z. Since the transfer gates TG0 are arranged at one end of each local bit line LBL0X and LBL0Z, the resistance and signal transmission time constant of each of the bit lines LBL0X and LBL0Z are large and lengthen the read time t. To shorten the read time t, in which a sufficient voltage difference is produced in the bit lines LBL0X and LBL0Z or in the bit lines GBLX and GBLZ, the length of the local bit lines must be reduced and the number of the local bit lines must be increased. In addition, the number of the transfer gates, and of the signal lines for signals φX for controlling the transfer gates, must be increased.

The semiconductor memory of the related art employs complementary global bit lines GBLX and GBLZ made of a metal such as aluminum. The interval between the two global bit lines is not reducible due to a manufacturing limit, to thereby limit the degree of integration.

After the completion of the data read operation in FIG. 3, the level of the signal /RAS is changed from low to high. At the same time, the selected word line is changed to low level, and the bit line reset signal φB is changed from low level to high level to set the global bit lines GBLX and GBLZ to the reference voltage VR. The local bit line select signal φX0 is changed from Vcc+α (or Vii+α) to Vcc (or Vii), to initialize the connection between the local bit lines LBL0X and LBL0Z and the global bit lines GBLX and GBLZ.

Next, the present invention will be explained.

Figure 4:
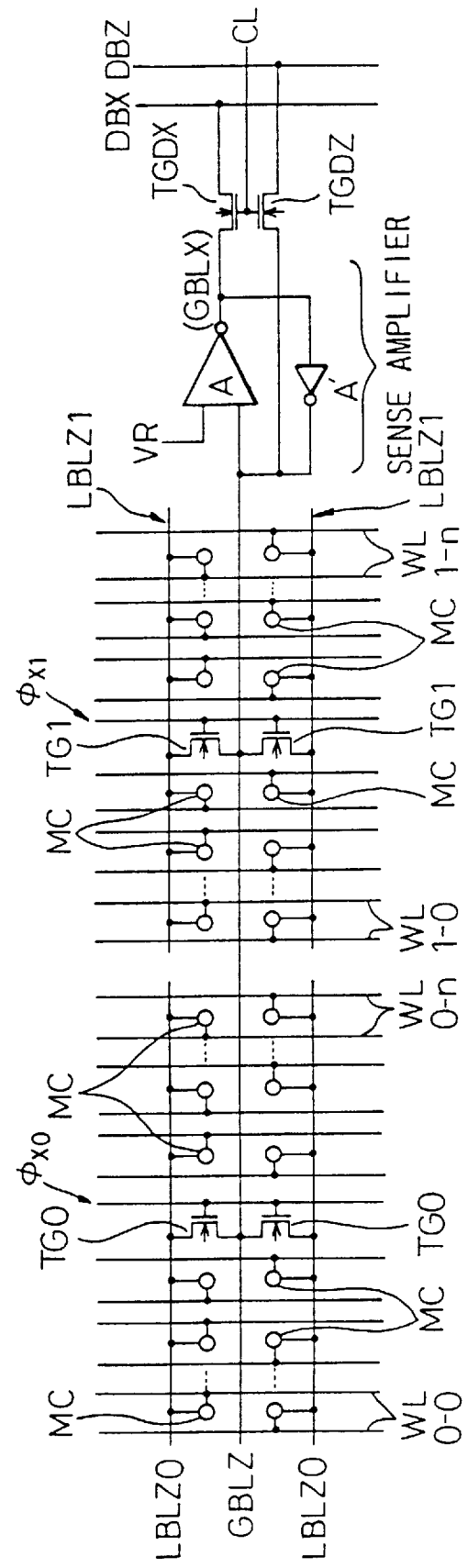
FIG. 4 is a circuit diagram showing the principle of a semiconductor memory according to a first aspect of the present invention.

FIG. 4 is a circuit diagram showing the principle of a semiconductor memory according to the present invention.

According to a first aspect of the present invention, the semiconductor memory employs hierarchical bit lines including local bit lines LBLZ0 and LBLZ1 and global bit lines GBLZ and GBLX. The first aspect connects the local bit lines LBLZ0 and LBLZ1 to the global bit line GBLZ through transfer gates TG0 and TG1, which are arranged at or near the centers of the local bit lines LBLZ0 and LBLZ1.

According to a second aspect of the present invention, the semiconductor memory employs hierarchical bit lines including local bit lines LBLZ0 and LBLZ1 and global bit lines GBLZ and GBLX. The second aspect connects the local bit lines LBLZ0 and LBLZ1 to the single global bit line GBLZ and amplifies a potential difference between the global bit line GBLZ and a reference voltage VR.

The first aspect of the present invention arranges the transfer gates TG0 and TG1 at or near the centers of the local bit lines LBLZ0 and LBLZ1. The second aspect of the present invention connects the local bit lines LBLZ0 and LBLZ1 to the single global bit line GBLZ and amplifies the potential difference between the global bit line GBLZ and the reference voltage VR.

The semiconductor memory of FIG. 4 includes the global bit line GBLZ, local bit lines LBLZ0 and LBLZ1, word lines WL, data lines DBX and DBZ, transfer gates TG0 and TG1, memory cells MC, local bit line select signals φX0 and φX1, a column select signal CL, and the reference voltage VR. The memory cells MC are arranged at the intersections of the word lines WL and local bit lines LBLZ0 and LBLZ1. There are a pair of the local bit lines LBLZ0 and a pair of the local bit lines LBLZ1. The local bit lines LBLZ0 correspond to n+1 word lines WL(0-0) to WL(0-n), and the local bit lines LBLZ1 correspond to n+1 word lines WL(1-0) to WL(1-n). The structure of each of the memory cells MC is the same as that of FIG. 2.

The local bit lines LBLZ0 and LBLZ1 are connected to the global bit line GBLZ through the transfer gates TG0 and TG1, which are arranged at or near the centers of the local bit lines LBLZ0 and LBLZ1. A distance between any one of the transfer gates TG0 and TG1 and a memory cell at an end of a corresponding one of the local bit lines LBLZ0 and LBLZ1 is half the corresponding distance in the related art. Namely, the distance between a transfer gate and an end memory cell is nearly half the length of the local bit line according to the present invention, to reduce the resistance due to the bit line.

As is apparent from a comparison between FIGS. 1 and 4, the present invention connects each pair of the local bit lines LBLZ0 and LBLZ1 to the single global bit line GBLZ. On the other hand, the related art of FIG. 1 connects two pairs of the local bit lines to the complementary global bit lines GBLX and GBLZ. The present invention amplifies a potential difference between the global bit line GBLX and the reference voltage VR. Consequently, the present invention halves the number of the global bit lines, decreases the charge and discharge currents in the bit lines, and shortens the amplification time of a sense amplifier.

Figure 5:
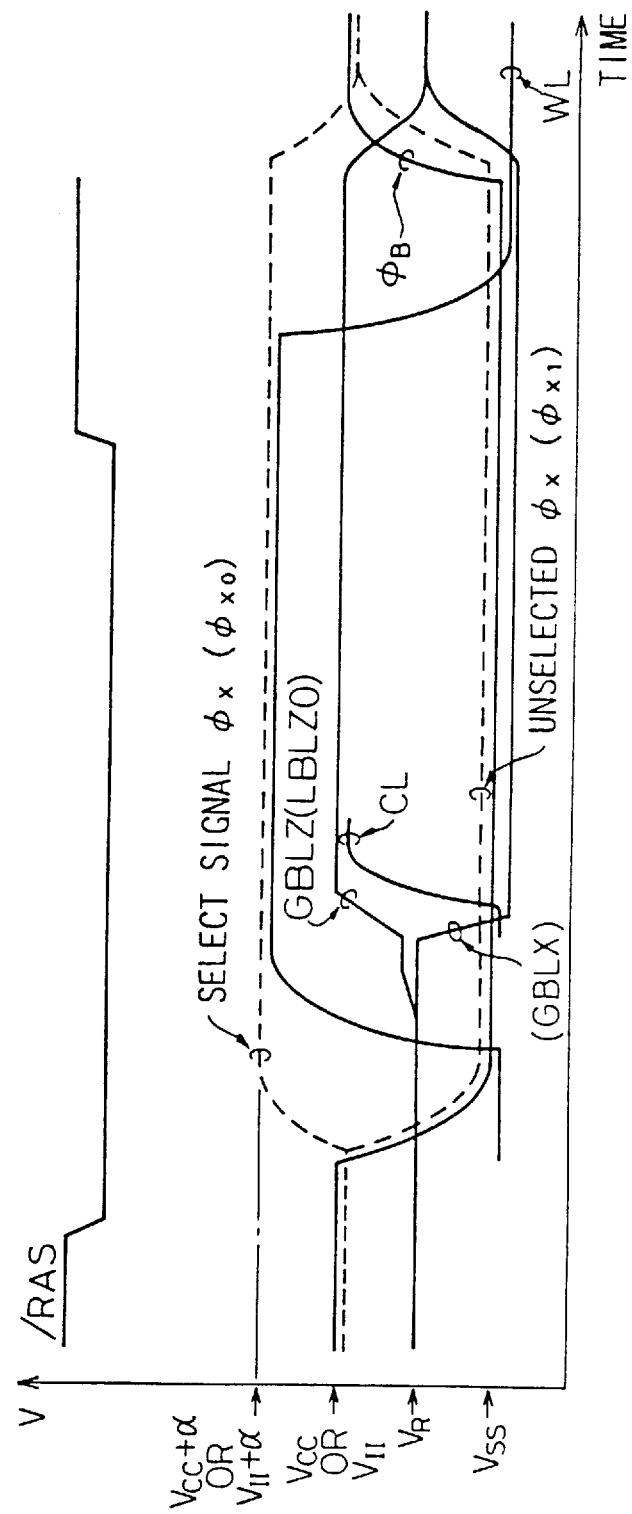
FIG. 5 is a diagram showing signal waveforms explaining the operation of the semiconductor memory of FIG. 4.

FIG. 5 shows signal waveforms explaining the operation of the semiconductor memory of the present invention of FIG. 4.

When a row address strobe signal /RAS changes from high level to low level, a bit line reset signal φB (not shown in FIG. 4) changes from a high-potential source voltage Vcc (or Vii) to a low-potential source voltage Vss. A local bit line select signal φX (φX0, φX1) is changed to select the corresponding local bit lines LBLZ0 or LBLZ1 and connect them to the global bit line GBLZ.

Then, one of the word lines WL is selected. The contents of a memory cell connected to the selected word line are transferred to the global bit line GBLZ through the selected local bit lines. Since the transfer gates TG0 (TG1) are arranged near the centers of the local bit lines LBLZ0 (LBLZ1), a change in potential due to the selected memory cell is quickly transferred to the bit lines. Even the distance of the furthest memory cell from the transfer gate TG0 is half the length of the local bit line LBLZ0. This results in reducing resistance due to the local bit lines LBLZ0 and quickly transferring a change in the potential of the local bit lines LBLZ0 due to the selected memory cell to the global bit line GBLZ. Consequently, the transition time T of FIG. 5 is about half the transition time t of FIG. 3.

A current mirror amplifier (a differential amplifier) A amplifies the difference between the potential of the global bit line GBLZ and the reference voltage VR. An output (GBLX) from the current mirror amplifier A is passed through an inverter (an amplifier) A' and is fed back to an input terminal of the current mirror amplifier A to which the global bit line GBLZ is connected. The potential of the global bit line GBLZ becomes equal to the high-potential source voltage Vcc or Vii, the potential of the output line corresponding to a global bit line GBLX changes to the low-potential source voltage Vss, and the potential of the column select signal CL changes from Vss to Vcc or Vii. Then, transfer gates TGDX and TGDZ are turned ON to transfer the potential of the signal lines GBLX and GBLZ corresponding to complementary global bit lines to the data lines DBX and DBZ.

After the completion of the data read operation, the signal /RAS is changed from low level to high level, and the selected word line to low level. At the same time, the bit line reset signal φB is set to high level from low level, to return the signal line GBLX and global bit line GBLZ to the reference voltage VR. The local bit line select signal φX (φX0, φX1) is changed from Vcc+α (or Vii+α) to Vcc (or Vii), to initialize the connection between the local bit lines LBLZ0 and LBLZ1 and the global bit line GBLZ.

Semiconductor memories according to the embodiments of the present invention will now be explained.

Figure 6:
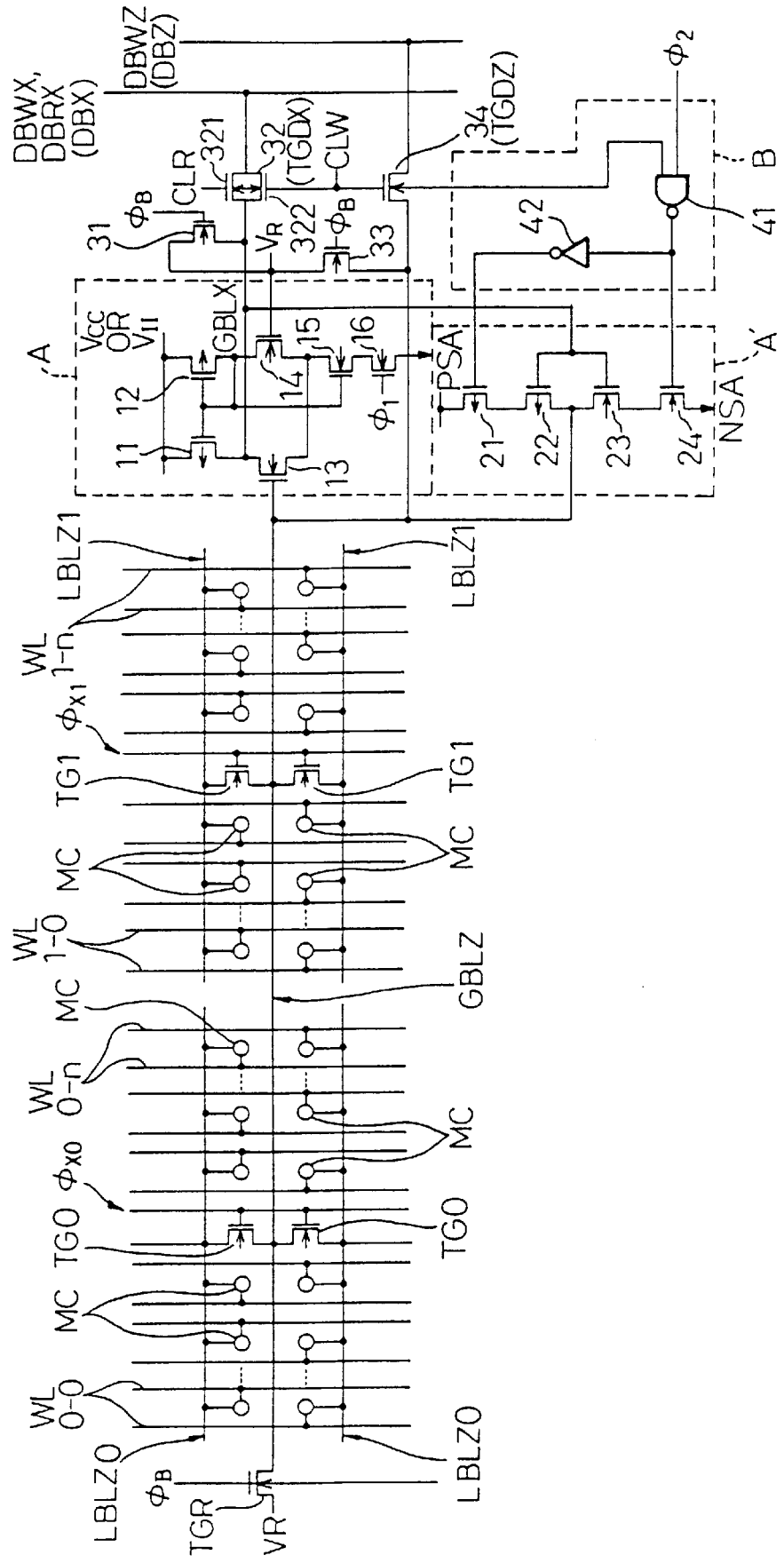
FIG. 6 is a circuit diagram showing a semiconductor memory according to an embodiment of the first aspect of the present invention.

FIG. 6 is a circuit diagram showing a semiconductor memory according to one of the embodiments of the present invention. The semiconductor memory includes a global bit line GBLZ, local bit lines LBLZ0 and LBLZ1, word lines WL, data lines DBX and DBZ, transfer gates TG0 and TG1, memory cells MC, local bit line select signals φX0 and φX1, a column select signal CL, and a reference voltage VR. The semiconductor memory also includes a current mirror amplifier (a differential amplifier) A, an inverter (an amplifier) A', a bit line reset signal φB, a signal φ1 for activating the current mirror amplifier A, a signal φ2 for activating a rewrite inverter, a read column select signal CLR, and a write column select signal CLW.

The memory cells MC are arranged at the intersections of the word lines WL and local bit lines LBLZ0 and LBLZ1. There are a pair of the local bit lines LBLZ0 and a pair of the local bit lines LBLZ1. The local bit lines LBLZ0 correspond to n+1 word lines WL(0-0) to WL(0-n), and the local bit lines LBLZ1 correspond to n+1 word lines WL(1-0) to WL(1-n).

The local bit lines LBLZ0 and LBLZ1 are connected to the global bit line GBLZ through the transfer gates TG0 and TG1, which are arranged at or near the centers of the local bit lines LBLZ0 and LBLZ1. Namely, the two local bit lines LBLZ0 are connected to the single global bit line GBLZ through the two transfer gates (n-channel MOS transistors) TG0, which are arranged near the centers of the local bit lines LBLZ0, respectively. Similarly, the two local bit lines LBLZ1 are connected to the single global bit line GBLZ through the two transfer gates (n-channel MOS transistors) TG1, which are arranged at the centers of the local bit lines LBLZ1, respectively. Accordingly, the distance between any one of the transfer gates TG0 and TG1 and a memory cell at an end of a corresponding one of the local bit lines LBLZ0 and LBLZ1 is half the corresponding distance of the related art of FIG. 1. Namely, the distance between a transfer gate and an end memory cell according to the embodiment is approximately half the length of the local bit line. This arrangement reduces resistance due to the bit line. The transfer gates TG0 and TG1 are switched in response to the select signals φX0 and φX1, respectively.

As is apparent from a comparison between FIGS. 1 and 6, this embodiment connects each pair of the local bit lines LBLZ0 and LBLZ1 to the single global bit line GBLZ. On the other hand, the related art of FIG. 1 connects each pair of the local bit lines to the two complementary global bit lines GBLX and GBLZ. Namely, the embodiment is capable of eliminating the global bit line GBLX. The current mirror amplifier A of the embodiment amplifies a potential difference between the global bit line GBLZ and the reference voltage VR. In this way, the embodiment halves the number of global bit lines, decreases the charge and discharge currents in the bit lines, and shortens the amplification time of a sense amplifier. A reset transistor TGR is connected to one end of the global bit line GBLZ, and a transistor 33 is connected to the other end of the global bit line GBLZ. These transistors TGR and 33 receive the bit line reset signal φB. When the bit line reset signal φB is set to high level, the global bit line GBLZ is set to the reference voltage VR. An output signal line GBLX of the current mirror amplifier A is reset to the reference voltage VR by a reset transistor 31 whose gate receives the bit line reset signal φB.

The current mirror amplifier A has p-channel MOS transistors 11 and 12 and n-channel MOS transistors 13, 14, 15, and 16. The global bit line GBLZ is connected to the gate of the transistor 13. The reference voltage VR is applied to the gate of the transistor 14. The tristate inverter (amplifier) A' has p-channel MOS transistors 21 and 22 and n-channel MOS transistors 23 and 24. Further, sources of the transistors 21 and 24 are supplied with a p-channel drive signal PSA and an n-channel drive signal NSA, respectively. The global bit line GBLZ is connected to a node between the transistors 22 and 23. The output signal line GBLX of the current mirror amplifier A is connected to the gates of the transistors 22 and 23. The gate of the transistor 24 receives the output of a NAND gate 41. The gate of the transistor 21 receives the output of the NAND gate 41 through an inverter 42. The NAND gate 41 and inverter 42 form a control circuit B, which may be provided for each column decoder and shared by a plurality of sense amplifiers. The NAND gate 41 receives the signal φ2 for activating the rewrite inverter, as well as the write column select signal CLW. The signals φ2 and CLW control the inverter A'.

The current mirror amplifier A amplifies a potential difference between the global bit line GBLZ and the reference voltage VR. The output signal line GBLX of the current mirror amplifier A and the global bit line GBLZ are connected to an input terminal of the current mirror amplifier A, to form signal lines corresponding to the complementary global bit lines GBLX and GBLZ. The potential of the signal line GBLX is passed to the data line DBX (DBWX, DBRX) through the transfer gate 32 (TGDX). The potential of the signal line GBLZ is passed to the data line DBZ (DBWZ) through the transfer gate 34 (TGDZ). The transfer gate 32 consists of a transistor 321 whose gate receives the read column select signal CLR and a transistor 322 whose gate receives the write column select signal CLW. The transfer gate 32 is selected when reading and writing data. The transfer gate 34 consists of a transistor whose gate receives the write column select signal CLW and is selected when writing data. The signal lines DBWX and DBWZ transfer write data, and the signal line DBRX transfers read data. The data line DBX serves as the write data line DBWX and the read data line DBRX.

Figure 7:
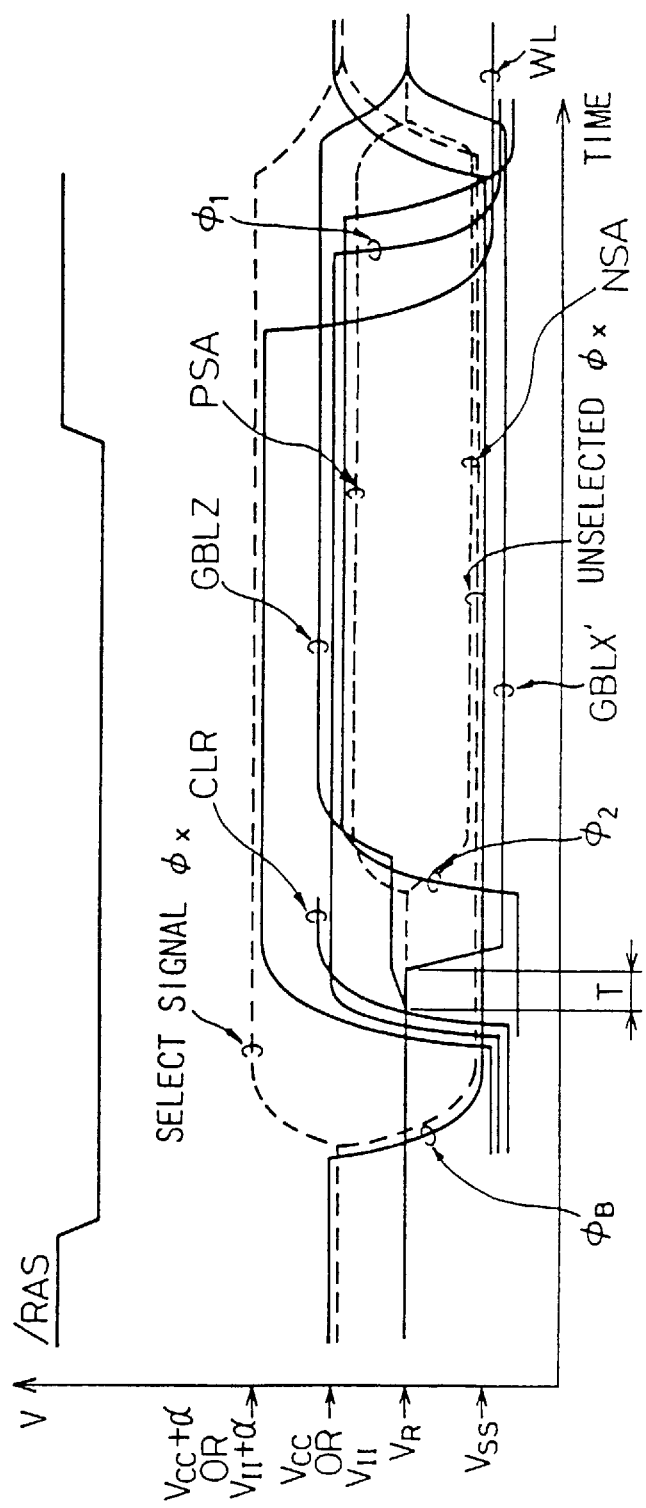
FIG. 7 is a diagram showing signal waveforms explaining a read operation of the semiconductor memory of FIG. 6.

FIG. 7 shows signal waveforms explaining a read operation of the semiconductor memory of FIG. 6.

To start the read operation, a row address strobe signal /RAS is changed from high level to low level, and the bit line reset signal φB is changed from a high-potential source voltage Vcc or Vii to a low-potential source voltage Vss. The global bit line GBLZ and the output signal line GBLX of the current mirror amplifier A are disconnected from the reference voltage VR.

In response to a change in the local bit line select signal φX (φX0, φX1), the corresponding local bit lines LBLZ0 or LBLZ1 are selected and connected to the global bit line GBLZ. More precisely, if the select signal φX0 is changed from Vcc or Vii to Vcc+α or Vii+α to establish a selected state, the two transfer gates TG0 whose gates receive the signal φX0 are turned ON to connect the two local bit lines LBLZ0 to the global bit line GBLZ. The other select signal φX1 is changed from Vcc or Vii to Vss to establish an unselected state, and the two transfer gates TG1 whose gates receive the signal φX1 are turned OFF to disconnect the two local bit lines LBLZ0 from the global bit line GBLZ. As a result, a pair of the local bit lines LBLZ0 is connected to the global bit line GBLZ.

One of the word lines WL is selected according to an address signal, and the signal φ1 is set to high level to activate the current mirror amplifier A. When the read column select signal CLR is changed to high level, the transistor 321 of the transfer gate 32 is turned ON to connect the output line GBLX of the current mirror amplifier A to the data line DBX (DBRX). The contents of a memory cell connected to the selected word line are transferred to the global bit line GBLZ through the local bit lines LBLZ0. This embodiment sets the read column select signal CLR to high level before amplifying the read signal, to connect the output line GBLX of the current mirror amplifier A to the data line DBX (DBRX), to thereby improve the speed of the read operation.

Since each transfer gate (TG0, TG1) of this embodiment is arranged at or around the center of a corresponding local bit line (LBLZ0, LBLZ1), a change in potential due to a selected memory cell is quickly transferred through the bit lines. The distance of even the farthest memory cell from the transfer gate TG0 is half the length of the local bit line LBLZ0, to thereby reduce resistance due to the local bit line LBLZ0 and quickly transfer a change in potential in the local bit line to the global bit line GBLZ. Namely, the transition time T of FIG. 7 is about half the transition time t of FIG. 3.

When the signal $\phi 2$ for activating the rewrite inverter is at high level as shown in FIG. 7, the write column select signal CLW supplied to the NAND gate 41 is at low level. Accordingly, the output of the NAND gate 41 is at high level to activate the tristate inverter A'.

Namely, the current mirror amplifier A amplifies a difference between the reference voltage VR and a change in the potential of the global bit line GBLZ (the change is from low to high in FIG. 7). The output GBLX of the current mirror amplifier A is applied to the gates of the transistors 22 and 23 of the tristate inverter A', which inverts, amplifies, and transfers the output to the global bit line GBLZ. As a result, the potential difference between the global bit line GBLZ and the output GBLX of the current mirror amplifier A is increased. Note that the drive signals PSA and NSA, which are supplied to the sources of the transistors 21 and 24, are charged up or discharged from the reference voltage VR (stand-by level) to the voltages Vcc or Vii and Vss. The output GBLX of the current mirror amplifier A is transferred to the data line DBRX (DBX) through the transistor 321 of the transfer gate 32. Since the transfer gate transistor 34 is OFF, the potential of the global bit line GBLZ is not transferred to the data line DBZ.

After the completion of the data read operation, the signal /RAS is changed from low level to high level, and the selected word line is changed to low level. At the same time, the signal $\phi 1$ is changed from high level to low level to inactivate the current mirror amplifier A. The bit line reset signal $\phi B$ is changed from low level to high level to return the global bit line GBLZ and output GBLX to the reference voltage VR. The local bit line select signal $\phi X$ ($\phi X0$, $\phi X1$) is changed from Vcc+$\alpha$ (or Vii+$\alpha$) of selected state to Vcc (or Vii), or from Vss of the unselected state to Vcc (or Vii), to initialize the connection between the local bit lines LBLZ0 and LBLZ1 and the global bit line GBLZ.

In this way, this embodiment indirectly connects the global bit line GBLZ to the read signal line DBRX (DBX), so that the read column select signal CLR may be quickly activated in a read operation. When a required word line is selected, a potential change is supplied to the global bit line GBLZ with a time constant that is about half that of the related art of FIG. 1, to produce a voltage difference with respect to the reference voltage VR. Since the signal $\phi 1$ for activating the current mirror amplifier A is activated substantially together with the selected word line, the current mirror amplifier A carries out a differential amplification operation at once, to supply the memory cell information to the data line DBRX (DBX) through the transfer gate 32. In this way, the present invention realizes a high-speed access operation. The output GBLX is amplified quickly due to the small capacitance and is completely amplified when the signal $\phi 2$ for activating the rewrite inverter is provided. Accordingly, a rewrite operation with respect to the global bit line GBLZ is also carried out at a high speed. The inverter A' causes substantially no through current, to thereby reduce current consumption. Charge and discharge currents in the bit lines are nearly half those of the related art of FIG. 1. The present invention is capable of relaxing a limit on an interval of global bit lines GBLZ to twice that of the related art of FIG. 1, to reduce the line-to-line capacitance and mutual interference of global bit lines. These effects are achieved not only in the read operation but also in a write operation as explained below.

Figure 8:
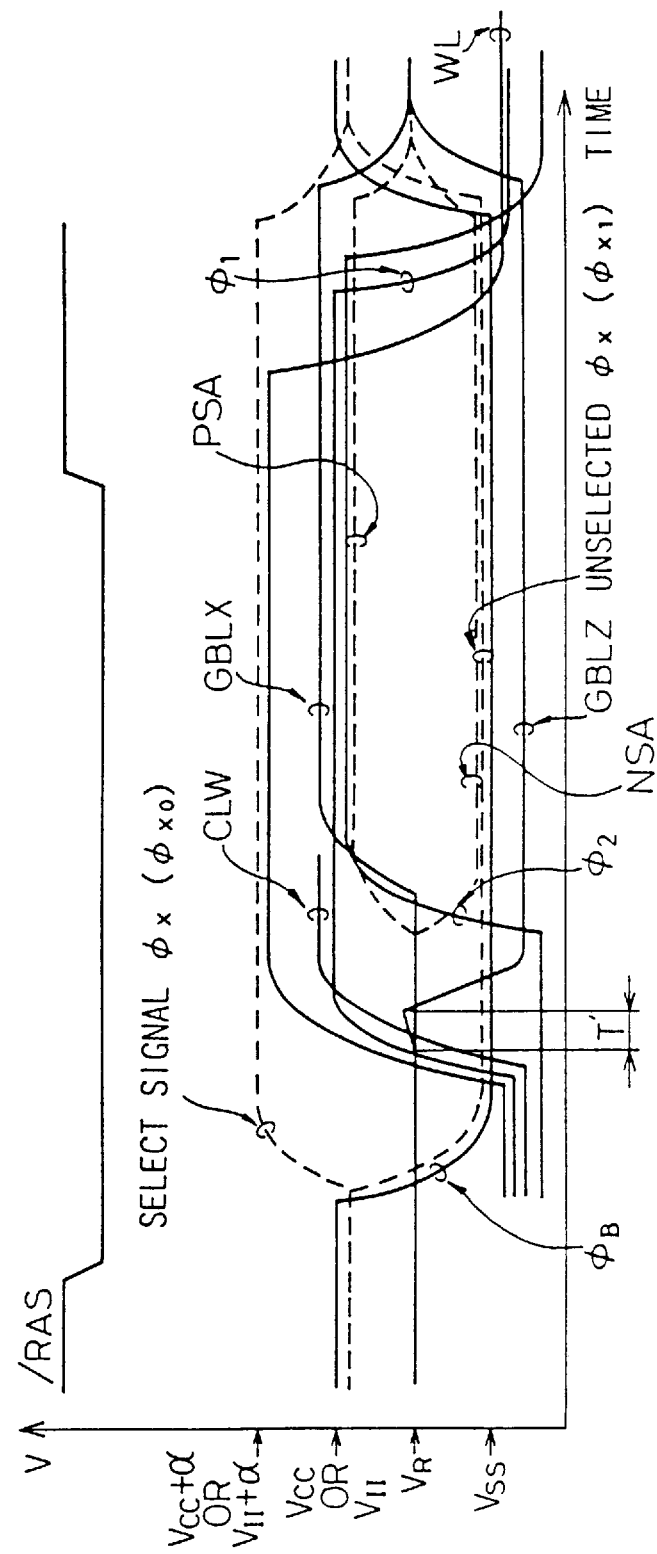
FIG. 8 is a diagram showing signal waveforms explaining a write operation of the semiconductor memory of FIG. 6.

FIG. 8 shows signal waveforms explaining the write operation of the semiconductor memory of FIG. 6.

To start the write operation, the signal /RAS is changed from high level to low level, and the bit line reset signal $\phi B$ is changed from the high-potential source voltage Vcc or Vii to the low-potential source voltage Vss. As a result, the global bit line GBLZ and the output GBLX of the current mirror amplifier A are disconnected from the reference voltage VR.

When the local bit line select signal $\phi X$ ($\phi X0$, $\phi X1$) is changed, the corresponding local bit lines LBLZ0 or LBLZ1 are selected and connected to the global bit line GBLZ. More precisely, if the potential of the select signal $\phi X0$ is changed from Vcc or Vii to Vcc+$\alpha$ or Vii+$\alpha$ into a selected state, the two transfer gates TG0 whose gates receive the signal $\phi X0$ are turned ON to connect the two local bit lines LBLZ0 to the global bit line GBLZ. The other select signal $\phi X1$ is changed from Vcc or Vii to Vss and into an unselected state, and the two transfer gates TG1 whose gates receive the signal $\phi X1$ are turned OFF to disconnect the two local bit lines LBLZ1 from the global bit line GBLZ. In this way, a pair of the local bit lines LBLZ0 is connected to the global bit line GBLZ.

One of the word lines WL is selected in response to an address signal. The signal $\phi 1$ is changed to high level to activate the current mirror amplifier A. When the write column select signal CLW is changed to high level, the transistor 322 of the transfer gate 32 is turned ON, to connect the output GBLX of the current mirror amplifier A to the data line DBX (DBWX), and the transistor 34 is turned ON to connect the global bit line GBLZ to the data line DBZ (DBWZ).

At this time, the signal $\phi 2$ for activating the rewrite inverter is changed to high level, and the output of the NAND gate 41 is changed to low level. As a result, the gate of the transistor 21 receives a high-level signal through the inverter 42, and the gate of the transistor 24 receives a low-level signal, so that the inverter A' stays in an OFF state.

For example, the data lines DBWX (DBX) and DBWZ (DBZ) provide signals to set the potential of the global bit line GBLZ to the low level of Vss and the potential of the line GBLX to high level, to thereby write data into a selected memory cell. This embodiment arranges the transfer gates TG0 (TG1) at or near the centers of the local bit lines LBLZ0 (LBLZ1), to quickly transfer a change in the potential of the bit lines to the selected memory cell. Even if the selected memory cell is farthest from the transfer gate TG0, its distance is half the length of the local bit line LBLZ0. This arrangement reduces resistance due to the bit line to allow quick transfer of a write voltage in the bit line to the selected memory cell in the short time T' in FIG. 8.

After the completion of the data write operation, the signal /RAS is changed from low level to high level, and the level of the word line is changed to low level. At the same time, the signal φ1 is changed from high level to low level to inactivate the current mirror amplifier A. The bit line reset signal φB is changed from low level to high level, to return the global bit line GBLZ and line GBLX to the reference voltage VR. The local bit line select signal φX (φX0, φX1) is changed from the selected state of Vcc+α or Vii+α to Vcc or Vii, or from the unselected state of Vss to Vcc or Vii, to initialize the connection between the local bit lines LBLZ0 and LBLZ1 and the global bit line GBLZ.

As explained above, the resistance of a bit line according to the present invention is nearly half that of the related art of FIG. 1. This results in halving the time of producing a voltage difference in the global bit line GBLZ supplied to the gate of the current mirror amplifier (differential amplifier) A. Since the output GBLX of the current mirror amplifier A is indirectly connected to the global bit line GBLZ, the output GBLX is quickly amplified due to the small capacitance. Since the output GBLX is quickly amplified, the amplification performance of the inverter A' is increased to quickly amplify a signal in the global bit line GBLZ. As a result, the time an indefinite current passes through the inverter A' is reduced. Instead of amplifying the two complementary bit lines of the related art, the present invention amplifies only the single global bit line GBLZ, to thereby reduce current consumption. Since only one global bit line GBLZ is connected to a sense amplifier, the interval between the global bit lines will be twice that of the related art of FIG. 1, to provide a margin in a pattern layout. Generally, the metal global bit lines hinder high integration. The present invention is capable of doubling the interval between global bit lines without reducing the degree of integration. Namely, the present invention is capable of increasing the degree of integration by determining the intervals of global bit lines according to manufacturing processes and metal wiring processes. The margin in a pattern layout may improve the yield of the DRAMs.

Figure 9:
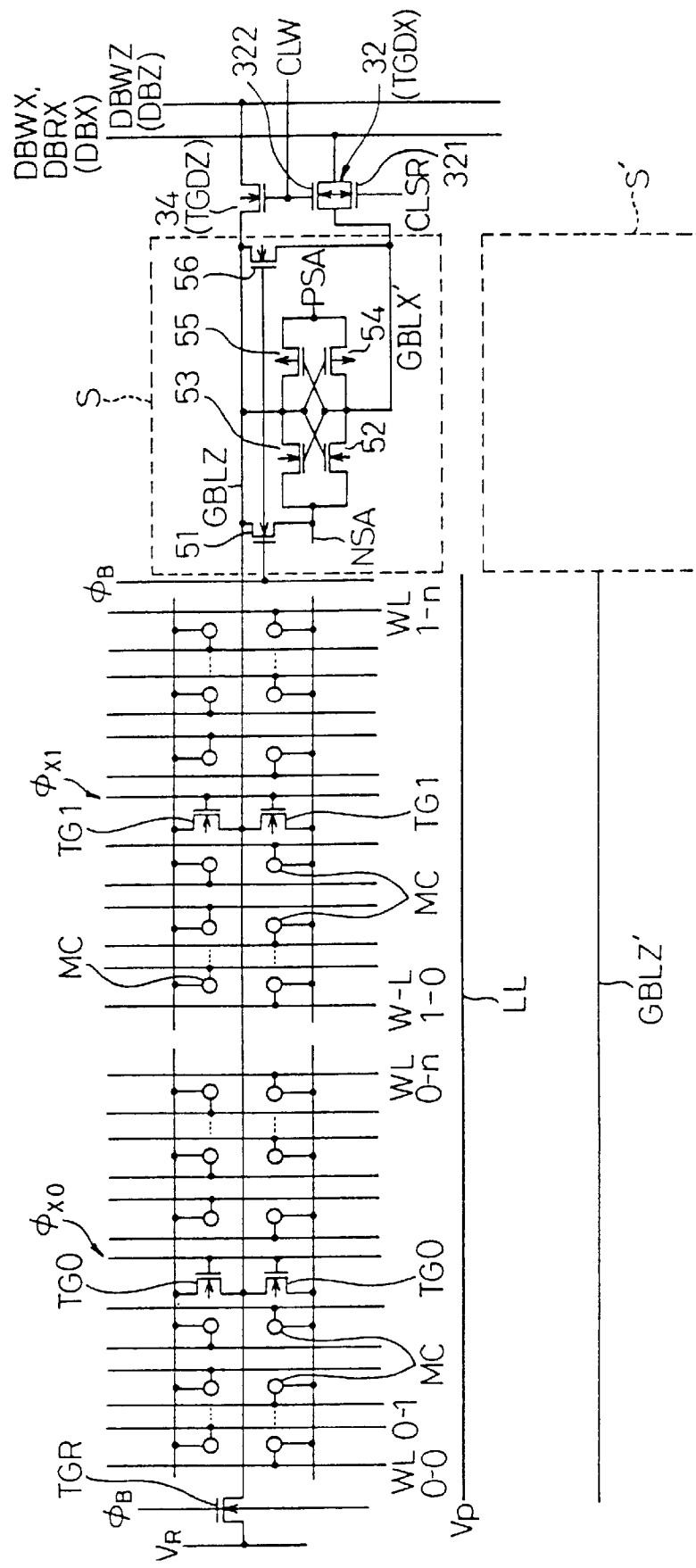
FIG. 9 is a circuit diagram showing a semiconductor memory according to another embodiment of the first aspect of the present invention.

FIG. 9 is a circuit diagram showing a semiconductor memory according to another embodiment of the present invention.

As is apparent from a comparison between FIGS. 6 and 9, the embodiment of FIG. 9 employs a sense amplifier S serving as the current mirror amplifier (differential amplifier) A, tristate inverter (amplifier) A', and control circuit B of FIG. 6. A transfer gate transistor 34 and a transfer gate 32 consisting of transistors 321 and 322 are the same as those of FIG. 6.

The sense amplifier S consists of n-channel MOS transistors 51, 52, 53, and 56 and p-channel MOS transistors 54 and 55. The transistors 52 and 53 are connected crosswise to the transistors 54 and 55. A node between the gates of the transistors 52 and 54 and a node between the drains of the transistors 53 and 55 are connected to a global bit line GBLZ and to a signal line DBZ (DBWZ) through the transfer gate 34. A node between the gates of the transistors 53 and 55 and a node between the drains of the transistors 52 and 54 provide a signal GBLX' and are connected to a signal line DBX (DBWX, DBRX) through the transfer gate 32. The sources of the transistors 51, 52, and 53 are connected to a node that receives a signal NSA. The sources of the transistors 54 and 55 are connected to a node that receives a signal PSA. The signals NSA and PSA drive and control the sense amplifier S. The drains of the transistors 51 and 56 are connected to the global bit line GBLZ.

In this way, the semiconductor memory of the present invention may employ the current mirror amplifier A and inverter A' of FIG. 6, or the sense amplifier S of FIG. 9.

The sense amplifier S helps reduce the number of elements. The signal GBLX', however, is easily affected by amplification noise of the global line GBLZ. To avoid this, wiring LL that receives a cell counter potential Vp is arranged between the global line GBLZ and a global line GBLZ' of an adjacent sense amplifier S', to reduce mutual interference and noise between the adjacent global bit lines GBLZ and GBLZ'. When the wiring LL receiving the cell counter potential Vp is arranged between the adjacent global bit lines GBLZ and GBLZ', the intervals of the metal wiring will be the same as that of the related art of FIG. 1, so that there will be no advantage in a pattern layout. This embodiment, however, is capable of achieving a high-speed read operation and a low power consumption.

As explained above in detail, the first aspect of the present invention provides a semiconductor memory having transfer gates arranged at or near the centers of local bit lines, to thereby realize a high-speed operation and a low power consumption without increasing the number of local bit lines.

As explained with reference to FIG. 4, the semiconductor memory according to the first aspect of the present invention has hierarchical local bit lines LBLZ0 and LBLZ1 and global bit lines GBLZ and GBLX. Each of the local bit lines LBLZ0 and LBLZ1 consists of a pair of branched lines. The transfer gate TG0 is arranged at the center of the local bit line LBLZ0, and the transfer gate TG1 is arranged at the center of the local bit line LBLZ1, to reduce the distance between the transfer gate and memory cells that are arranged at the ends of the local bit line, thereby decreasing the resistance of the bit line.

The local bit lines LBLZ0 and LBLZ1 are connected to the single global bit line GBLZ, and the difference between the voltage of the global bit line GBLZ and the reference voltage VR is amplified. Unlike the prior art that connects two pairs of local bit lines LBL0X, LBL0Z, LBL1X, and LBL1Z to the complementary global bit lines GBLX and GBLZ, the present invention of FIG. 4 connects the local bit lines LBLZ0 and LBLZ1 to the single global bit line GBLZ and omits the global bit line GBLX. Namely, the present invention halves the number of the global bit lines, reduces the charge/discharge current of the bit lines, and shortens the amplification time of the sense amplifier.

Figure 10:
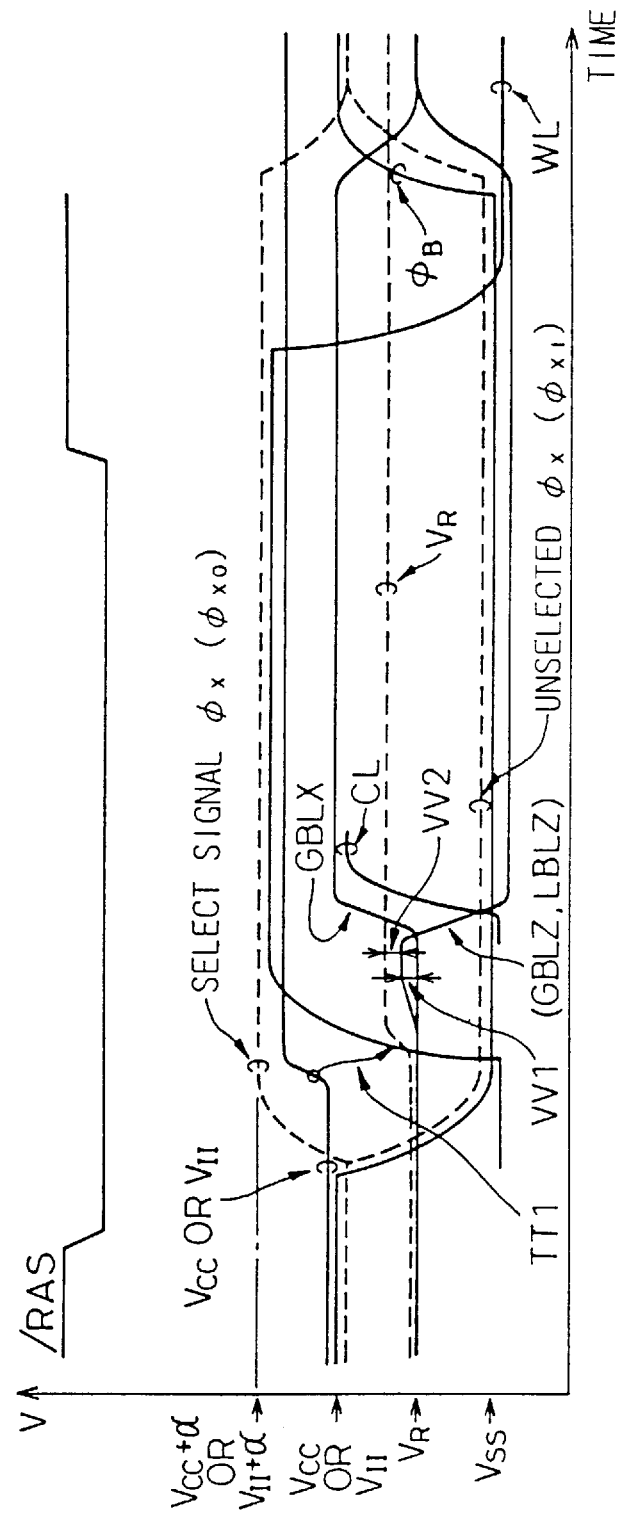
FIG. 10 is a signal waveform diagram showing the operation of reading data "1" out of the memory of FIG. 4.

FIG. 10 is a signal waveform diagram showing the operation of reading data "1" out of the semiconductor memory of FIG. 4.

When the level of a row address strobe signal /RAS changes from high to low, a bit line reset signal φB changes from a high source voltage Vcc (or Vii) to a low source voltage Vss. A local bit line select signal φx (φx0, φx1) changes to select and connect one (LBLZ0) of the local bit lines LBLZ0 and LBLZ1 to the global bit line GBLZ.

A required word line WL is selected, and data stored in a memory cell connected to the selected word line is transferred to the global bit line GBLZ through the local bit line LBLZ0. The reference voltage VR is fixed at Vcc/2 that is an intermediate voltage between the high and low voltages applied to the local bit lines, or at Vii/2 that is an intermediate voltage of the internal source voltage Vii.

If Vcc or Vii suddenly fluctuates during the read operation, the reference voltage VR also fluctuates because it is based on Vcc or Vii. The reference voltage VR may also fluctuate due to noise produced in the semiconductor memory. If the reference voltage VR fluctuates just after the bit line connected to the memory cell to be read is disconnected from the precharging reference voltage VR as indicated with TT1 in FIG. 10, the difference between the initial voltage of the bit line and the reference voltage VR will fluctuate. Then, in the worst case, the difference between the data voltage read out of the memory cell and the reference voltage VR drops to cause a read error.

For example, a correct voltage difference VV1 between the correct reference voltage VR of Vcc/2 (or Vii/2) and the voltage of the global bit line GBLZ may be inverted due to an increase in the reference voltage VR as indicated with VV2 in FIG. 10. In this case, data "1" stored in the memory cell will erroneously be read as "0," and the erroneous data "0" will be rewritten into the memory cell.

The difference between the voltage of the global bit line GBLZ and the reference voltage VR is amplified by the current mirror amplifier A serving as a read differential amplifier. An output GBLX from the amplifier A is fed back to the input terminal of the amplifier A to which the global bit line GBLZ is connected. As a result, the output GBLX increases to Vcc or Vii, and the global bit line GBLZ drops to Vss. When a column select signal CL changes from low (Vss) to high (Vcc or Vii), the transfer gates TGDX and TGDZ are turned on to transfer the voltages of the signal lines (corresponding to the complementary global bit lines GBLX and GBLZ) to the data signal lines DBX and DBZ, which transmit the voltages to the outside. When the read operation completes, the signal /RAS changes from low to high, the word line WL from high to low, and the bit line reset signal φB from low to high, to set the signal lines (GBLX and GBLZ) to the reference voltage VR. At this time, the local bit line select signal φx (φx0, φx1) changes from Vcc+α or Vii+α to Vcc or Vii, to initialize the connections between the local bit lines LBLZ0 and LBLZ1 and the global bit line GBLZ.

In this way, the semiconductor memory of FIG. 4 is capable of reducing the number of global bit lines, decreasing the charge/discharge current of each bit line, and shortening the amplification time of a sense amplifier. However, if the external source voltage Vcc or internal source voltage Vii fluctuates, or if the semiconductor memory produces noise, the difference between the voltage of a bit line connected to a memory cell to be read and the reference voltage VR will also fluctuate to cause a read error.

Accordingly, the second aspect of the present invention provides a semiconductor memory capable of correctly reading data even if a source voltage (Vcc or Vii) fluctuates, or even if noise is produced.

Figure 11:
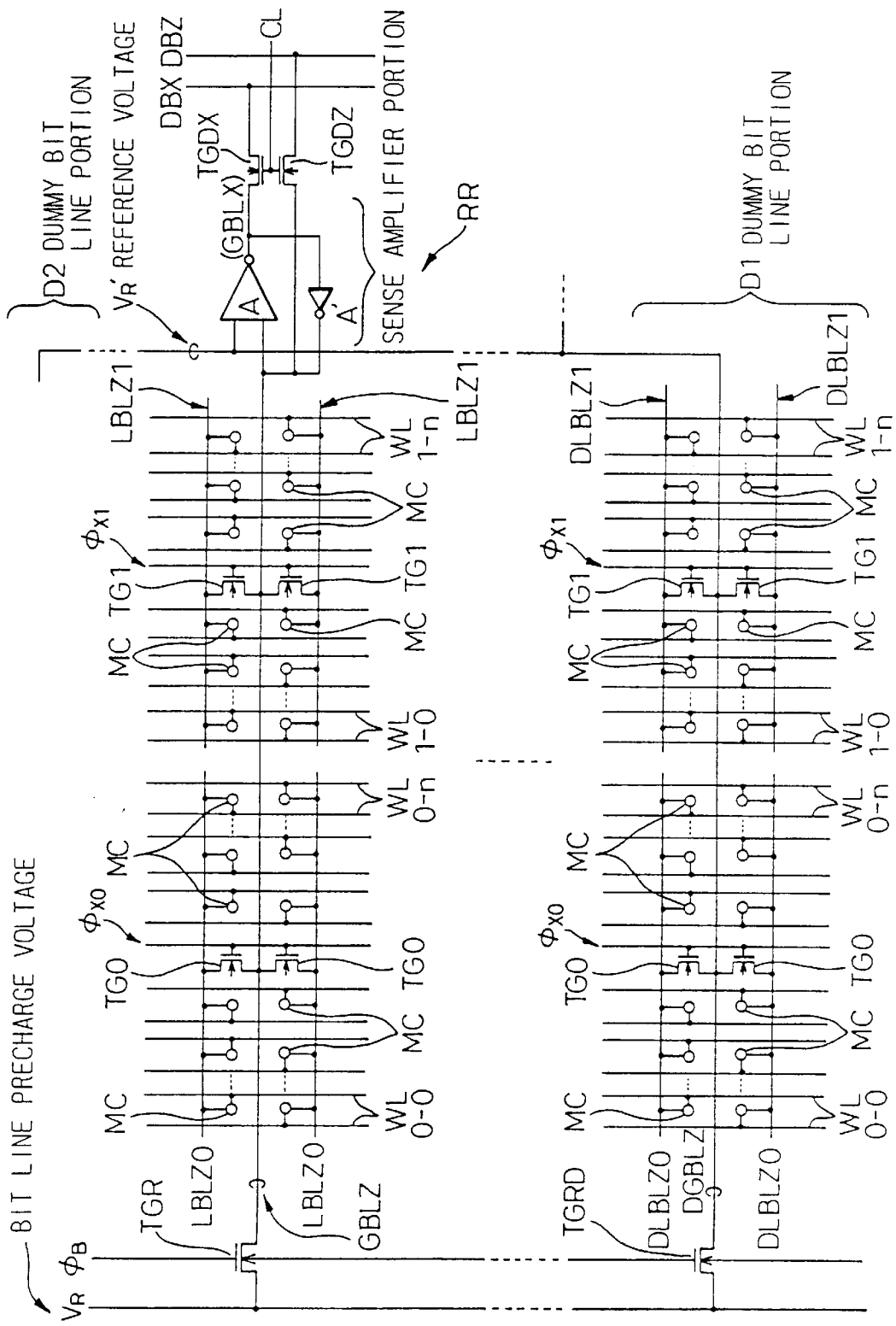
FIG. 11 is a circuit diagram showing the principle of a semiconductor memory according to the second aspect of the present invention.

FIG. 11 is a circuit diagram showing the principle of the semiconductor memory according to the second aspect of the present invention.

The memory has hierarchical local bit lines LBLZ0 and LBLZ1 and a global bit line GBLZ. A read amplifier A amplifies the difference between the voltage of the global bit line GBLZ and a sensing reference voltage VR'. The second aspect is characterized by a dummy global bit line DGBLZ that is charged up to a precharging reference voltage VR during a standby period and is put in a floating state during an active period. The sensing reference voltage VR' is supplied to the amplifier A through dummy bit line portions D1 and D2. This arrangement is capable of correctly reading data even if a source voltage fluctuates, or even if noise is produced.

The semiconductor memory of FIG. 11 has a real bit line portion RR, which is actually used to store data, and the dummy bit line portions D1 and D2. The real bit line portion RR has the global bit line GBLZ, the local bit lines LBLZ0 and LBLZ1, memory cells MC, and a sense amplifier portion. The dummy bit line portion D1 (D2) has the dummy global bit line DGBLZ, dummy local bit lines DLBLZ0 and DLBLZ1, memory cells MC, etc. In practice, the real bit line portion RR contains, for example, 128 global bit lines GBLZ.

The semiconductor memory also has data signal lines DBX and DBZ, transfer gates TG0 and TG1, local bit line select signals φx0 and φx1, and a column select signal CL. Each memory cell is formed at the intersection of each word line WL and each of the local bit lines LBLZ0 and LBLZ1. Each of the local bit lines LBLZ0 and LBLZ1 consists of a pair of lines. The local bit line LBLZ0 is provided with "n+1" word lines WL0-0 to WL0-n, and the local bit line LBLZ1 is provided with "n+1" word lines WL1-0 to WL1-n. The structure of each memory cell MC is the same as that of FIG. 2.

The real bit line portion RR actually stores data, and the dummy bit line portions D1 and D2 supply the sensing reference voltage VR' to the current mirror amplifier (read differential amplifier) A. In each of the dummy bit line portions D1 and D2, one end of the dummy global bit line DGBLZ is connected to a transistor TGRD. The gate of the transistor TGRD receives a bit line reset signal φB. The other end of the line DGBLZ is connected to a reference voltage input terminal of the read amplifier A. In response to the signal φB, the transistor TGRD provides the read amplifier A with the sensing reference voltage VR', which is based on the precharging reference voltage VR, through the line DGBLZ.

The signal φB for controlling the transistors TGRD of the dummy bit line portions D1 and D2 also controls each transistor TGR of the real bit line portion RR. Accordingly, the sensing reference voltage VR' applied to the read amplifier A is charged up to the precharging reference voltage VR during a standby period and is put in a floating state during an active period. Even if a source voltage fluctuates during the active state, the sensing reference voltage VR' is controlled accordingly. Consequently, the difference between the voltage of the real global bit line GBLZ and the voltage VR' is always correct and is amplified by the read amplifier A to correctly read data.

Since the sensing reference voltage VR' is supplied to the read amplifier A through the global bit line DGBLZ of each of the dummy bit line portions D1 and D2, the sensing reference voltage VR' follows a fluctuation, if any, in the voltage of the real global bit line GBLZ due to noise caused during the active period. As a result, data is always correctly read.

Figure 12:
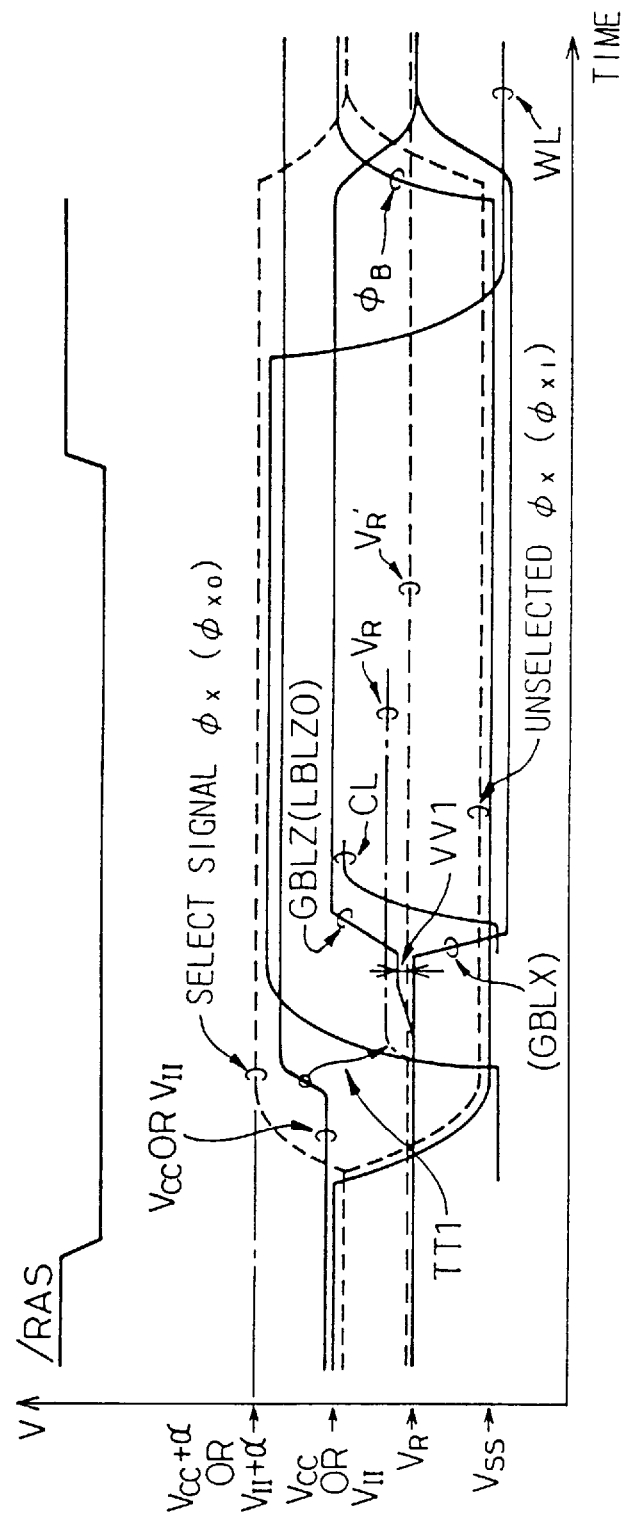
FIG. 12 is a signal waveform diagram showing the operation of the memory of FIG. 11.

FIG. 12 is a signal waveform diagram showing the operation of the semiconductor memory of FIG. 11.

When the level of a row address strobe signal /RAS changes from high to low, the bit line reset signal φB changes from a high source voltage Vcc (or Vii) to a low source voltage Vss. A local bit line select signal φx (φx0, φx1) changes to select and connect one of the real local bit lines LBLZ0 and LBLZ1 to the real global bit line GBLZ. In each of the dummy bit line portion D1 and D2, the transistor TGRD is ON when the signal φB is high, to supply the precharging reference voltage VR (Vcc/2 or Vii/2) to the read amplifier A through the dummy global bit line DGBLZ. When the signal φB changes to low, the transistor TGRD is turned off to float the dummy global bit line DGBLZ.

After the bit line reset signal φB changes from high to low and the local bit line select signal φx (φx0, φx1) changes, an active state starts. If Vcc or Vii suddenly increases at this time as indicated with TT1 in FIG. 12, the precharging reference voltage VR (Vcc/2 or Vii/2) follows the increase. However, the sensing reference voltage VR' supplied to the read amplifier A is unchanged because the transistor TGRD is OFF due to the signal φB to put the dummy global bit line DGBLZ in a floating state. Even if Vcc or Vii suddenly fluctuates just after the real global bit line GBLZ is put in a floating state, the sensing reference voltage VR' supplied through the dummy global bit line DGBLZ only follows a change in the real global bit line GBLZ because the dummy global bit line DGBLZ has the same coupling as the real global bit line GBLZ. As a result, the read amplifier A senses and amplifies the difference between the voltage of the real global bit line GBLZ and the sensing reference voltage VR', to correctly read data irrespective of a fluctuation in the precharging reference voltage VR.

If the voltage of the real global bit line GBLZ fluctuates due to noise produced during the active period, the sensing reference voltage VR' follows the fluctuation to cancel the same. This will be explained later with reference to FIG. 14.

Figure 13:
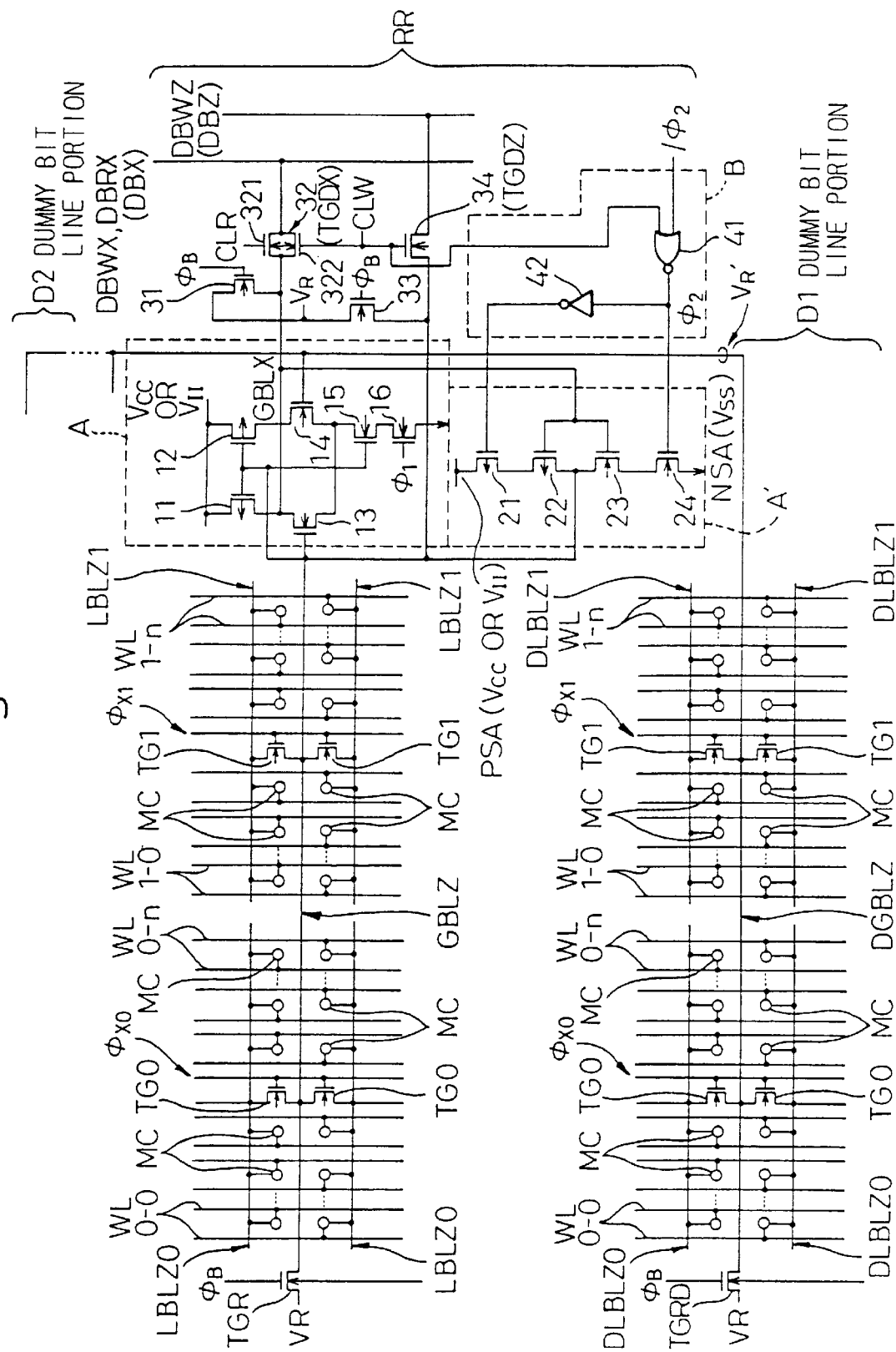
FIG. 13 is a circuit diagram showing a semiconductor memory according to an embodiment of the second aspect of the present invention.

FIG. 13 is a circuit diagram showing a semiconductor memory according to an embodiment of the second aspect of the present invention. The memory has a real bit line portion RR and dummy bit line portions D1 and D2. The real bit line portion RR has a global bit line GBLZ, local bit lines LBLZ0 and LBLZ1, word lines WL, data signal lines DBX and DBZ, transfer gates TG0 and TG1, and memory cells MC. The memory involves local bit line select signals φx0 and φx1, a column select signal CL, and a precharging reference voltage VR. The memory further has a current mirror amplifier (read amplifier) A, a tri-state inverter (rewrite amplifier) A', a bit line reset signal φB, a current mirror amplifier activation signal φ1, a rewrite inverter activation signal φ2, a read column select signal CLR, and a write column select signal CLW.

The dummy bit line portion D1 (D2) has a global bit line DGBLZ, local bit lines DLBLZ0 and DLBLZ1, the word lines WL, the data signal lines DBX and DBZ, transfer gates TG0 and TG1, and a sensing reference voltage VR'. The current mirror amplifier A is a read differential amplifier, and the tri-state inverter A' is a rewrite amplifier. The dummy bit line portion D1 (D2) is not provided with write/read circuits such as the amplifier A and inverter A'. Except for this, the dummy bit line portion D1 (D2) is the same as the real bit line portion RR. The real bit line portion RR has, for example, 128 global bit lines GBLZ.

The embodiment of FIG. 13 arranges the dummy bit line portions D1 and D2 on both sides of the real bit line portion RR. Instead, a single dummy bit line portion may be arranged on one side of the real bit line portion RR as will be explained with reference to FIGS. 19A to 19C. Alternatively, the dummy bit line portion may be arranged for every predetermined number of real bit line portions (subarrays of a memory array). Except write/read circuits such as the amplifier A, the structure of the dummy bit line portion D1 (D2) is the same as the real bit line portion RR so that a fluctuation in the voltage of the real global bit line GBLZ due to noise is followed by the dummy global bit line DGBLZ.

A memory cell MC is formed at the intersection of each word line WL and each of the local bit lines LBLZ0 and LBLZ1. Each of the local bit lines LBLZ0 and LBLZ1 consists of a pair of lines. The local bit line LBLZ0 is connected to, for example, "n+1" word lines WL0-0 to WL0-n, and the local bit line LBLZ1 is connected to, for example, "n+1" word lines WL1-0 to WL1-n.

Similar to the semiconductor memory of FIG. 4, the semiconductor memory of FIG. 13 arranges each of the transfer gates TG0 and TG1, which serve as nodes between the local bit lines LBLZ0 and LBLZ1 and the global bit line GBLZ, at the center of the corresponding local bit line. Namely, the distance between each of the transfer gates TG0 and TG1 and a memory cell MC at an end of the local bit line is half that of the prior art of FIG. 1, to reduce the resistance of each bit line.

The prior art of FIG. 1 connects two pairs of local bit lines LBL0X, LBL0Z, LBL1X, and LBL1Z to the two complementary global bit lines GBLX and GBLZ. On the other hand, the embodiment of FIG. 13 connects the local bit lines LBLZ0 and LBLZ1 to the single global bit line GBLZ like the embodiment of FIG. 4, to omit the global bit line GBLX of the prior art. The current mirror amplifier A of the embodiment of FIG. 13 amplifies the difference between the voltage of the real global bit line GBLZ and the sensing reference voltage VR'. This arrangement halves the number of global bit lines of the prior art, decreases the charge/discharge current of each bit line, and shortens the amplification time of the amplifier. On the opposite ends of the real global bit line GBLZ, there are arranged a reset transistor TGR and a transistor 33, respectively, the gate of each of these transistors receiving a bit line reset signal φB. In response to the signal φB of high level, the global bit line GBLZ is set to the precharging reference voltage VR. An output signal line (GBLX) of the current mirror amplifier A is reset to the precharging reference voltage VR through a reset transistor 31 whose gate receives the signal φB.

The current mirror amplifier A, i.e., the read amplifier consists of p-channel MOS transistors 11 and 12 and n-channel MOS transistors 13, 14, 15, and 16. The real global bit line GBLZ is connected to the gate of the transistor 13. The dummy global bit line DGBLZ for providing a sensing reference voltage VR' is connected to the gate (reference voltage input terminal) of the transistor 14. The amplifier A compares the voltage of the real global bit line GBLZ with the sensing reference voltage VR', to read data.

The tri-state inverter A', i.e., the rewrite amplifier consists of p-channel MOS transistors 21 and 22 and n-channel MOS transistors 23 and 24. The real global bit line GBLZ is connected to a node between the transistors 22 and 23. The output signal (GBLX) of the read amplifier A is connected to the gates of the transistors 22 and 23. The source of the transistor 21 receives a p-channel drive signal PSA, and the source of the transistor 24 receives an n-channel drive signal NSA. The gate of the transistor 24 is connected to the output of a NOR gate 41. The gate of the transistor 21 is connected to the output of the NOR gate 41 through an inverter 42. The NOR gate 41 and inverter 42 form a controller B, which may be installed for each column decoder. Namely, the control circuit B is shared by a plurality of sense amplifiers. The NOR gate 41 receives a rewrite inverter activation signal /φ2 and the write column select signal CLW, to control the operation of the inverter A'.

As explained above, the read amplifier A amplifies the difference between the voltage of the real global bit line GBLZ and the sensing reference voltage VR' that is supplied to the amplifier A through the global bit line DGBLZ of the dummy bit line portion D1 (D2). The output (GBLX) of the amplifier A is passed through the inverter A' and is returned, together with the voltage of the global bit line GBLZ, to the amplifier A, thereby forming signal lines corresponding to the complementary global bit lines GBLX and GBLZ. The voltages of the signal lines GBLX and GBLZ are passed through transfer gates 32 and 34 (TGDX, TGDZ) to the data signal lines DBWX and DBRX (DBX), and DBWZ (DBZ), which transmit the same to the outside. The transfer gate 32 consists of a transistor 321 whose gate receives the read column select signal CLR and a transistor 322 whose gate receives the write column select signal CLW. The transfer gate 32 is selected when carrying out a read or write operation. The transfer gate 34 consists of a transistor whose gate receives the write column select signal CLW and is selected when carrying out a write operation. The signal lines DBWX and DBWZ are write signal lines, and the signal line DBRX is a read signal line. In practice, the data signal line DBX is used as the write/read data signal lines DBWX and DBRX.

Figure 14:
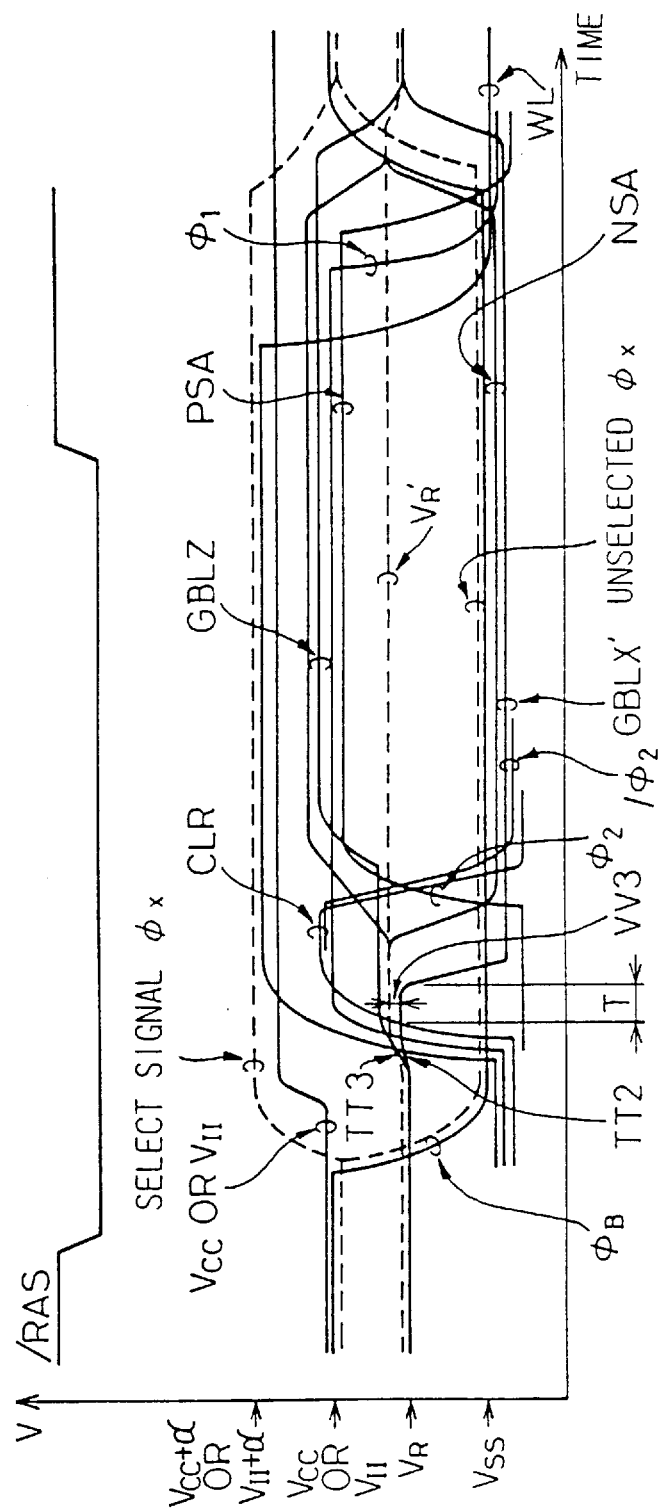
FIG. 14 is a signal waveform diagram showing the operation of reading data "1" out of the memory of FIG. 13.

FIG. 14 is a signal waveform diagram showing the operation of reading data "1" out of the memory of FIG. 13.

When the read operation starts, a row address strobe signal /RAS changes from high to low, and the bit line reset signal φB changes from a high source voltage Vcc or Vii to a low source voltage Vss. As a result, the global bit line GBLZ and the output signal line (GBLX) of the amplifier A are released from the precharging reference voltage VR.

When the bit line reset signal φB is high, the transistor TGRD of each of the dummy bit line portions D1 and D2 is ON to supply the precharging reference voltage VR (Vcc/2 or Vii/2) to the read amplifier A through the dummy global bit line DGBLZ. When the signal φB changes to low, the transistor TGRD is turned off to float the dummy global bit line DGBLZ.

The local bit line select signal (φx (φx0, φx1) changes to select and connect one of the real local bit lines LBLZ0 and LBLZ1 to the real global bit line GBLZ. More precisely, if the local bit line select signal φx0 changes from Vcc (or Vii) to a selected state of Vcc+α (or Vii+α), the two transfer gates TG0 whose gates receive the signal φx0 are turned on to connect the pair lines of the local bit line LBLZ0 to the global bit line GBLZ. The other local bit line select signal φx1 changes from Vcc (or Vii) to an unselected state of Vss, and the two transfer gates TG1 whose gates receive the signal φx1 are turned off to disconnect the pair lines of the local bit line LBLZ1 from the global bit line GBLZ. In this way, the local bit line LBLZ0 is connected to the global bit line GBLZ.

In each of the dummy bit line portions D1 and D2, the transistor TGRD is ON when the bit line reset signal φB is high. Accordingly, the precharging reference voltage VR (Vcc/2 or Vii/2) is supplied to the read amplifier A through the dummy global bit line DGBLZ. When the signal φB changes to low, the transistor TGRD is turned off to float the dummy global bit line DGBLZ.

In the real bit line portion RR, a required word line WL is selected according to an address signal. When the activation signal φ1 changes to high, the amplifier A is activated. When the read column select signal CLR changes to high, the transistor 321 of the transfer gate 32 is turned on to connect the output signal line GBLX of the amplifier A to the data signal line DBX (DBRX). As a result, data stored in a memory cell connected to the selected word line is transferred to the global bit line GBLZ through the local bit line LBLZ0. This embodiment brings the signal CLR to high before amplifying the read signal, to connect the output line DBLX of the amplifier A to the data signal line DBX (DBRX), thereby improving a data read speed.

Similar to the real bit line portion RR, one of the local bit lines DLBLZ0 and DLBLZ1 of each of the dummy bit line portions D1 and D2 is selected in response to the local bit line select signal φx (φx0, φx1), and the selected local bit line is connected to the dummy global bit line DGBLZ. Although the selected word line WL is at high level, the voltage VR' of the dummy global bit line DGBLZ is unchanged because there is no data in the memory cells of the dummy bit line portions D1 and D2.

A reference mark TT2 of FIG. 14 indicates noise occurred during the active period that starts after the bit line reset signal φB changes from high to low and the local bit line select signal φx (φx0, φx1) changes. The noise fluctuates the voltage of the real global bit line GBLZ. At this time, the sensing reference voltage VR' follows the fluctuation in the bit line GBLZ, as indicated with a reference mark TT3. The sensing reference voltage VR' is passed through the dummy global bit line DGBLZ to the amplifier A. Accordingly, the difference between the voltage of the real global bit line GBLZ and the sensing reference voltage VR' is substantially unaffected by the fluctuation in the voltage of the global bit line GBLZ, as indicated with a reference mark VV3 in FIG. 14. Even if coupling noise occurs when the voltage of the word line WL changes from Vss to Vcc+α (or Vii+α), or when the local bit line select signal φx changes from Vcc to Vcc+α (or from Vii to Vii+α), or when each unselected local bit line select signal φx changes to Vss, the sensing reference voltage VR' supplied through the dummy global bit line DGBLZ follows a fluctuation in the voltage of the real global bit line GBLZ caused by the noise. Consequently, the output of the amplifier A is correct to read data.

The present invention arranges the transfer gate TG0 (TG1) at the center of the local bit line LBLZ0 (LBLZ1), and therefore, a voltage change caused by a selected memory cell is quickly transferred to the global bit line GBLZ. Even if the selected memory cell is farthest from the transfer gate TG0, the distance between them is less than half the length of the local bit line LBLZ0, to thereby reduce the resistance of the local bit line LBLZ0 and quickly transfer the voltage change caused by the selected memory cell to the global bit line GBLZ. This is the reason why the changing time T of the bit line of FIG. 14 is about half the changing time t of FIG. 3.

When the rewrite inverter activation signal /φ2 changes to low and when the write column select signal CLW applied to the NOR gate 41 is low, the output of the NOR gate 41 is high to activate the tri-state inverter A', i.e., the rewrite amplifier.

The difference between the voltage (high in FIG. 14) of the real global bit line GBLZ and the sensing reference voltage VR' is amplified by the current mirror amplifier A, and the output of the amplifier A is supplied to the gates of the transistors 22 and 23 of the inverter A'. The inverter A' inverts the output of the amplifier A and provides the inverted voltage to the real global bit line GBLZ. The p-channel and n-channel drive signals PSA and NSA are supplied to the sources of the transistors 21 and 24, respectively. These signals PSA and NSA are at the precharging reference voltage VR during the standby period, and they are charged and discharged therefrom to Vcc (or Vii) and Vss, respectively, before the activation signal φ2 changes. Note that, in FIG. 13, the signals PSA and NSA can be fixed at Vcc (or Vii) and Vss (when the gate 41 is constituted as a NOR gate).

As a result, the difference between the voltage of the real global bit line GBLZ and the output signal (GBLX) of the amplifier A is expanded. The output signal (GBLX) of the amplifier A is transferred to the data signal line DBRX (DBX) through the transistor 321 and then to the outside. The voltage of the global bit line GBLZ is not transferred to the data signal line DBZ because the transfer gate (transistor) 34 is OFF.

When the read operation completes, the signal /RAS changes from low to high, and the word line WL to low. At the same time, the activation signal φ1 changes from high to low to deactivate the amplifier A. The bit line reset signal φB changes from low to high to set the global bit line GBLZ and signal line GBLX to the reference voltage VR. The local bit line select signal φx (φx0, φx1) changes from the selected state of Vcc+α (or Vii+α) to Vcc (or Vii), or from the unselected state of Vss to Vcc (or Vii). As a result, the connections between the local bit lines LBLZ0 and LBLZ1 and the global bit line GBLZ are initialized.

During the read operation, the real global bit line GBLZ is indirectly connected to the read wiring (data signal line) DBRX (DBX), and therefore, the read column select signal CLR can be activated early. When a given word line WL is activated, a voltage is supplied to the global bit line GBLZ at a time constant that is about half that of the prior art of FIG. 1, to produce a voltage difference with respect to the reference voltage VR. At this time, the amplifier A is active due to the activation signal φ1 that is activated simultaneously with the word line WL. Accordingly, the voltage difference is amplified to send cell data as the output signal GBLX to the data signal line DBRX (DBX) through the transistor 321 of the transfer gate 32, thereby realizing a high-speed read operation. Since the output signal GBLX is small, it is amplified at high speed. Accordingly, when the activation signal φ2 is provided to the rewrite inverter A', the amplification of the output signal GBLX is complete, and therefore, a rewrite operation to the global bit line GBLZ is carried out at high speed. The inverter A' produces substantially no through current, to reduce power consumption. More precisely, the charge/discharge current of each bit line is about half that of the prior art of FIG. 1. It is possible to relax the intervals between the global bit lines GBLZ to about twice as large as those of the prior art of FIG. 1, to thereby reduce the line-to-line capacitance and mutual interference of the global bit lines. The present invention provides these effects not only in the read operation but also in a write operation.

Figure 15:
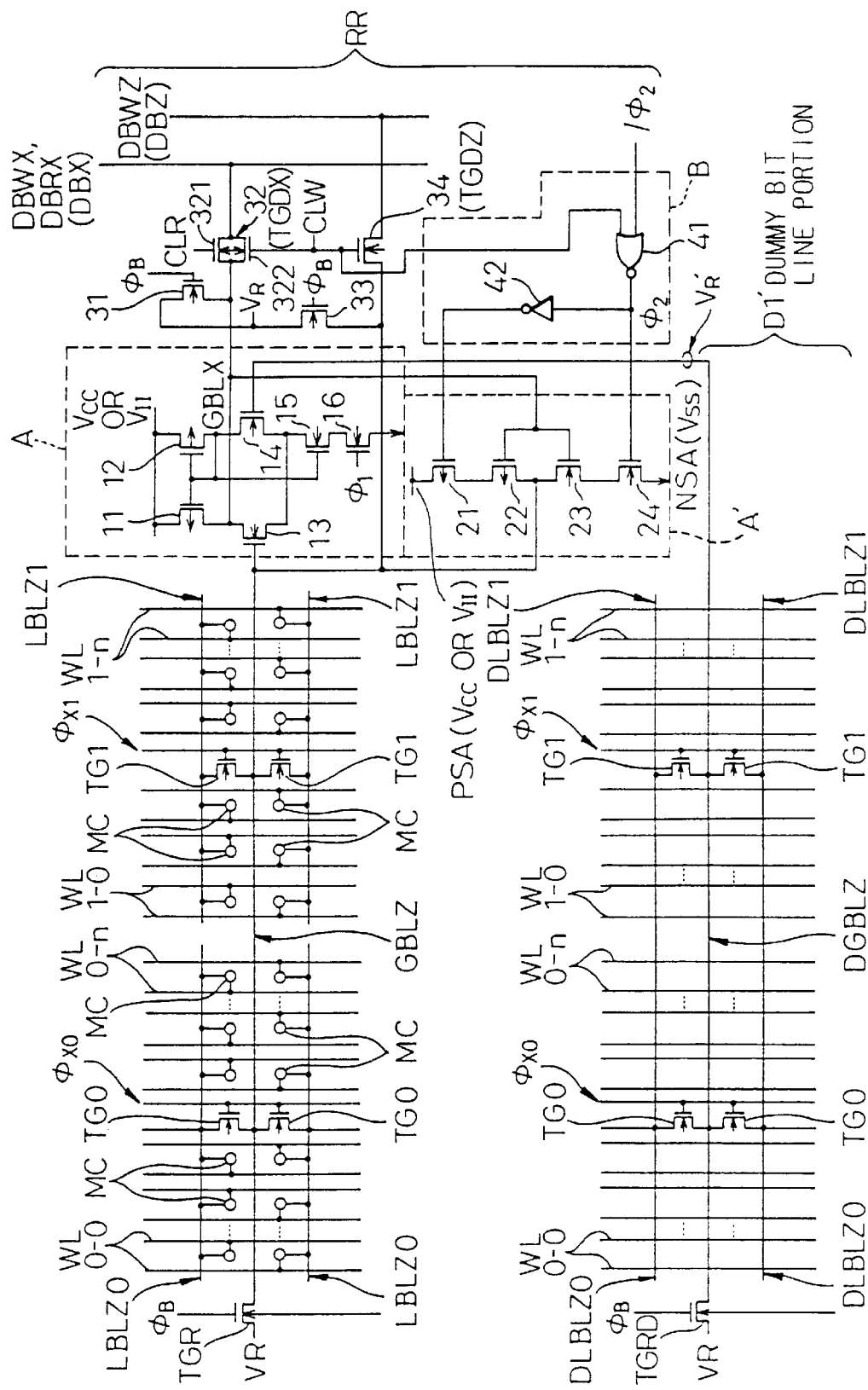
FIG. 15 is a circuit diagram showing a semiconductor memory according to another embodiment of the second aspect of the present invention.

FIG. 15 is a circuit diagram showing a semiconductor memory according to another embodiment of the second aspect of the present invention.

This embodiment arranges a dummy bit line portion D1' on one side of a real bit line portion RR. The dummy bit line portion D1' has no memory cells. This arrangement also lets a sensing reference voltage VR' applied to a current mirror amplifier A through a dummy global bit line DGBLZ follow a fluctuation in the voltage of a real global bit line GBLZ. The dummy bit line portion D1' has transfer gates TG0 and TG1 each controlled by a local bit line select signal φx (φx0, φx1). The operation of this embodiment is the same as that of FIG. 14, and therefore, it will not be explained again.

In each of the embodiments explained above, the dummy global bit line DGBLZ is charged during a standby period up to the precharging reference voltage VR that is equal to the voltage of the real global bit line GBLZ. Thereafter, the bit line reset signal φB disconnects the real and dummy global bit lines from the voltage VR. As a result, even if the source voltage suddenly changes to fluctuate the precharging reference voltage VR after the global bit lines are disconnected from the same, no fluctuation occurs between the real and dummy global bit lines GBLZ and DGBLZ because these global bit lines are both floating. Even if coupling noise occurs at the rise or fall of signals for selecting a word line and a local bit line, to fluctuate the voltages of the real and dummy global bit lines GBLZ and DGBLZ, they similarly fluctuate to cause no fluctuation in the difference between the voltages thereof. Consequently, data is always correctly read even if the source voltage fluctuates or even if noise occurs.

If wiring capacitance when is not considered the sensing reference voltage VR' is passed through wiring formed in a memory block or subarrays of a memory array, there will be a small difference between a fluctuation in the voltage of the real global bit line GBLZ and a fluctuation in the sensing reference voltage VR'. To solve this problem, the embodiments of FIGS. 11 and 13 arrange the dummy bit line portions D1 and D2 on both sides of the real bit line portion RR, to compensate for the wiring capacitance of subarrays. The embodiment of FIG. 15 arranges the dummy bit line portion D1' on one side of the real bit line portion RR with no memory cells being arranged in the dummy bit line portion D1'. This arrangement is also effective in practice. Although it may increase the area of a memory array, the dummy wiring for generating the sensing reference voltage VR' may be arranged in each subarray of the memory array, to maintain the symmetry of the memory array.

Figure 16:
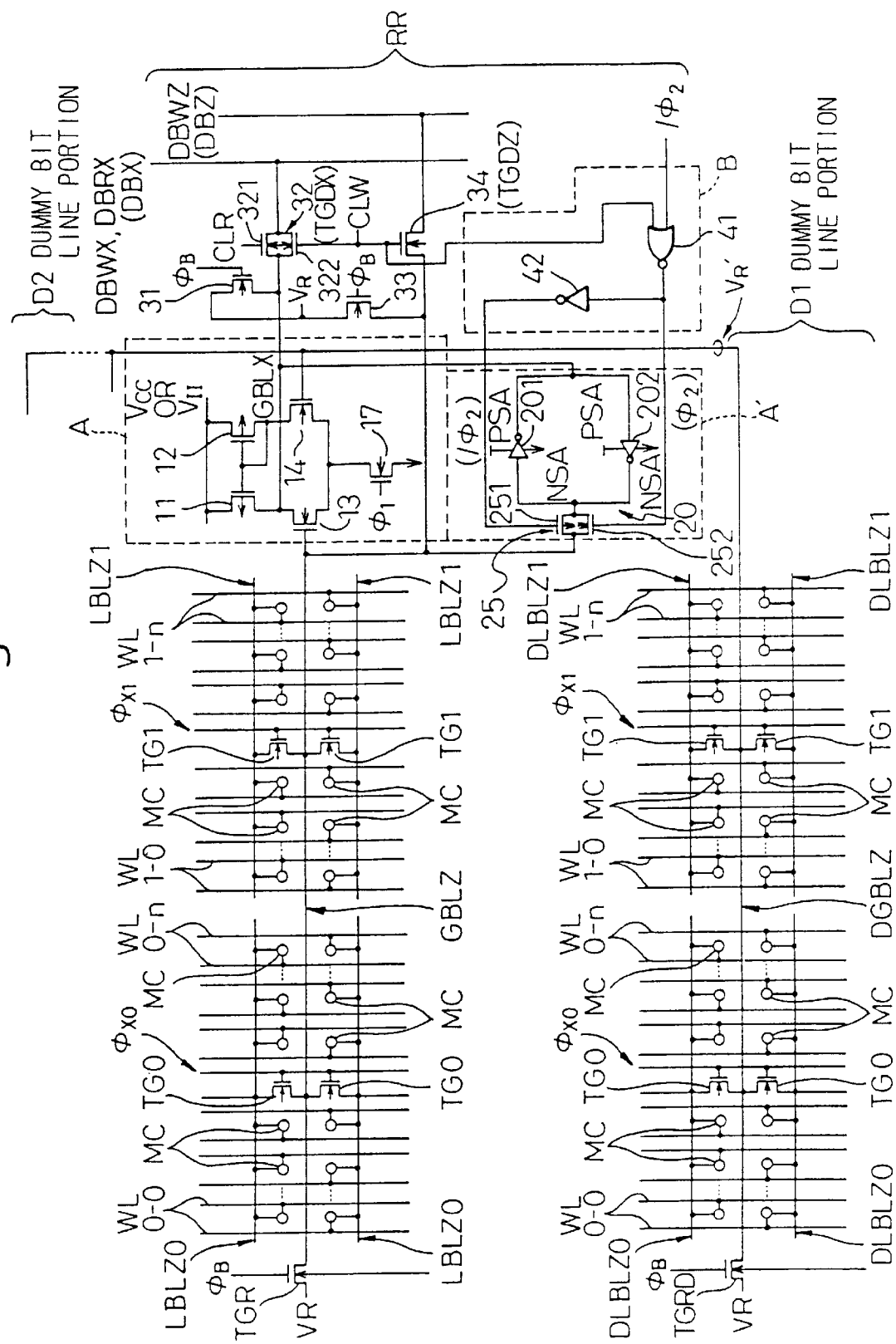
FIG. 16 is a circuit diagram showing a semiconductor memory according to still another embodiment of the second aspect of the present invention.
Figure 17:
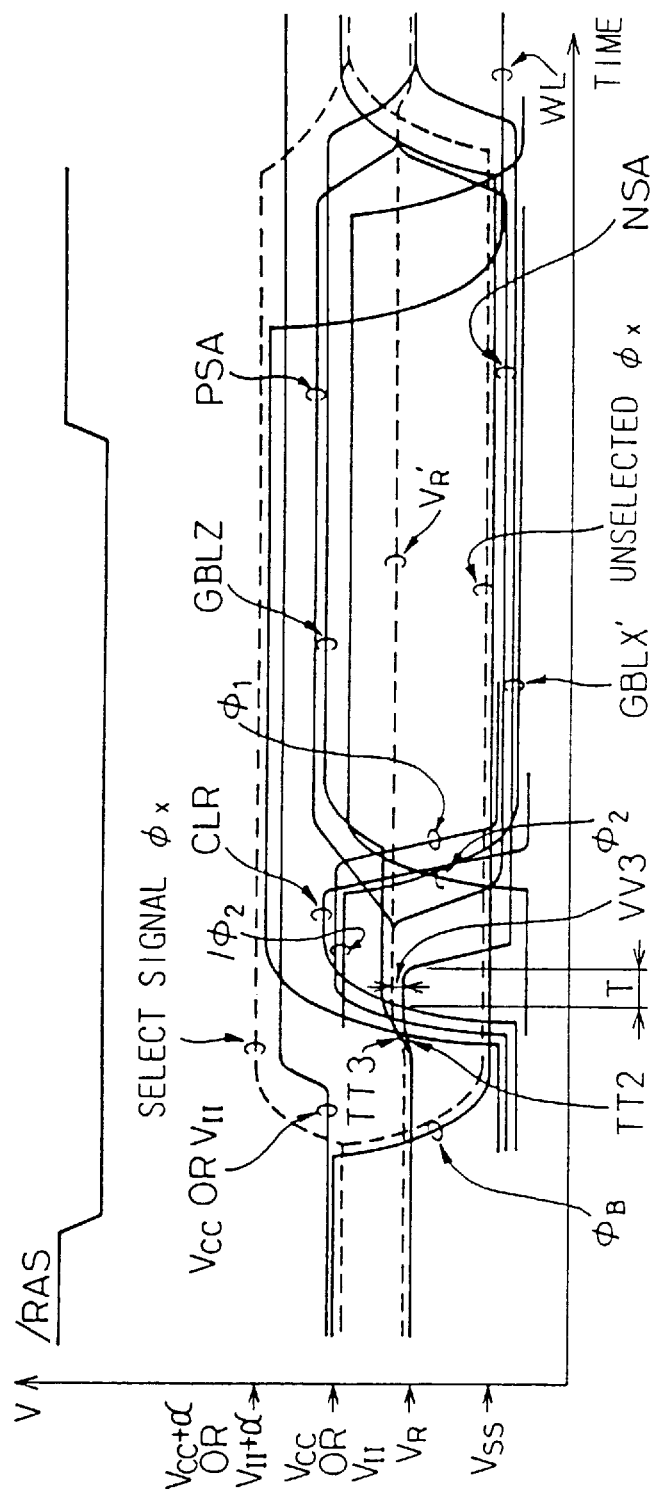
FIG. 17 is a signal waveform diagram showing the operation of reading data "1" out of the memory of FIG. 16.

FIG. 16 is a circuit diagram showing a semiconductor memory according to still another embodiment of the second aspect of the present invention, and FIG. 17 is a signal waveform diagram showing the operation of reading data "1" out of the memory of FIG. 16.

The memory of FIG. 16 differs from those of FIGS. 13 and 15 in the structures of read amplifier A and rewrite amplifier A'. The memory of FIG. 16 has an n-channel MOS transistor 17 whose gate receives an activation signal φ1, a latch circuit 20 composed of inverters 201 and 202, and a transfer gate 25.

The read amplifier A, i.e., a current mirror amplifier consists of p-channel MOS transistors 11 and 12 and n-channel MOS transistors 13, 14, and 17. A global bit line GBLZ of a real bit line portion RR is connected to the gate of the transistor 13. A global bit line DGBLZ for supplying a sensing reference voltage VR' of a dummy bit line portion D1 (D2) is connected to the gate of the transistor 14 serving as a reference voltage input terminal of the amplifier A. The amplifier A compares the voltage of the real global bit line GBLZ with the sensing reference voltage VR', to read data.

The signal φ1 of FIG. 17 for activating the amplifier A becomes high for a period that is shorter than the period in which the activation signal φ1 of FIG. 14 is high. This is to minimize power consumption due to a through current that passes the transistor 17 of the amplifier A while the activation signal φ1 is being high.

The rewrite amplifier A' consists of the latch circuit 20 and transfer gate 25. The latch circuit 20 is made of the oppositely connected inverters 201 and 202. The input terminal of the latch circuit 20 is connected to a global bit line GBLX, and the output thereof is connected to the global bit line GBLZ through the transfer gate 25. The transfer gate 25 consists of a p-channel MOS transistor 251 whose gate receives an activation signal /φ2, and an n-channel MOS transistor 252 whose gate receives an activation signal φ2.

The current mirror amplifier A amplifies the difference between the voltage of the global bit line GBLZ and the sensing reference voltage VR'. The signal waveforms of reading data "1" are the same as those of FIG. 14, and therefore, they are not explained again. The rewrite amplifier A' of this embodiment may be formed as a tri-state inverter as shown in FIG. 13.

Figure 18:
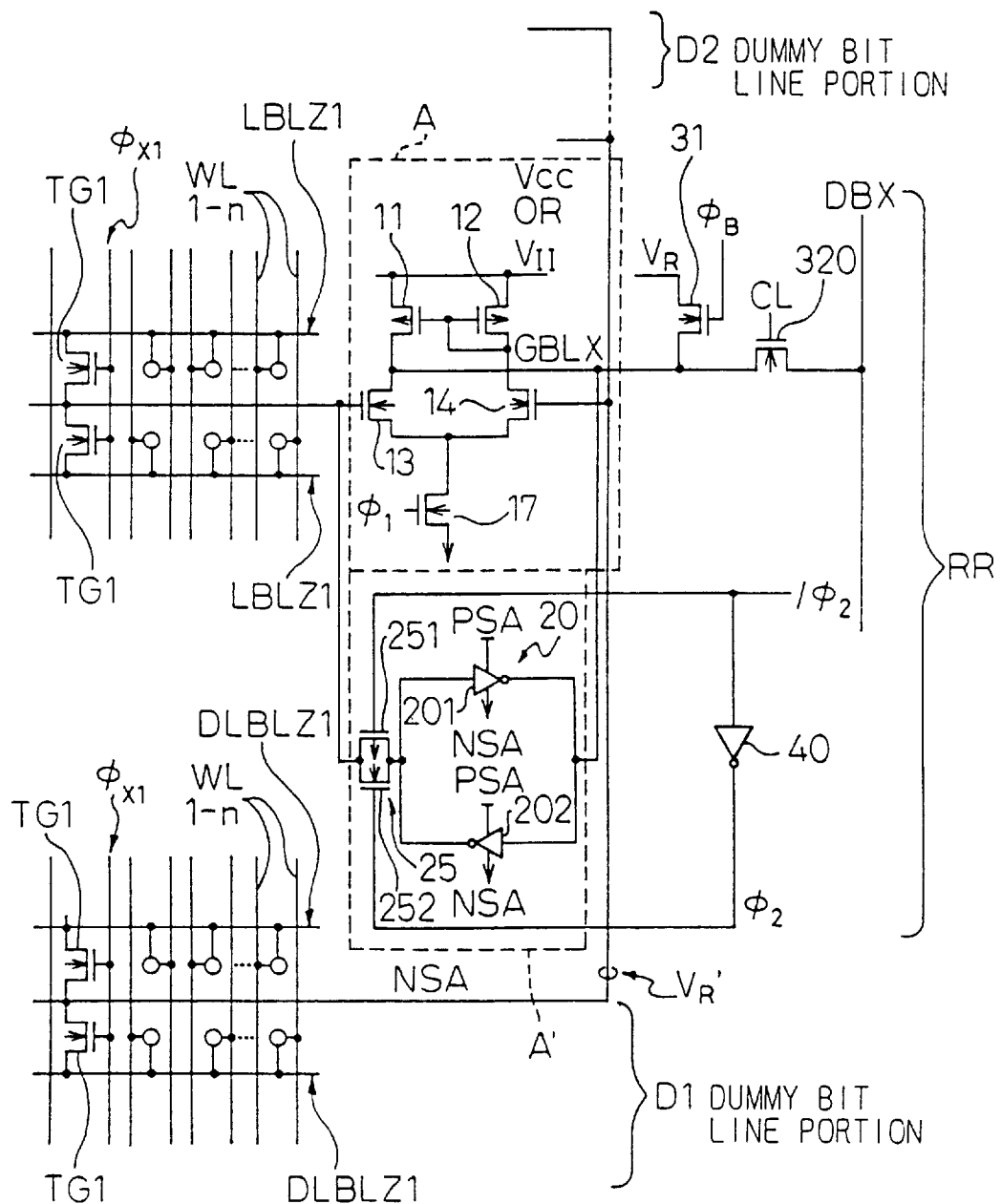
FIG. 18 is a circuit diagram showing a semiconductor memory according to a modification of the embodiment of FIG. 16.

FIG. 18 is a circuit diagram showing a semiconductor memory according to a modification of the embodiment of FIG. 16. A read amplifier A and a rewrite amplifier A' of FIG.

18 are the same as those of FIG. 16. FIG. 18 differs from FIG. 16 in a controller B, etc. In FIG. 18, a global bit line GBLX is connected to a data signal line DBX through an n-channel MOS transistor 320, to omit the transistors 33 and 34 of FIG. 16. Since there is no need of carrying out a logical calculation of a write column select signal CLW, the controller B of FIG. 18 has no NOR gate 41. Instead, an inverter 40 is used to generate activation signals /φ2 and φ2 to control transistors 251 and 252 of a transfer gate 25.

The reason why the modification of FIG. 18 can omit the transistor 34 connected to the data signal line DBZ of FIG. 16 is because data read to the data signal line DBX ensures a sufficient read operation and because the rewrite amplifier A' having the latch circuit 20 and transfer gate 25 is capable of carrying out a sufficient data rewrite operation.

Figure 19A:
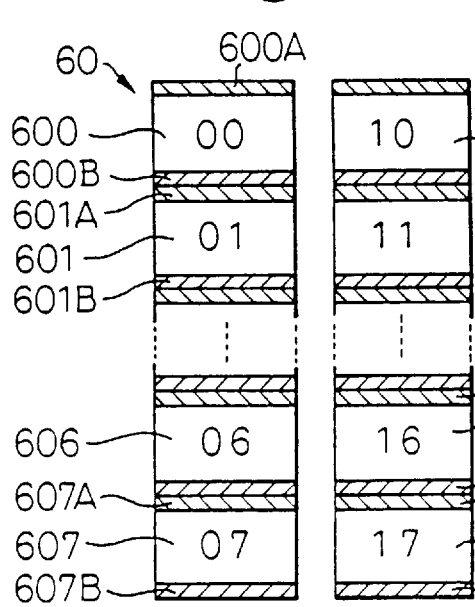
FIGS. 19A to 19C are general views showing semiconductor memories according to the present invention.
Figure 19B:
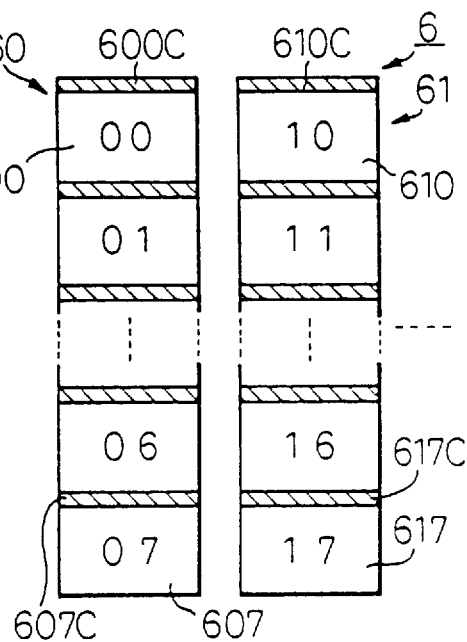
Figure 19C:
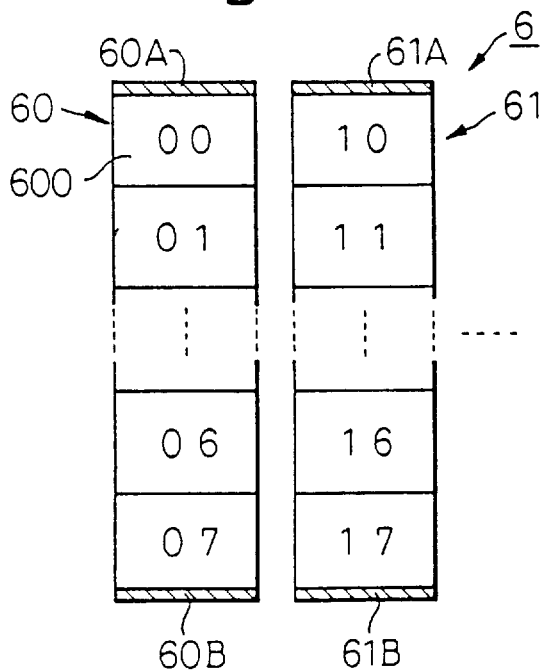

FIGS. 19A to 19C are general views showing semiconductor memories according to the present invention. Each memory has a memory array 6, memory blocks 60, 61, and the like, and subarrays 600, 601, and the like. Each subarray is made of, for example, 128 real global bit lines (GBLZ). Each memory also has dummy bit line portions 600A, 600B, 601A, 601B, ... , 600C, 601C, ... , 60A, 60B, 61A, and 61B corresponding to the dummy bit line portions D1 and D2.

In FIG. 19A, the dummy bit line portion is formed on each side of every subarray of each memory block. For example, the dummy bit line portions 600A and 600B are formed on opposite sides of the subarray 600, and the dummy bit line portions 601A and 601B are formed on opposite sides of the subarray 601.

In FIG. 19B, the dummy bit line portion is formed on one side of every subarray of each memory block. For example, the dummy bit line portion 600C is formed on one side of the subarray 600, and the dummy bit line portion 601C is formed on one side of the subarray 601.

In FIG. 19C, the dummy bit line portion is formed on each side of each memory block. For example, the dummy bit line portions 60A and 60B are formed on opposite sides of the memory block 60, and the dummy bit line portions 61A and 61B are formed on opposite sides of the memory block 61.

The dummy bit line patterns of FIGS. 19A to 19C are properly selected according to the wiring capacitance of each real global bit line, so that a fluctuation in the voltage of the real global bit line GBLZ is applied to the dummy global bit line DGBLZ that passes the sensing reference voltage VR'. The dummy bit lines are formed on the backing section of the word lines (where the word lines made of, for example, polysilicon are connected to aluminum wiring) or on subword decoders. Accordingly, there is no need of preparing a special area for the dummy bit line portions.

As explained above, the second aspect of the present invention provides a semiconductor memory having hierarchical bit lines capable of maintaining the difference to be read between a reference voltage and the voltage of a bit line even if a source voltage suddenly changes or even if noise occurs, without increasing the area of a memory cell array.

The semiconductor memory of the second aspect supplies a sensing reference voltage through dummy bit lines, which are charged up to a precharging reference voltage during a standby period and are put in a floating state during an active period, to correctly read data even if a source voltage fluctuates or even if noise occurs.

Semiconductor memories according to the third aspect of the present invention will be explained.

Figure 20:
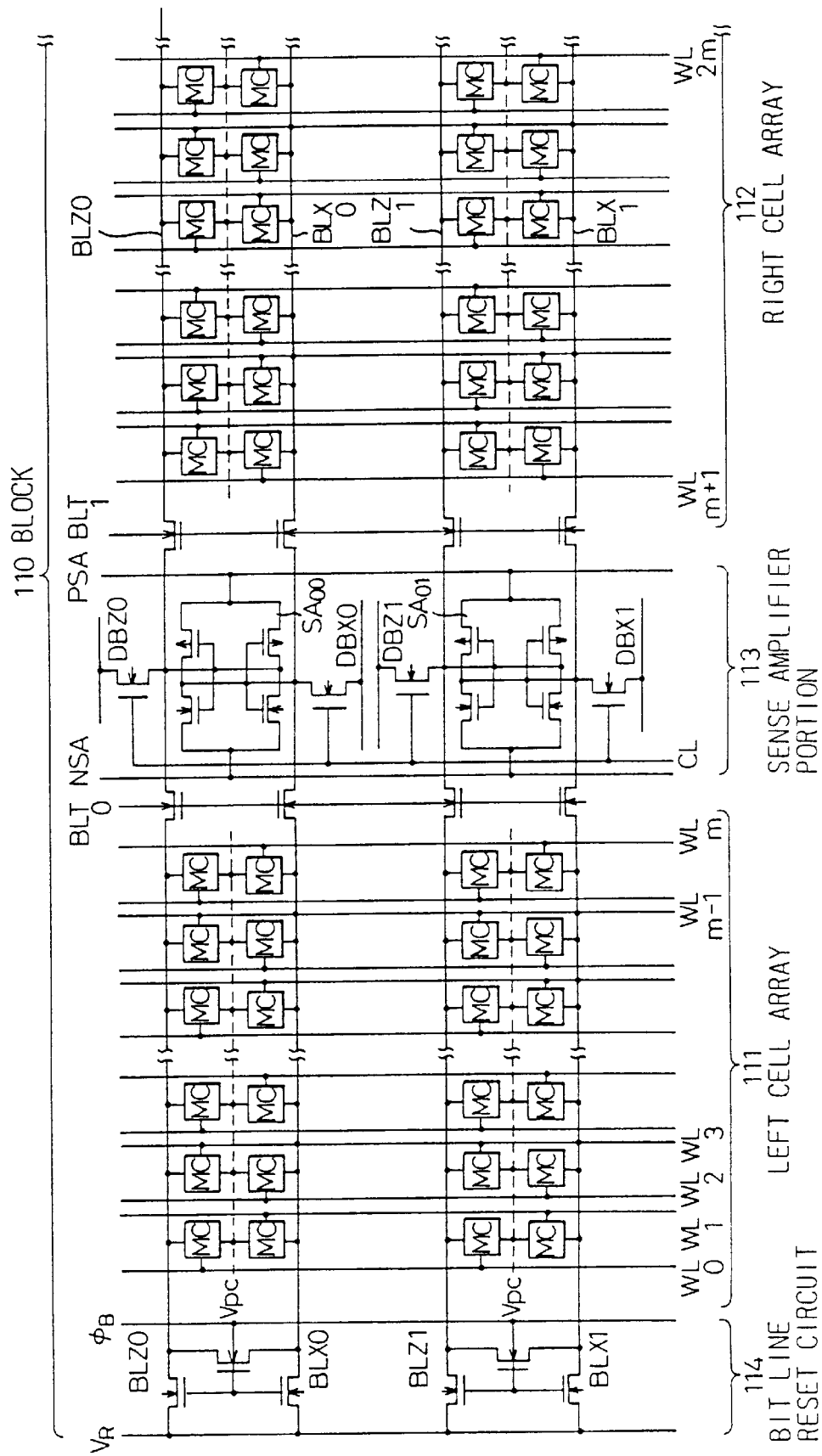
FIG. 20 is a circuit diagram showing a semiconductor memory according to a prior art.

FIG. 20 is a circuit diagram showing a folded bit line semiconductor memory according to a prior art. In particular, the drawing shows the layout of bit lines, word lines, memory cells, and sense amplifiers of two columns in a memory block 110. A sense amplifier portion 113 is arranged at the center of the memory block 110, and pairs of bit lines such as BLZ0 and BLX0 extend on both sides of the sense amplifier portion 113. Word lines WL0 to WL2m cross the bit lines. Memory cells MC are arranged at the intersections of the bit and word lines. A bit line reset circuit 114 resets the bit lines to a reference voltage VR. Clock signals BLT0 and BLT1 control transfer transistors, which connect the bit lines to sense amplifiers SA00 and SA01.

Figure 21:
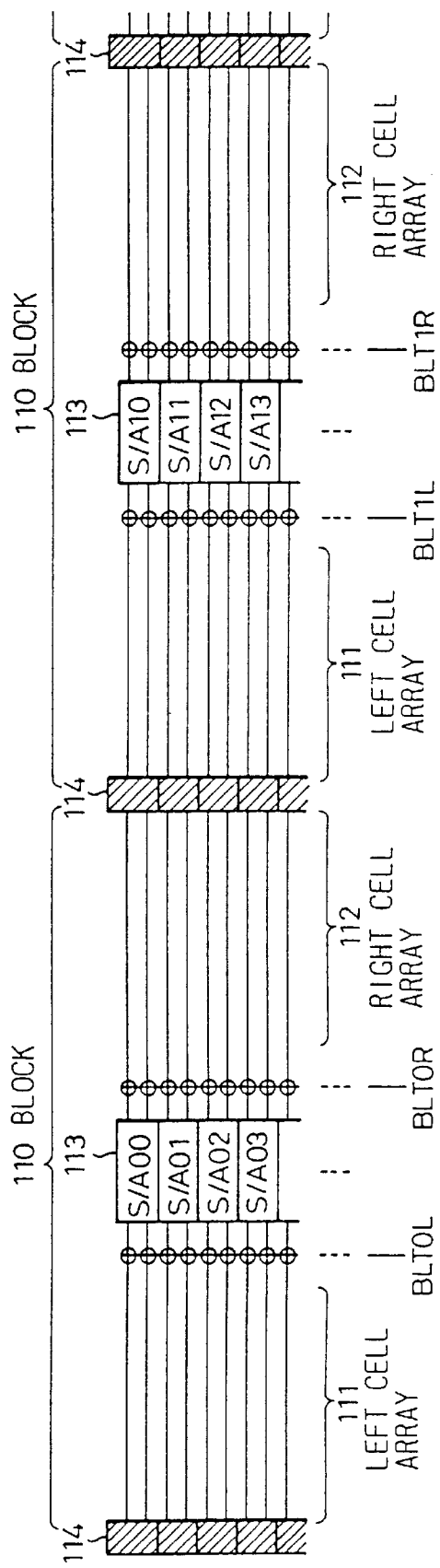
FIG. 21 is a circuit diagram showing the memory of FIG. 20.

FIG. 21 is a circuit diagram showing two memory blocks of the memory of FIG. 20. The folded bit line method arranges each pair of bit lines in parallel with each other and connects the bit lines to a sense amplifier. When the voltage of one of the bit lines of each pair is amplified, the voltage of the other bit line is used as a reference voltage. This arrangement resists noise when reading data.

The bit lines BLZ0 and BLX0 forming a pair connected to the sense amplifier SA00 are connected to the word lines WL0 to WL2m such that each word line involves only one memory cell for the two bit lines. For example, only the bit line BLZ0 among the bit lines BLZ0 and BLX0 is connected to a memory cell along the word line WL0. This is because only one memory cell must be specified by a word line and a pair of bit lines. The memory cells, therefore, are zig-zagged according to the folded bit line method. This arrangement has bad space efficiency, i.e., a large memory cell area and large intervals of bit and word lines.

When a large number of memory cells must be densely arranged in a very fine structure, the resistance and load capacitance of bit lines reduce an operating speed. Semiconductor memories, however, must have large capacity and a high operating speed. Accordingly, a fine structure that does not reduce an operating speed is required. To meet this requirement, the hierarchical bit line method has been proposed.

Figure 22:
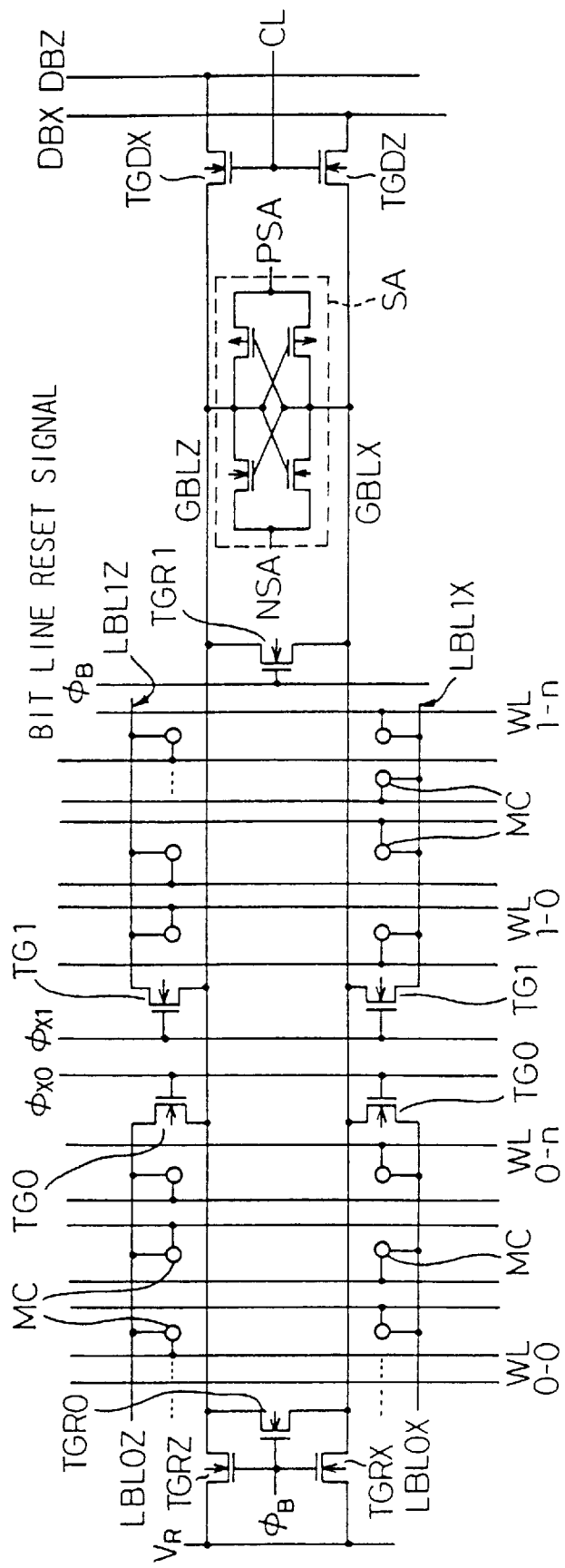
FIG. 22 is a circuit diagram showing a semiconductor memory according to a related art.

FIG. 22 is a circuit diagram showing a semiconductor memory according to a related art. This memory employs the hierarchical bit line method and folded bit line method. Each bit line extending in a columnar direction is divided into a plurality of local bit lines LBL one of which is connected to a corresponding global bit line (GBLZ, GBLX) through a local bit line selecting transistor TG. The global bit lines are made of low-resistance metal such as tungsten or aluminum. The local bit lines are made of polysilicon on a lower layer. This structure reduces the total resistance and capacitance of bit lines connected to a sense amplifier, to decrease the load capacitance and resistance of the sense amplifier and improve read and write speeds.

The hierarchical bit line method, however, has several problems in developing a fine structure for a semiconductor memory of large capacity.

First, the global bit lines are not suitable for fine processes because they are made of low-resistance metal to have a large width. It is necessary, therefore, to narrow the local bit lines and shorten the intervals thereof, to increase the capacity of the memory. The structure of FIG. 22 arranges two local bit lines for each global bit line and, therefore, is not suitable for densely zigzagging memory cells each along two bit lines and one word line so that only a single memory cell is selected and connected to a sense amplifier through a bit line.

Secondary, although the global bit lines are wide, the absolute width thereof is becoming smaller. Due to this, the intervals of the global bit lines do not match with those of the sense amplifiers, and the space efficiency of the sense amplifiers is inferior to that of the global bit lines. The sense amplifiers are becoming complicated to improve their operation speed, to increase the imbalance between the space for the sense amplifiers and the intervals of the bit lines.

An object of the third aspect of the present invention is to provide a semiconductor memory having hierarchical bit lines laid out at optimum space efficiency to realize a high-speed operation. Another object of the third aspect is to provide a DRAM having hierarchical bit lines with two bit lines connected to a global bit line. Still another object is to provide a DRAM having a high-speed sense amplifier with the size of the sense amplifier matched with the interval of at least two global bit lines.

In order to achieve the objects, the third aspect of the present invention provides a semiconductor memory having word lines, global bit lines extending orthogonally to the word lines, branched local bit lines running in parallel with the global bit lines so that a plurality of the local bit lines is subordinated to each of the global bit lines, memory cells formed at the intersections of the word lines and local bit lines, and sense amplifiers formed in an area matching with the interval of a given number of the global bit lines, each of the sense amplifiers receiving signals from a horizontal pair of the global bit lines arranged on opposite sides of the sense amplifier.

For example, two local bit lines are subordinated to each global bit line. The global bit lines are wide and formed on an upper layer, and the local bit lines are narrow and formed on a lower layer. The global and local bit lines properly match with each other. The interval of a given number of the global bit lines matches with the area of a predetermined number of the sense amplifiers. Accordingly, the area of the sense amplifiers is secured with respect to the local bit lines that are densely formed. Each sense amplifier stably amplifies signals from a pair of global bit lines that are formed on opposite sides of the sense amplifier.

Since the area of each sense amplifier has a sufficient space, the sense amplifier may consist of a read amplifier for amplifying signals from the global bit lines connected thereto, a write amplifier for receiving an output signal from the read amplifier and providing the global bit lines with drive signals, and a transfer gate arranged between the output terminal of the read amplifier and the input terminal of the write amplifier, to isolate the amplifiers from each other. The input terminal of the write amplifier is connected to a data bus line through a column gate.

The read amplifier is not required to drive global bit lines of relatively large capacity. This improves read speed and reduces power consumption. When writing data, the read amplifier is isolated from the write amplifier, to avoid conflict between the write amplifier connected to the data bus line and read amplifier.

Figure 23:
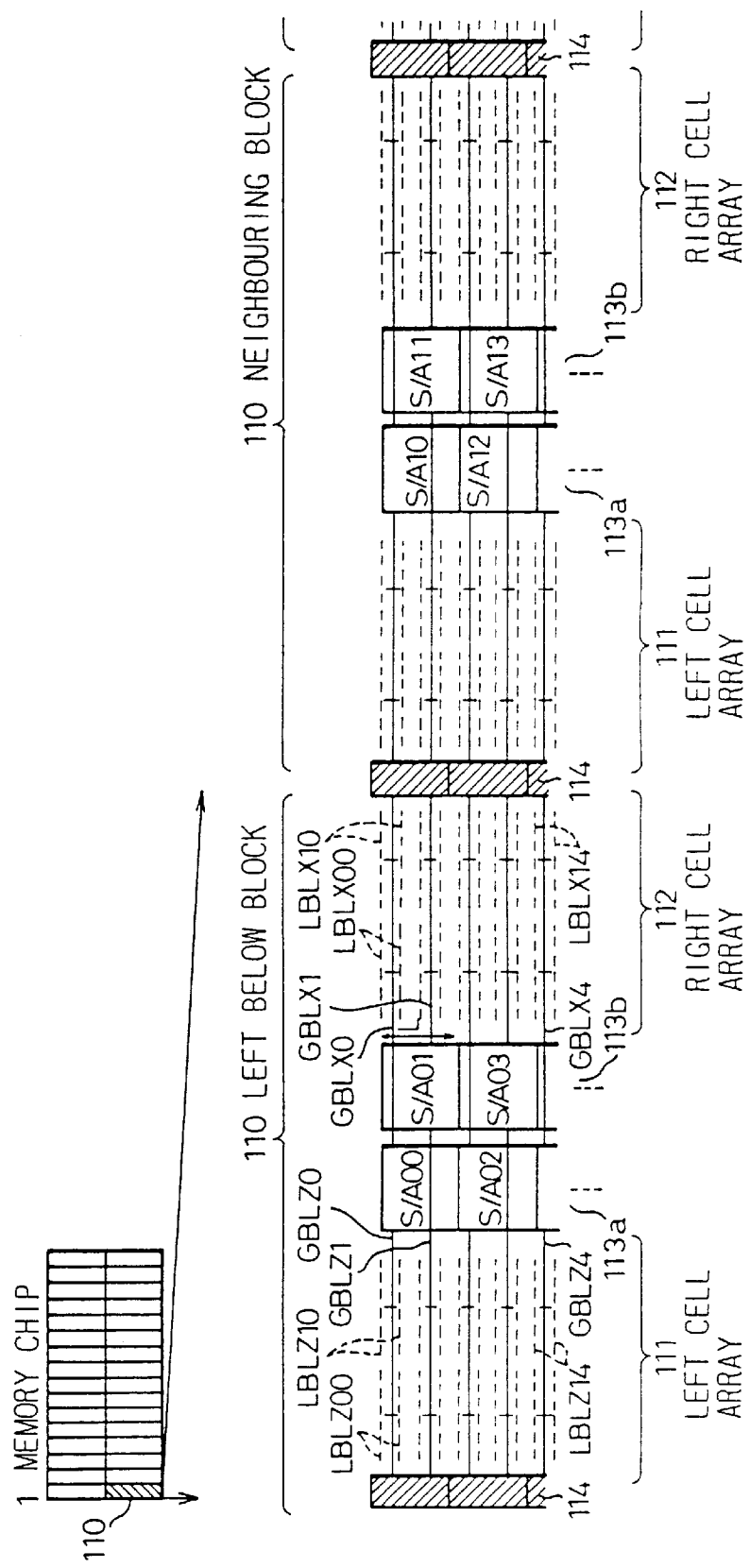
FIG. 23 is a layout showing a semiconductor memory according to the third aspect of the present invention.

FIG. 23 is a layout showing a semiconductor memory according to the third aspect of the present invention.

A memory chip 100 has memory blocks 110. Each memory block has word lines, bit lines, memory cells formed at the intersections of the word and bit lines, and sense amplifiers. FIG. 23 shows two memory blocks 110. For the sake of simplicity, the word lines and memory cells are not shown in the drawing.

As an example, the left lower block 110 will be explained. Global bit lines GBLZ and GBLX and local bit lines LBLZ and LBLX subordinated to the global bit lines form a hierarchical structure. The global bit lines GBLZ and GBLX extend in left and right cell arrays 111 and 112, respectively, and are connected to common sense amplifiers 113a and 113b, which are formed in two columns side by side. Accordingly, the size of each sense amplifier matches with the interval L of two global bit lines. A pair of global bit lines GBLZ0 and GBLX0 is connected to the sense amplifier S/A00 (113a). A pair of global bit lines GBLZ1 and GBLX1 is connected to the sense amplifier S/A01 (113b). A reset circuit 114 resets the bit lines.

The sense amplifiers 113a and 113b are arranged in a relaxed manner. The interval L of two global bit lines matches with the size of one sense amplifier. The sense amplifiers are arranged in two columns side by side, so that the length of each sense amplifier matches with the interval of four local bit lines. The length of the sense amplifier is twice as large as that of FIG. 20. Accordingly, the third aspect of the present invention is suitable for providing a semiconductor memory of large capacity with improved layout efficiency of memory cells.

Figure 24:
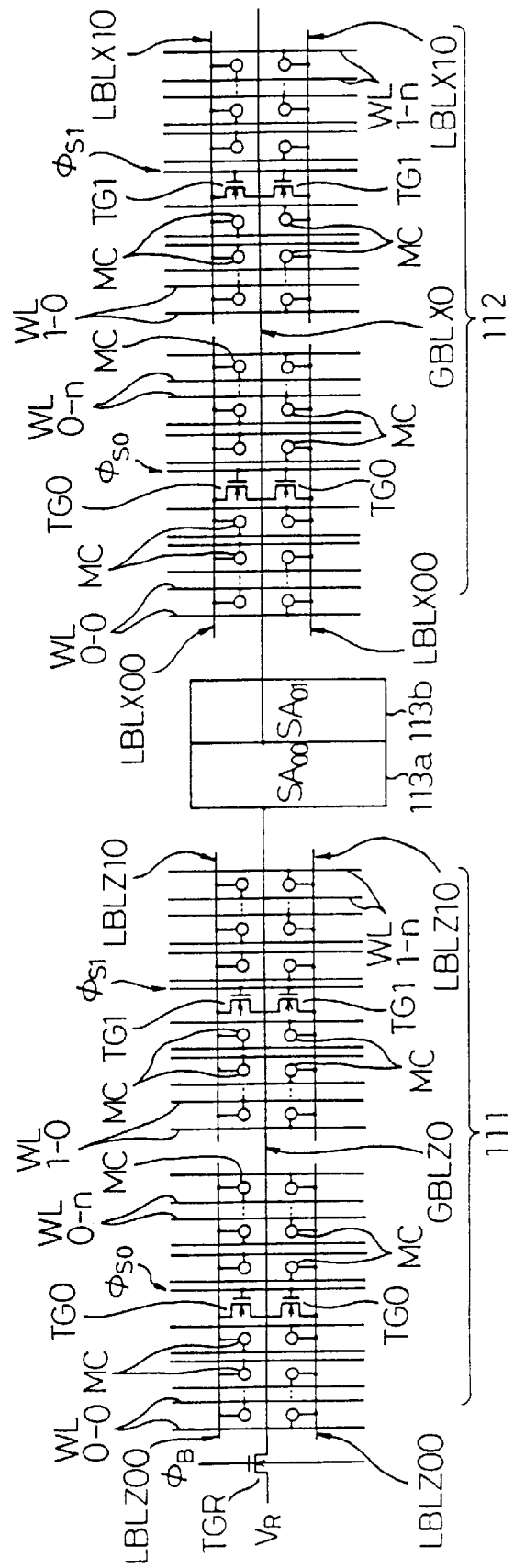
FIG. 24 is an enlarged circuit diagram showing part of the memory of FIG. 23.
Figure 25:
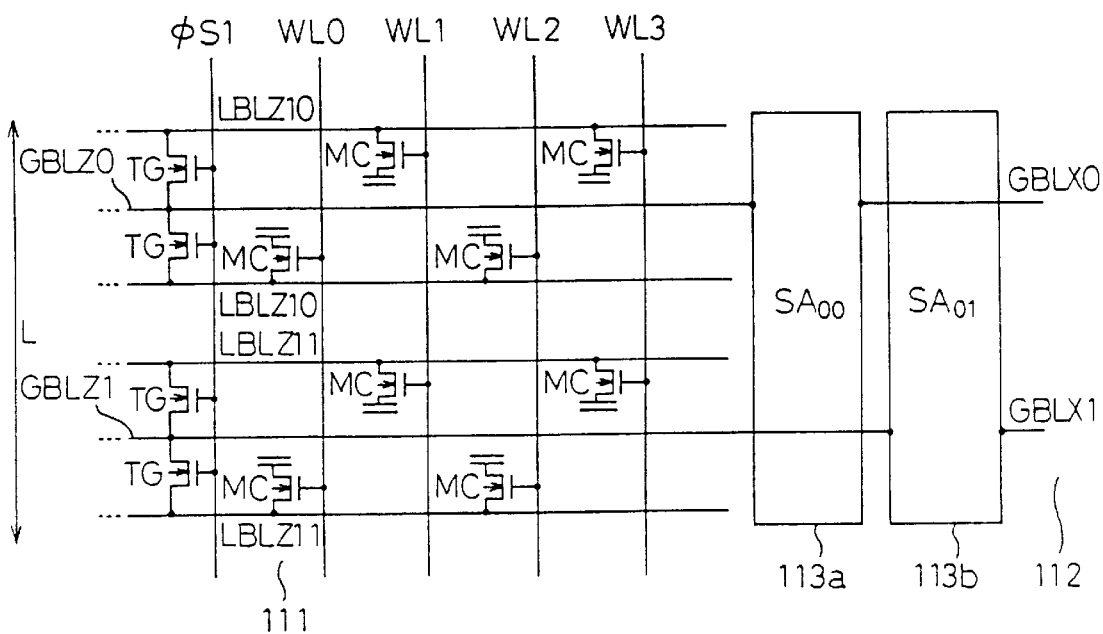
FIG. 25 is an enlarged circuit diagram showing the details of part of the memory of FIG. 23.

FIG. 24 is an enlarged circuit diagram showing a column of bit lines of the memory of FIG. 23, and FIG. 25 is an enlarged circuit diagram showing the details of part of the memory of FIG. 23. Corresponding parts are represented by like reference marks.

In FIG. 24, each of the global bit lines GBLZ0 and GBLX0 is connected to two local bit lines. Corresponding upper and lower local bit lines are logically the same, and each local bit line is branched into two. In a cell array 111, for example, there are logically divided local bit lines LBLZ00 and LBLZ10 for the global bit line GBLZ0. The local bit lines LBLZ00 and LBLZ10 are arranged in two rows and are connected simultaneously to the global bit line GBLZ0 through local bit line select transistors TG0 and TG1. Clock signals $\phi s0$ and $\phi s1$ are used to turn on/off the select transistors TG0 and TG1. When reading or writing data, a local bit line to which a selected memory cell is connected is connected to the global bit line through a transistor TG to be turned on. This arrangement reduces the load capacitance and resistance of any bit line connected to a sense amplifier.

In FIG. 25, bit lines of two columns are shown. The global bit lines GBLZ0 and GBLZ1 in the left cell array 111 are connected to sense amplifiers SA00 and SA01, respectively. The global bit lines GBLX0 and GBLX1 in the right cell array 112 are connected to the sense amplifiers SA00 and SA01, respectively. FIG. 25 shows four word lines WL0 to WL3 and memory cells MC connected to the word lines. One word line selects only one memory cell along one bit line. Accordingly, the memory cells connected to the word line WL0, for example, are connected to lower ones of the local bit lines LBLZ10 and LBLZ11. If the word line WL0 is selected and the local bit line selection transistor TG becomes conductive, only one memory cell MC is connected to the sense amplifier SA00 through the global bit line GBLZ0.

As shown in FIG. 25, the interval L of two global bit lines, i.e., four local bit lines matches with the length of the sense amplifier to provide a sufficient space for the sense amplifier. The global bit line GBLX0 in the right cell array 112 passes over the sense amplifier SA01 and is connected to the sense amplifier SA00. This structure is easy to form because of the hierarchical bit lines.

Figure 26:
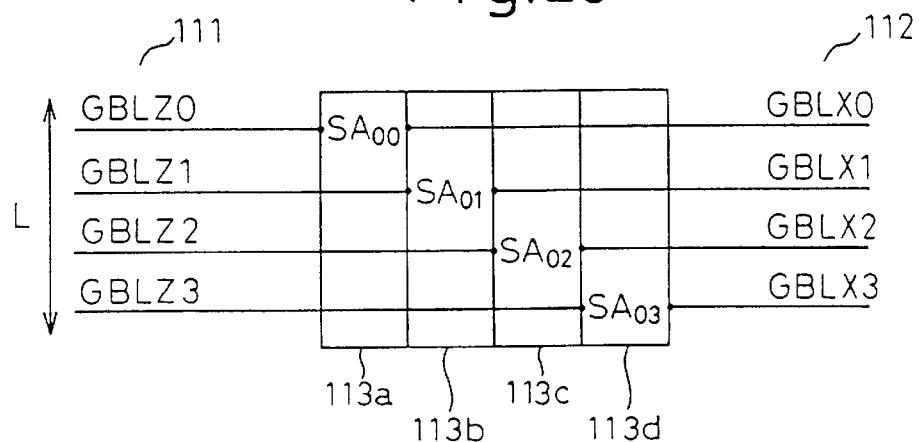
FIG. 26 shows a modification of the part of FIG. 24.

FIG. 26 shows a modification of FIG. 24. In this modification, similar to that shown in FIG. 24 (third aspect of the present invention), each of the global bit lines (GBLZ0, GBLX0 to GBLZ3, GBLX3) is connected to two local bit lines.

As shown in FIG. 26, in this modification, four sense amplifiers SA00 to SA03 are formed in an area matching with the interval of adjacent four of the global bit lines (GBLZ0, GBLX0 to GBLZ3, GBLX3), and each sense amplifier receives signals from a pair of the global bit lines arranged on both sides thereof. Namely, the sense amplifier SA00 receives signals from a pair of the global bit lines GBLZ0 and GBLX0, the sense amplifier SA01 receives signals from a pair of the global bit lines GBLZ1 and GBLX1, the sense amplifier SA02 receives signals from a pair of the global bit lines GBLZ2 and GBLX2, and the sense amplifier SA03 receives signals from a pair of the global bit lines GBLZ3 and GBLX3. Note that the areas where the sense amplifiers are formed are arranged in four rows, and overlap, side by side.

As shown in FIG. 26, in this modification, the interval L of four global bit lines, i.e., eight local bit lines, matches with the length of the sense amplifier to provide a sufficient space for the sense amplifier. For example, the global bit line GBLX0 in the right cell array 112 passes over the sense amplifiers SA01 to SA03 and is connected to the sense amplifier SA00, and the global bit line GBLX1 in the right cell array 112 passes over the sense amplifiers SA02 and SA03 and is connected to the sense amplifier SA01. This structure is easy to form because of the hierarchical bit lines.

In the above descriptions, the number of the sense amplifiers formed in the area matching with the interval (L) is determined to be two or four, but this configuration (number of the sense amplifiers) can be variously determined.

Figure 27:
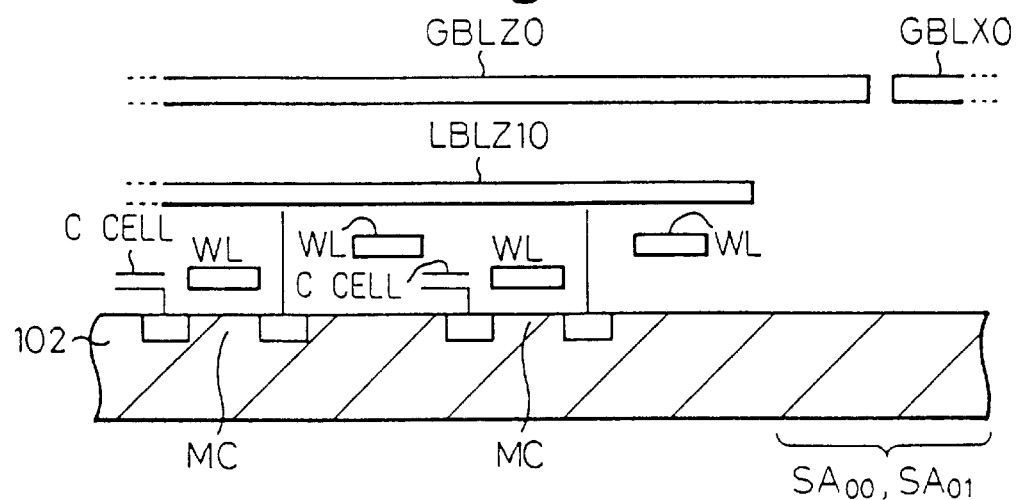
FIG. 27 is a sectional view schematically showing hierarchical bit lines.
Figure 28:
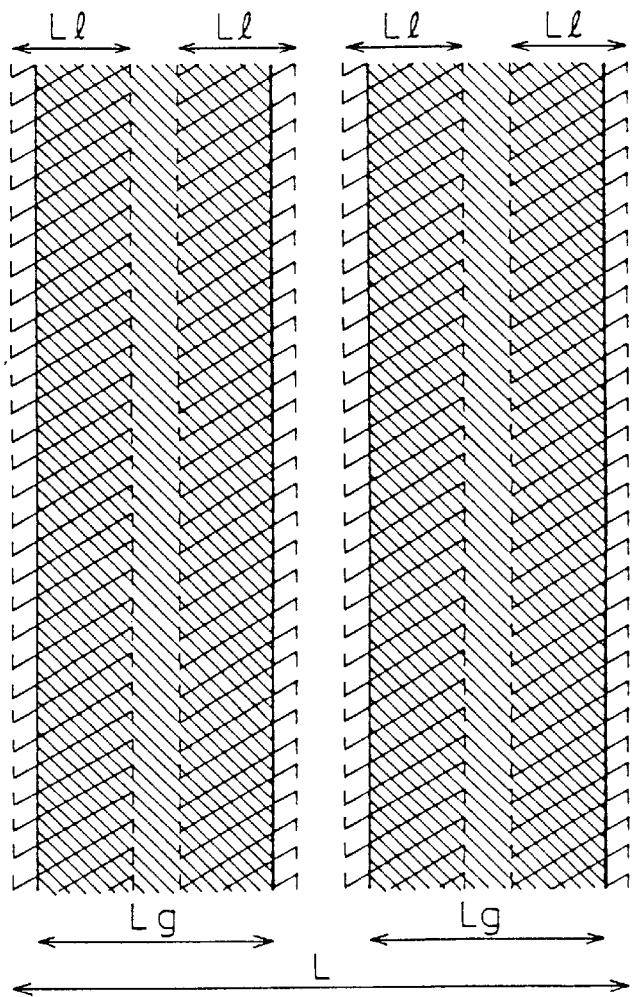
FIG. 28 is a plan view schematically showing the hierarchical bit lines.

FIGS. 27 to 29 show hierarchical bit lines. FIG. 27 shows a semiconductor substrate 102, memory cells MC, sense amplifiers SA, word lines WL, a local bit line LBLZ10, and global bit lines GBLZ0 and GBLX0. Each memory cell MC consists of a transistor whose gate serves as a word line and a capacitor cell. The memory cell MC is connected to the local bit line LBLZ10 formed on a lower layer, and the local bit line LBLZ10 is connected to the global bit line GBLZ0 formed on an upper layer through a transistor (not shown). The sense amplifiers SA00 and SA01 are positioned below the global bit lines, to cause no structural problem. The hierarchical bit line structure, therefore, is appropriate for laying out the relaxed sense amplifiers.

FIG. 28 is a plan view showing the relationship between the global bit lines and the local bit lines, and FIG. 29 is a sectional view showing the same. The hierarchical bit lines are formed on the semiconductor substrate 102. The global bit lines GBL are formed on an upper layer from low-resistance metal such as tungsten or aluminum. The local bit lines LBL are formed on a lower wiring layer made of, for example, polysilicon that has relatively high resistance but is easy to process finely. The present invention forms two local bit lines under a global bit line. The width L of the sense amplifier is about two times as wide as the width Lg of the global bit line, which is about twice as wide as the width L1 of the local bit line. According to the present invention, the local bit lines are arranged according to the density of memory cells that is determined according to a required memory capacity. One global bit line is arranged for two closely arranged local bit lines, and one sense amplifier is arranged for two global bit lines.

Figure 30:
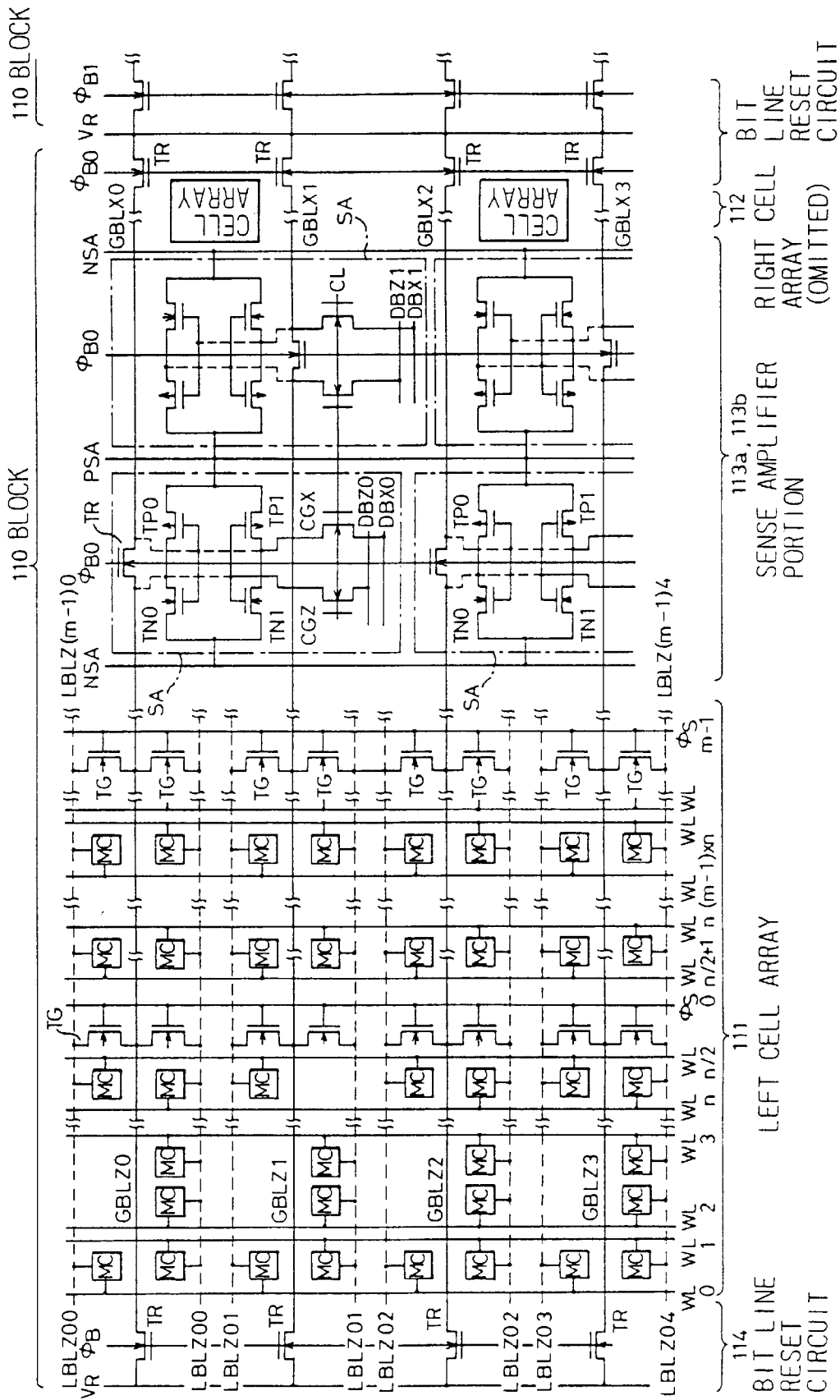
FIG. 30 is a circuit diagram showing a semiconductor memory according to an embodiment of the third aspect of the present invention.

FIG. 30 is a circuit diagram showing a semiconductor memory according to an embodiment of the third aspect of the present invention. The drawing shows the left part of a memory block 110, including a cell array 111, sense amplifier portions 113a and 113b, and a bit line reset circuit 14. A cell array 112 on the right side of the sense amplifier portions is not shown. Parts corresponding to those of FIGS. 23 to 25 are represented with like reference numerals. The circuit of FIG. 30 differs from those of FIGS. 23 to 25 in that it has branched m local bit lines LBL for each global bit line GBL. In FIG. 30, a continuous line indicates the global bit line GBL, and a dotted line indicates the local bit line LBL. Each local bit line LBL is connected to a related one of the global bit lines GBL through a transistor TG, which becomes conductive in response to one of bit line selection clock signals φs0 to φsm-1.

Sense amplifiers SA are arranged in two rows at the center of the memory block 110. Each of the sense amplifiers consists of, for example, a differential amplifier having a pair of CMOS circuits whose inputs and outputs are crossed and connected to each other. The CMOS circuits are connected to the global bit lines oppositely arranged. The sense amplifier SA is connected to the data bus lines DBZ0 and DBX0 through column gate transistors CGZ and CGX. The data bus lines DBZ0 and DBX0 are connected to an output circuit (not shown) and a write amplifier (not shown).

Figure 31:
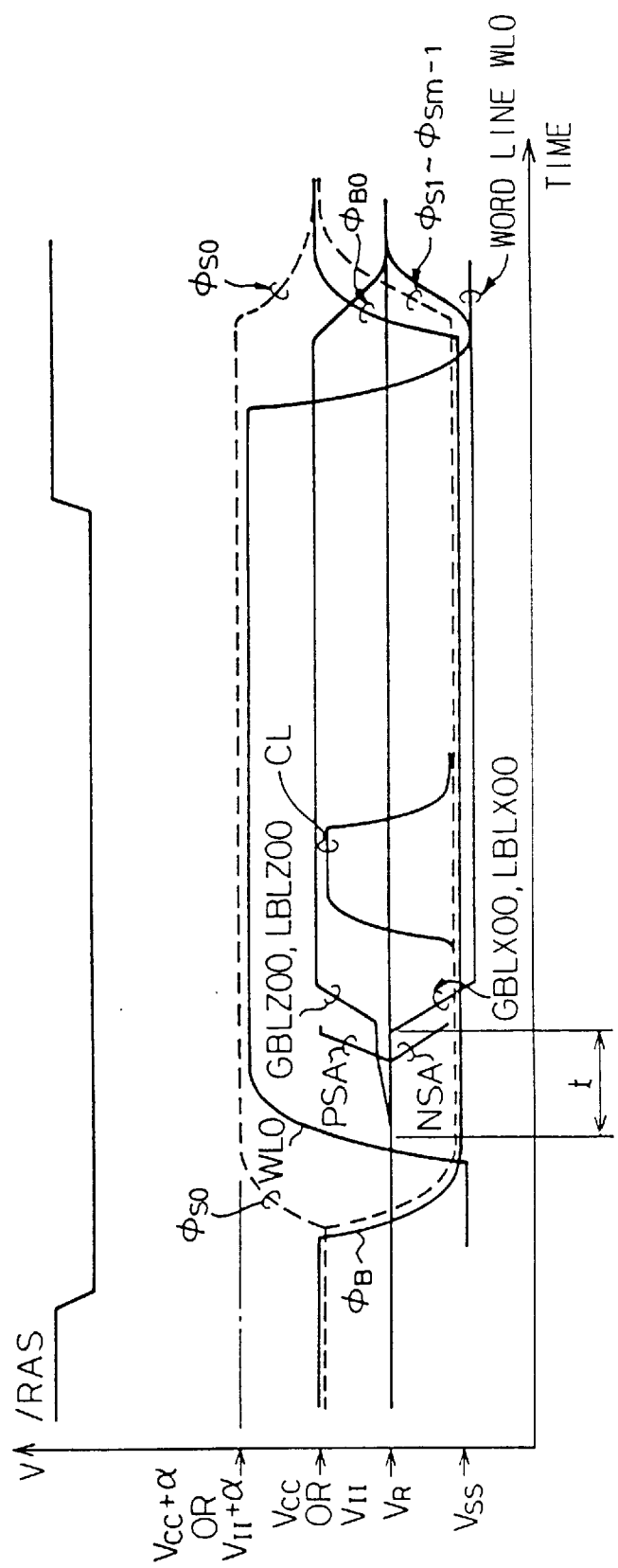
FIG. 31 is a signal waveform diagram showing a read operation of the memory of FIG. 30.

FIG. 31 is a signal waveform diagram showing a read operation of the memory of FIG. 30, to read data "1" (high level) from a memory cell connected to the local bit line LBLZ00 subordinated to the global bit line GBLZ0 in the left cell array 110.

When a signal /RAS is at high level during a standby period, a clock signal φB serving as a bit line reset signal rises to make the transfer gates conductive. As a result, the global bit lines GBL and local bit lines LBL are precharged to a reference voltage VR that is at an intermediate level between a source voltage Vcc or an internally generated source voltage Vii and a ground voltage Vss. After the signal /RAS falls, the clock signal φB falls to enter an active period.

In the left cell array 111, one of the local bit line select signals φs0 to φm-1 is increased above Vcc or Vii, and the others are dropped to the ground voltage Vss. As a result, the selected local bit line LBLZ00 is connected to the global bit line GBLZ0 through the transistor TG. The selected local bit line LBLZ00 is connected to the global bit line GBLZ0 due to the clock signal φs of sufficiently high voltage. On the other hand, the unselected local bit lines are disconnected from the global bit line. At this time, the local bit line select signals in the left cell array 111 may be raised or not. In response to the simultaneous up and down operations of the local bit line select signals in the left cell array 111, those in the right cell array may be operated in the same manner, to balance the left and right bit lines.

Thereafter, a selected word line WL is increased from the ground voltage to a level higher than the source voltage. Since data "1" is going to be read from the memory cell in the left cell array, the data "1" slightly increases the voltage of the left global bit line GBLZ0 according to the ratio of the capacitance of the memory cell to the capacitance of the bit line. On the other hand, no word lines rise in the right memory cell array 112, and therefore, the voltage of the bit lines is kept at the reference voltage VR in the right memory cell array 112.

After a voltage difference to be amplified by the sense amplifier is produced between the global bit line GBLZ0 and a complementary signal line GBLX0, the sense amplifier SA is activated. More precisely, an n-channel sense amplifier drive signal NSA is dropped from the reference voltage VR to the ground voltage Vss, and a p-channel sense amplifier drive signal PSA is increased from VR to Vcc or Vii. In this way, the voltage of the global and local bit lines GBLZ0 and LBLZ00 is increased to Vcc or Vii, and that of the global and local bit lines GBLX0 and LBLX00 is decreased to Vss.

When the sense amplifier carries out the amplification action, the total resistance and capacitance of the bit line connected to the sense amplifier are smaller than those of the prior art of FIG. 20 because the present invention employs the hierarchical bit lines. Accordingly, the present invention can shorten the time t shown in FIG. 31. The time t is a period from a rise of the word line WL up to a time when a differential voltage to be amplified by the sense amplifier occurs on the bit line pair. Since the total capacitance of the bit line pair driven by the sense amplifier is small, the amplification time of the sense amplifier is short. This results in reducing a through current passing the sense amplifier, to thereby reduce power consumption and the charge/discharge current of each bit line.

After the sense amplifier amplifies the voltage difference, a column select signal CL rises to make the column gate transistors CGZ and CGX conductive, to transfer the data "1" of the memory cell to the data bus lines DBZ0 and DBX0. The data is transmitted from an output circuit (not shown) to the outside.

Figure 32:
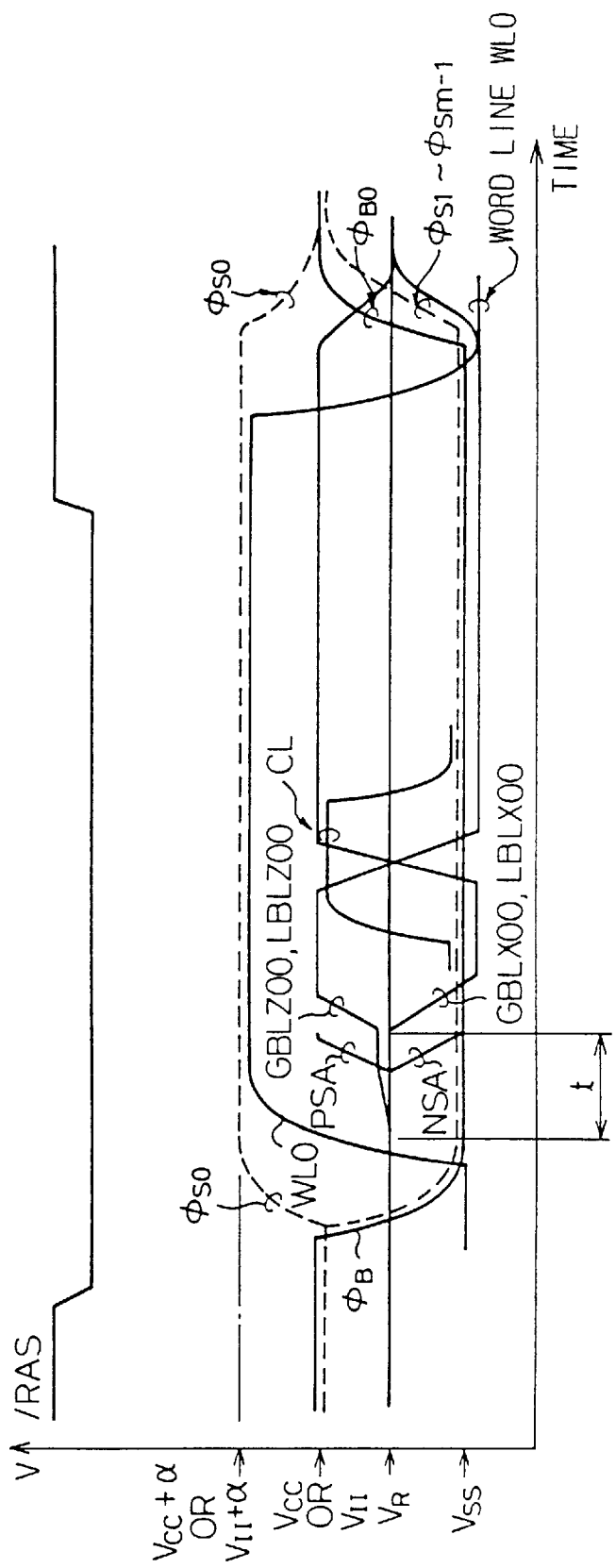
FIG. 32 is a signal waveform diagram showing a write operation of the memory of FIG. 30.

FIG. 32 is a signal waveform diagram showing an operation of writing data "0" to the same memory cell. Similar to the read operation, the write operation precharges the bit lines, drives the local bit line select signal, raises the word line, and activates the sense amplifier. Word lines for memory cells that are not written also rise to rewrite data. The sense amplifier is activated to amplify a differential voltage in the bit line pair, and the column select signal CL is raised to make the column gate transistors CGZ and CGX conductive, so that a signal for writing "0" is supplied from the write circuit (not shown) to the bit lines through the data bus. As a result, the data in the memory cell is changed to "0." The write operation is carried out at light load and in a short time because the total capacitance of the bit lines is small.

Figure 33:
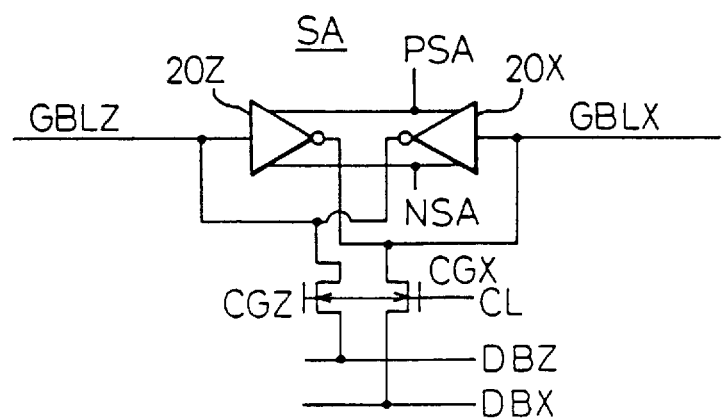
FIG. 33 is a simplified circuit diagram showing a sense amplifier of the memory of FIG. 30.

According to the third aspect of the present invention, the sense amplifier has a usual structure having a pair of CMOS inverters whose inputs and outputs are crossed and connected to each other. FIG. 33 is a circuit diagram simply showing the sense amplifier. The sense amplifier SA has a pair of CMOS inverters 20Z and 20X whose inputs are connected to corresponding global bit lines. The output of one of the inverters is connected to the input of the other inverter. Complementary voltage signals of the bit line pair are used to stably amplify the voltage of each bit line. The sense amplifier of this arrangement, however, must drive a bit line having large capacitance, to take a long amplification time. When writing opposite data, the write amplifier (not shown) must supply, through the data bus lines DBZ and DBX, an inverted signal to the bit line pair while competing with the sense amplifier SA.

In addition, the open bit line method of the present invention is more vulnerable to noise than the folded bit line method. To solve this problem, another embodiment of the third aspect of the present invention surely amplifies the voltage difference of a bit line pair even if noise occurs and carries out a write operation at high speed.

Figure 34:
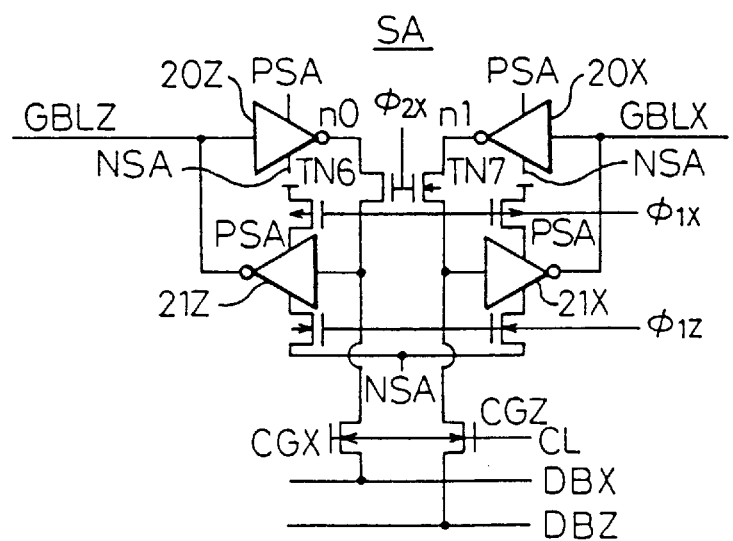
FIG. 34 is a simplified circuit diagram showing a sense amplifier of a semiconductor memory according to another embodiment of the third aspect of the present invention.

FIG. 34 is a circuit diagram showing a simplified sense amplifier of a semiconductor memory according to the embodiment of the third aspect of the present invention. The outputs of CMOS inverters 20Z and 20X are connected to the inputs of additional tri-state inverters 21Z and 21X, respectively, and the outputs of the inverters 21Z and 21X are returned to bit lines GBLZ and GBLX, respectively. Between the CMOS inverters and the tri-state inverters, there are arranged transfer gate transistors TN6 and TN7, to properly separate the two types of inverters from each other. The CMOS inverters 20Z and 20X serve as a read amplifier, and the tri-state inverters 21Z and 21X serve as a rewrite amplifier.

The operation of this arrangement will briefly be explained. When reading data, a voltage difference between the global bit lines GBLZ and GBLX is amplified by the differential amplifier, i.e., the CMOS inverters. The output terminals n0 and n1 of the CMOS inverters are not connected to the load capacitance of the bit lines, so that their output load is very light to properly amplify the voltage difference at high speed even if there is a little noise. After the voltage difference between the nodes n0 and n1 is amplified to a given level, the rewrite amplifier, i.e., the tri-state inverters 21Z and 21X is activated to drive the global bit lines GBLZ and GBLX. Since the tri-state inverters 21Z and 21X receive input signals having a sufficient voltage difference, they operate stably at high speed.

When writing data, a write amplifier (not shown) provides a write signal. At this time, transfer gates TN 6 and TN7 are turned off to isolate the read amplifier (20Z and 20X) and drive only the rewrite amplifier (21Z and 21X). This prevents a conflict between the read sense amplifier and the rewrite amplifier, to realize a high-speed write operation.

Figure 35:
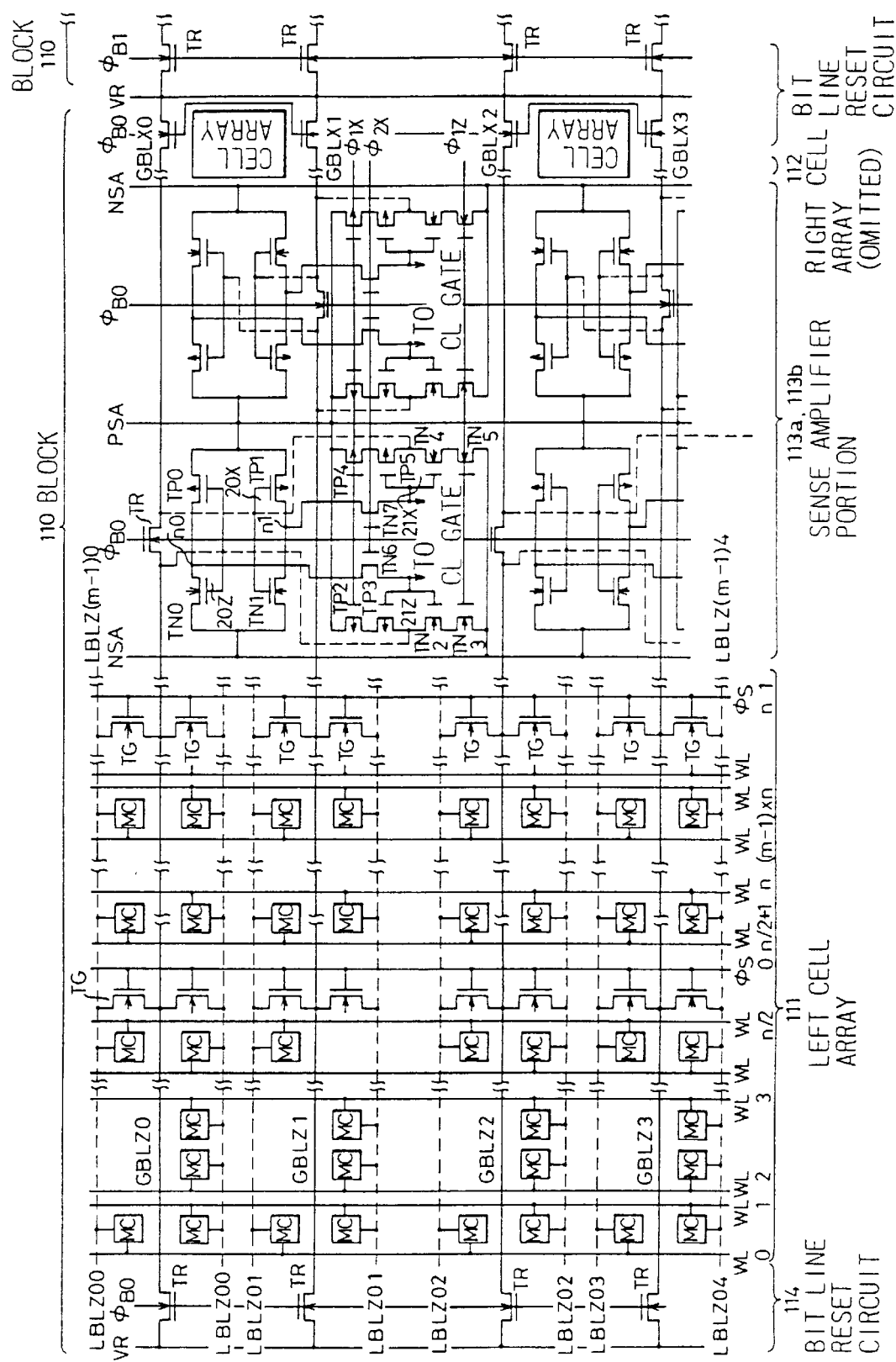
FIG. 35 is a circuit diagram showing a semiconductor memory according to still another embodiment of the third aspect of the present invention.

FIG. 35 is a circuit diagram showing a semiconductor memory according to still another embodiment of the third aspect of the present invention. The same parts as those of FIG. 30 are represented by like reference marks and they are not explained again.

P-channel transistors TP0 and TP1 and n-channel transistors TN0 and TN1 form a pair of CMOS inverters 20Z and 20X as those of FIG. 34. Transistors TP2, TP3, TN2, and TN3 and transistors TP4, TP5, TN4, and TN5 form a pair of tri-state inverters 21Z and 21X as those of FIG. 34. The tri-state inverters are controlled not only by sense amplifier activation clock signals NSA and PSA but also by control clock signals φ1X and φ1Z. When the signals φ1X and φ1Z are high and low, respectively, the output terminals of the tri-state inverters become high impedance. When the signals φ1X and φ1Z are low and high, respectively, the output terminals of the tri-state inverters provide an output voltage of high or low level depending on the level of the input terminals thereof.

Figure 36:
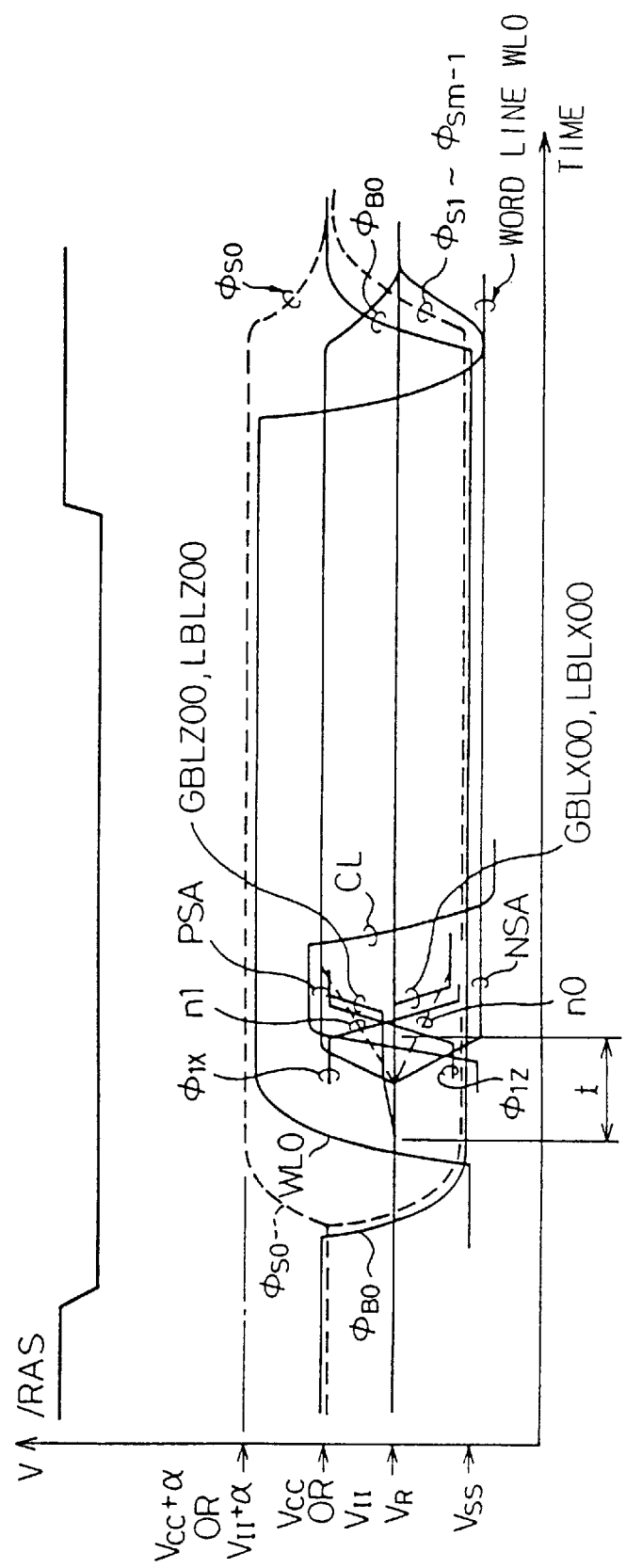
FIG. 36 is a signal waveform diagram showing a read operation of the memory of FIG. 35.

FIG. 36 is a signal waveform diagram showing a read operation of the memory of FIG. 35, to read data "1" out of a memory cell connected to a local bit line LBLZ00. While a signal /RAS is at high level, each global bit line is precharged to a reference voltage VR, and then a local bit line select signal φs0 rises. A word line WL0 rises higher than a source voltage (Vcc or Vii). When a voltage difference of a given level is produced between global bit lines GBLZ0 and GBLX0, the sense amplifier activation signals NSA and PSA fall and rise, respectively, to produce an amplified voltage difference between nodes n0 and n1. This is the same as the embodiment of FIGS. 30 and 31.

Thereafter, the control clock signals φ1X and φ1Z fall and rise, respectively. As a result, the rewrite amplifiers 21Z and 21X are activated to drive the global bit lines and the local bit lines connected thereto.

First, this embodiment connects no global bit lines to the node terminals n0 and n1 while an amplified voltage difference is being produced between the node terminals n0 and n1. This results in speeding up the amplification operation. Secondly, the activation signals NSA and PSA change from the reference voltage VR to low and high levels, respectively, so that the read amplifier made of the inverters 20Z and 20X may carry out an amplification operation. Thereafter, the control clock signals φ1X and φ1Z fall and rise, respectively, to drive the rewrite amplifier made of the tri-state inverters 21Z and 21X. This further stabilizes and speeds up the read operation. If the output of the rewrite amplifier is at high-impedance due to the signals φ1X and φ1Z, no disturbance is caused by the data bus lines to the global bit lines through the rewrite amplifier even if a given voltage difference is caused between the output terminals n0 and n1 of the read amplifier to open the column gate. Accordingly, it is possible to select the column gate earlier. In fact, the column gate select signal CL rises very early in FIG. 36.

Thirdly, the rewrite amplifier is activated after a sufficient voltage difference is produced between the node terminals n0 and n1. Accordingly, the rewrite operation is stable. Even if noise between bit lines or noise provided through a cell plate is applied to the global and local bit lines during the rewrite operation, the possibility of causing a rewrite error is very small.

Figure 37:
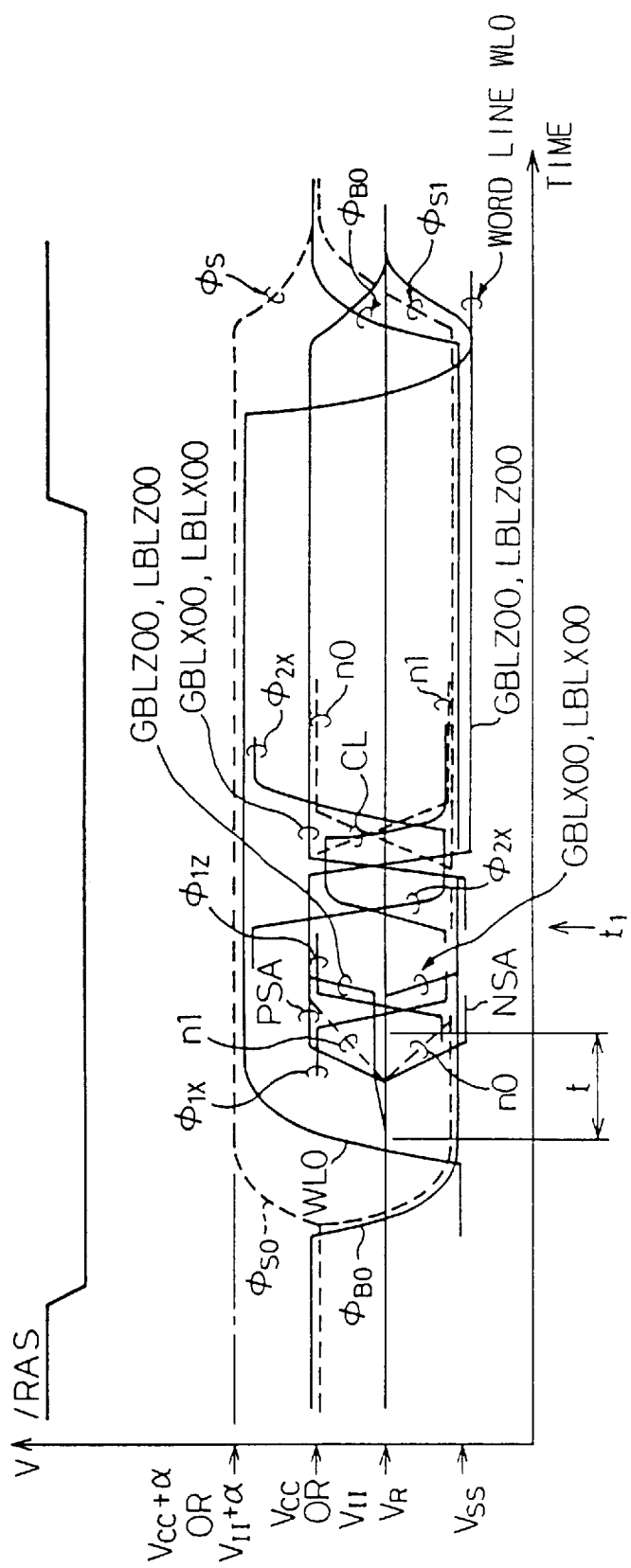
FIG. 37 is a signal waveform diagram showing a write operation of the memory of FIG. 35.

FIG. 37 is a signal waveform diagram showing a write operation of the memory of FIG. 35, to write "0" to the same memory cell. A precharge action to the reference voltage VR is carried out during the standby period similar to the usual read operation as explained with reference to the first embodiment of the third aspect of the present invention. However, the write operation does not open the column gate until the word line rises and the sense amplifier generates the source voltage and ground voltage on the global bit line and local bit line, respectively. At time t1 of FIG. 37, the control signal φ2X falls to make the transfer gates TN6 and TN7 of the sense amplifier nonconductive, to isolate the read amplifier from the rewrite amplifier. The column gate select signal CL is raised to open the column gate (not shown), and a write signal is supplied from the write amplifier (not shown) to the bit line through the rewrite amplifier (21Z and 21X). At this time, the rewrite amplifier is isolated from the read amplifier (20Z and 20X), and therefore, there will be no conflict of signals between the rewrite and read amplifiers. Accordingly, the write operation is carried out at high speed, and therefore, the power consumption is reduced. The control signal φ2X is a control clock signal produced according to a write control signal /WE and the column select signal CL.

Figure 38:
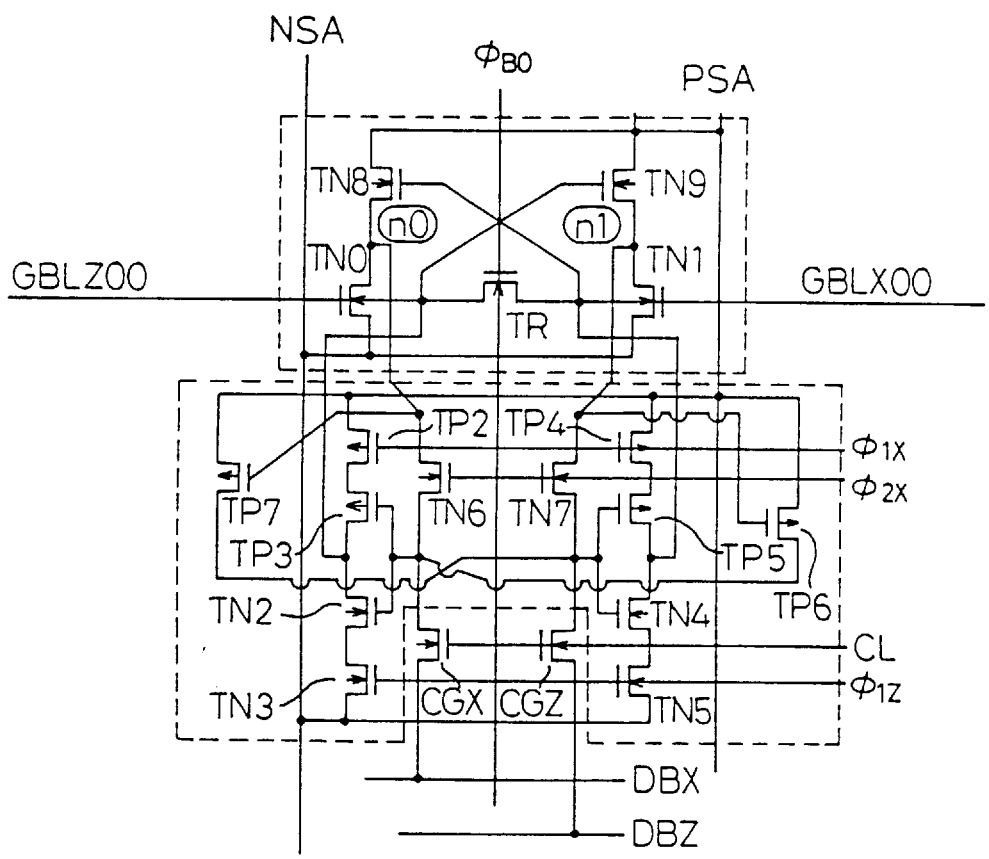
FIG. 38 is a circuit diagram showing a sense amplifier of a modification of the memory of FIG. 35.

FIG. 38 is a circuit diagram showing a sense amplifier of a modification of the memory of FIG. 35. Read amplifiers, which are made of 20Z and 20X in FIGS. 34 and 35, are made of only n-channel MOS transistors, and the voltages of both global bit lines are used to carry out read amplification. Namely, the p-channel MOS transistors TP0 and TP1 of the sense amplifier of FIG. 35 are replaced with the n-channel MOS transistors TN8 and TN9 whose gates are connected to opposite global bit lines. This arrangement uses differential signals of the two bit lines to drive the gates of the two inverter circuits one made of TN0 and TN8 and the other made of TN1 and TN9 of the read amplifier, to more stably detect and amplify the voltage difference. Transistors TP6 and TP7 are used to remove a DC current that may flow to transistors TP3 and TP5 during a rewrite operation. The gates of the transistors TP6 and TP7 receive signals from nodes n0 and n1, respectively, and the sources thereof receive an activation signal PSA. The drain of the transistor TP6 is connected to the gates of transistors TP3 and TN2, and the drain of the transistor TP7 is connected to the gates of transistors TP5 and TN4. The other operations of this embodiment are the same as those of the embodiment of FIG. 35, and therefore, they are not explained again.

Figure 39:
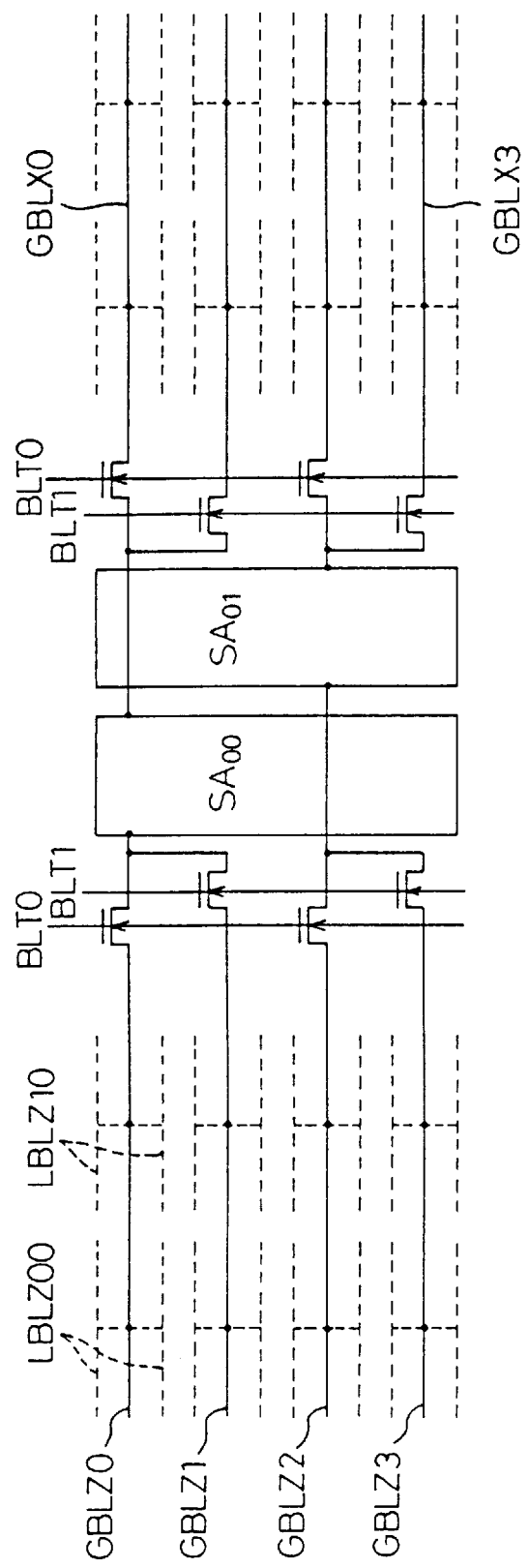
FIG. 39 is a circuit diagram showing a semiconductor memory according to still another embodiment of the third aspect of the present invention.

The embodiments mentioned above adjust the area of a sense amplifier to the interval L of two global bit lines. To increase the capacity of a semiconductor memory, it is necessary to make the structure thereof finer and employ more complicated sense amplifiers. In this case, the interval L of two global bit lines will be insufficient. Then, it is preferable to arrange each sense amplifier within the interval of four global bit lines as shown in FIG. 39 with one sense amplifier being provided for two pairs of bit lines. A bit line selection transistor BLT is arranged on each side of the sense amplifier, and selection clock signals BLT0 and BLT1 are used to select any one of the two bit line pairs. If the bit line select clock signal BLT0 selects global bit lines GBL0 and GBL2, a global bit line GBL1 arranged between them is not selected and is kept at a precharge level VR. Unselected global bit lines reduce mutual interference noise between the selected global bit lines GBLZ0 and GBLZ2 and between GBLX0 and GBLX2.

Each of the embodiments of FIGS. 30 and 33 matches the interval of two global bit lines with the area of a sense amplifier. The sense amplifier may be matched with the interval of two or more global bit lines. If it is matched with the interval of, for example, four global bit lines, the sense amplifiers may be arranged in four rows.

As explained above in detail, a semiconductor memory of the third aspect of the present invention employs hierarchical bit lines with two local bit lines being arranged on a lower layer with respect to each global bit line formed on an upper layer. The intervals of the global bit lines are adjusted according to the capacity of the memory, i.e., the density of memory cells and bit lines. The third aspect employs the open bit line method for amplifying a voltage difference between a pair of global bit lines, to stably carry out a read operation. The third aspect matches the space of a sense amplifier with the interval L of a given number of global bit lines, to easily arrange the sense amplifier even if it has a complicated circuit. Since the global bit lines are arranged on an upper layer, the global bit lines three-dimensionally cross two rows of the sense amplifiers.

The semiconductor memory of the third embodiment employs a read amplifier and a rewrite amplifier with the output terminal of the read amplifier being isolated from bit lines, to stabilize and speed up a read operation as well as reducing power consumption.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory having hierarchical bit lines including a plurality of local bit lines and a plurality of global bit lines, comprising:
   a plurality of word lines;
   a plurality of memory cells each arranged at a connection portion between each of said local bit lines and each of said word lines; and
   sense amplifiers each being formed in an area corresponding with an interval of a given number greater than one of said global bit lines and each receiving signals from a pair of said global bit lines arranged on both sides thereof.

2. A semiconductor memory as claimed in claim 1, wherein the areas where said sense amplifiers are formed are overlapped side by side and each of said sense amplifiers receives signals from a corresponding pair of said global bit lines arranged on both sides thereof.

3. A semiconductor memory as claimed in claim 1, wherein each of said sense amplifiers comprises:

a read amplifier for receiving signals from said global bit lines and amplifying the difference between the signals; and a write amplifier for receiving the output of said read amplifier and providing output signals to drive said global bit lines.

4. A semiconductor memory as claimed in claim 3, wherein said read amplifier is first activated when reading data out of one of said memory cells, and then said write amplifier is activated.

5. A semiconductor memory as claimed in claim 1, wherein each of said sense amplifiers comprises:

a read amplifier for receiving a signal from said global bit line and amplifying the difference between the signals;

a write amplifier for receiving the output of said read amplifier and providing output signals to drive said global bit lines; and a transfer gate arranged between the output of said read amplifier and the input of said write amplifier, for isolating said read and write amplifiers from each other, said write amplifier having an input terminal connected to a data bus line through a column gate.

6. A semiconductor memory as claimed in claim 5, wherein said read amplifier is first activated when reading data out of one of said memory cells, and then said write amplifier is activated.

7. A semiconductor memory as claimed in claim 5, wherein said transfer gate is closed when writing data to one of said memory cells, to isolate said read amplifier from said write amplifier.

8. A semiconductor memory as claimed in claim 1, wherein, on a semiconductor substrate, said global bit lines are formed on a wiring layer that is above a layer where said local bit lines are formed.

9. A semiconductor memory as claimed in claim 1, wherein said global bit lines extend substantially orthogonally to said word lines, said local bit lines extend in parallel with said global bit lines, and a plurality of said local bit lines are subordinated to each of said global bit lines.

10. A semiconductor memory having hierarchical bit lines including a plurality of local bit lines and a plurality of global bit lines, comprising:

a plurality of word lines;

a plurality of memory cells each arranged at a connection portion between each of said local bit lines and each of said word lines; and sense amplifiers each being formed in an area corresponding with an interval of an adjacent two of said global bit lines and each receiving signals from a pair of said global bit lines arranged on both sides thereof, the areas where said sense amplifiers are formed being arranged in two rows and overlapped side-by-side.

11. A semiconductor memory as claimed in claim 10, wherein said global bit lines extend substantially orthogonally to said word lines, said local bit lines extend in parallel with said global bit lines, and every two of said local bit lines are subordinated to each of said global bit lines.

12. A semiconductor memory as claimed in claim 10, wherein, on a semiconductor substrate, said global bit lines are formed on a wiring layer that is above a layer where said local bit lines are formed.

13. A semiconductor memory having hierarchical bit lines including a plurality of local bit lines and a plurality of global bit lines, comprising:

a plurality of word lines;

a plurality of memory cells each arranged at a connection portion between each of said local bit lines and each of said word lines; and sense amplifiers each being formed in an area corresponding with an interval of adjacent four of said global bit lines and each receiving signals from a pair of said global bit lines arranged on both sides thereof, the areas where said sense amplifiers are formed are arranged in four rows and overlapped side-by-side.

14. A semiconductor memory as claimed in claim 13, wherein said global bit lines extend substantially orthogonally to said word lines, said local bit lines extend in parallel with said global bit lines, and every two of said local bit lines are subordinated to each of said global bit lines.

15. A semiconductor memory as claimed in claim 13, wherein, on a semiconductor substrate, said global bit lines are formed on a wiring layer that is above a layer where said local bit lines are formed.

16. A semiconductor memory having hierarchical bit lines including a plurality of local bit lines and a plurality of global bit lines, comprising:

a plurality of word lines;

a plurality of memory cells each arranged at a connection portion between each of said local bit lines and each of said word lines; and sense amplifiers each being formed in an area corresponding with an interval of a given number of said global bit lines and each receiving, through bit line selection gates, signals from a pair of said global bit lines arranged on both sides thereof, the areas where said sense amplifiers are formed are arranged in a plurality of rows and overlapped side-by-side, the number of the rows of said sense amplifier areas being smaller than the given number of said global bit lines.

17. A semiconductor memory as claimed in claim 16, wherein said global bit lines extend substantially orthogonally to said word lines, said local bit lines extend in parallel with said global bit lines, and every two of said local bit lines are subordinated to each of said global bit lines.

18. A semiconductor memory as claimed in claim 16, wherein, on a semiconductor substrate, said global bit lines are formed on a wiring layer that is above a layer where said local bit lines are formed.

* * * * *